US011804531B2

(12) United States Patent
Chen et al.

(10) Patent No.: US 11,804,531 B2
(45) Date of Patent: Oct. 31, 2023

(54) THIN FILM TRANSFER USING SUBSTRATE WITH ETCH STOP LAYER AND DIFFUSION BARRIER LAYER

(71) Applicant: Taiwan Semiconductor Manufacturing Co., Ltd., Hsinchu (TW)

(72) Inventors: Eugene I-Chun Chen, Taipei (TW); Ru-Liang Lee, Hsinchu (TW); Chia-Shiung Tsai, Hsinchu (TW); Chen-Hao Chiang, Jhongli (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 221 days.

(21) Appl. No.: 17/138,121

(22) Filed: Dec. 30, 2020

(65) Prior Publication Data

US 2022/0028994 A1 Jan. 27, 2022

Related U.S. Application Data

(60) Provisional application No. 63/055,383, filed on Jul. 23, 2020.

(51) Int. Cl.
*H01L 29/423* (2006.01)
*H01L 29/06* (2006.01)
(Continued)

(52) U.S. Cl.
CPC .. *H01L 29/42384* (2013.01); *H01L 21/76829* (2013.01); *H01L 29/0669* (2013.01); *H01L 29/66742* (2013.01); *H01L 29/786* (2013.01)

(58) Field of Classification Search
CPC ........... H01L 29/42384; H01L 29/0669; H01L 29/66742; H01L 29/786; H01L 21/76829
See application file for complete search history.

(56) References Cited

U.S. PATENT DOCUMENTS 6,830,964 B1 12/2004 Mears et al.
9,209,247 B2 12/2015 Colinge et al.
(Continued)

FOREIGN PATENT DOCUMENTS

| CN | 109643742 A | 4/2019 |
|---|---|---|
| CN | 110828456 A | 2/2020 |
| KR | 20190036521 A | 4/2019 |

OTHER PUBLICATIONS

Jayachandran, S., et al., "Quasi Two-Dimensional Si—O Superlattices: Atomically Controlled Growth and Electrical Properties," ECS Journal of Solid State Science and Technology, May 19, 2016, pp. 396-403, 9 pages.
(Continued)

*Primary Examiner* — Eugene Lee
(74) *Attorney, Agent, or Firm* — Slater Matsil, LLP

(57) ABSTRACT

A method of forming a semiconductor device includes: forming an etch stop layer over a substrate; forming a first diffusion barrier layer over the etch stop layer; forming a semiconductor device layer over the first diffusion barrier layer, the semiconductor device layer including a transistor; forming a first interconnect structure over the semiconductor device layer at a front side of the semiconductor device layer, the first interconnect structure electrically coupled to the transistor; attaching the first interconnect structure to a carrier; removing the substrate, the etch stop layer, and the first diffusion barrier layer after the attaching; and forming a second interconnect structure at a backside of the semiconductor device layer after the removing.

20 Claims, 75 Drawing Sheets

(51) Int. Cl.
  *H01L 29/66* (2006.01)
  *H01L 29/786* (2006.01)
  *H01L 21/768* (2006.01)

(56) References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,510,836 B1* | 12/2019 | Haase | H01L 29/1033 |
| 10,573,742 B1* | 2/2020 | Feil | H01L 29/7813 |
| 11,031,466 B2 | 6/2021 | Poelzl et al. | |
| 2018/0061766 A1 | 3/2018 | Goktepeli | |
| 2019/0057959 A1 | 2/2019 | Or-Bach et al. | |
| 2020/0035560 A1 | 1/2020 | Block et al. | |
| 2020/0350401 A1* | 11/2020 | Poelzl | H01L 29/1095 |
| 2021/0408259 A1* | 12/2021 | Cheng | H01L 21/32134 |
| 2022/0344516 A1* | 10/2022 | Lin | H01L 29/66742 |
| 2022/0415795 A1* | 12/2022 | Haran | H01L 29/66742 |
| 2023/0047420 A1* | 2/2023 | Leomant | H01L 29/41766 |

OTHER PUBLICATIONS

Takeuchi, H et al., "Punch-Through Stop Doping Profile Control via Interstitial Trapping by Oxygen-Insertion Silicon Channel," Journal of the Electron Devices Society, Apr. 26, 2018, vol. 6, pp. 481-486, 6 pages.

* cited by examiner

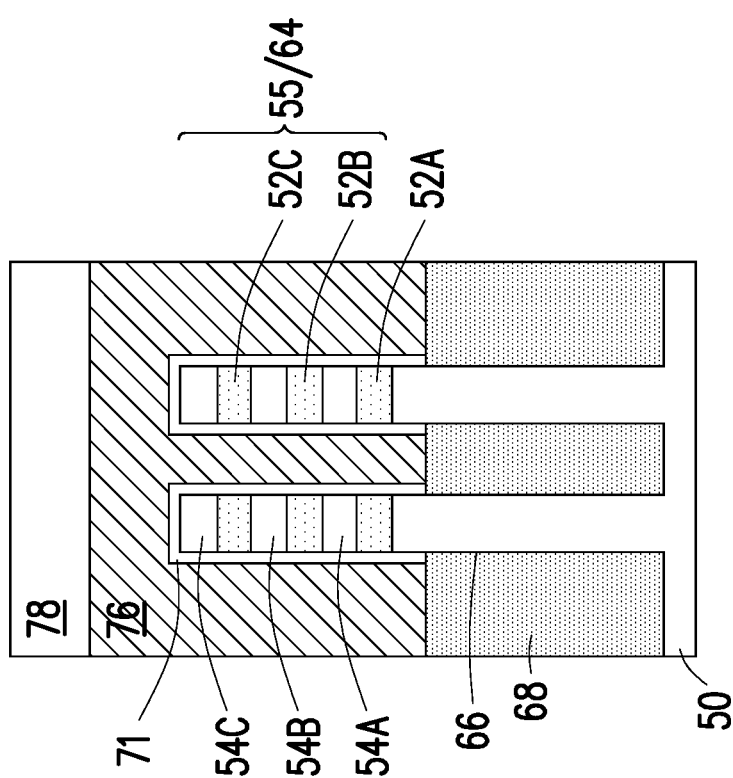
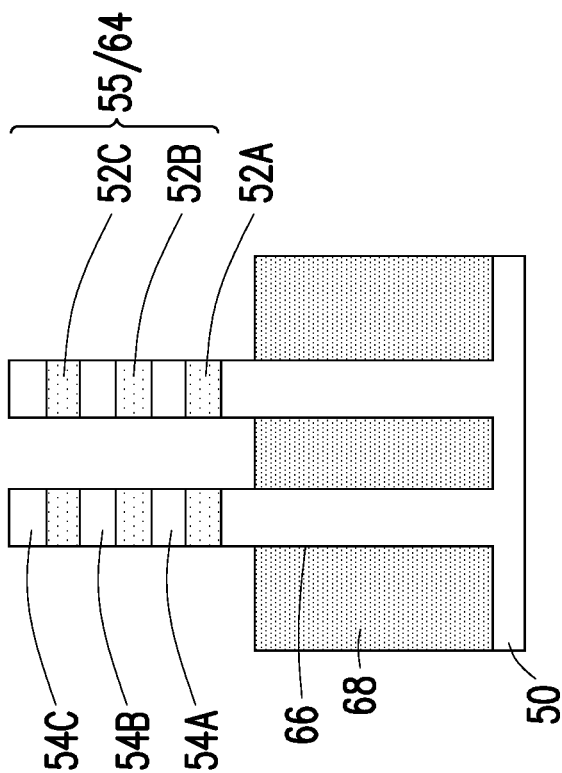
FIG. 9A
FIG. 9B

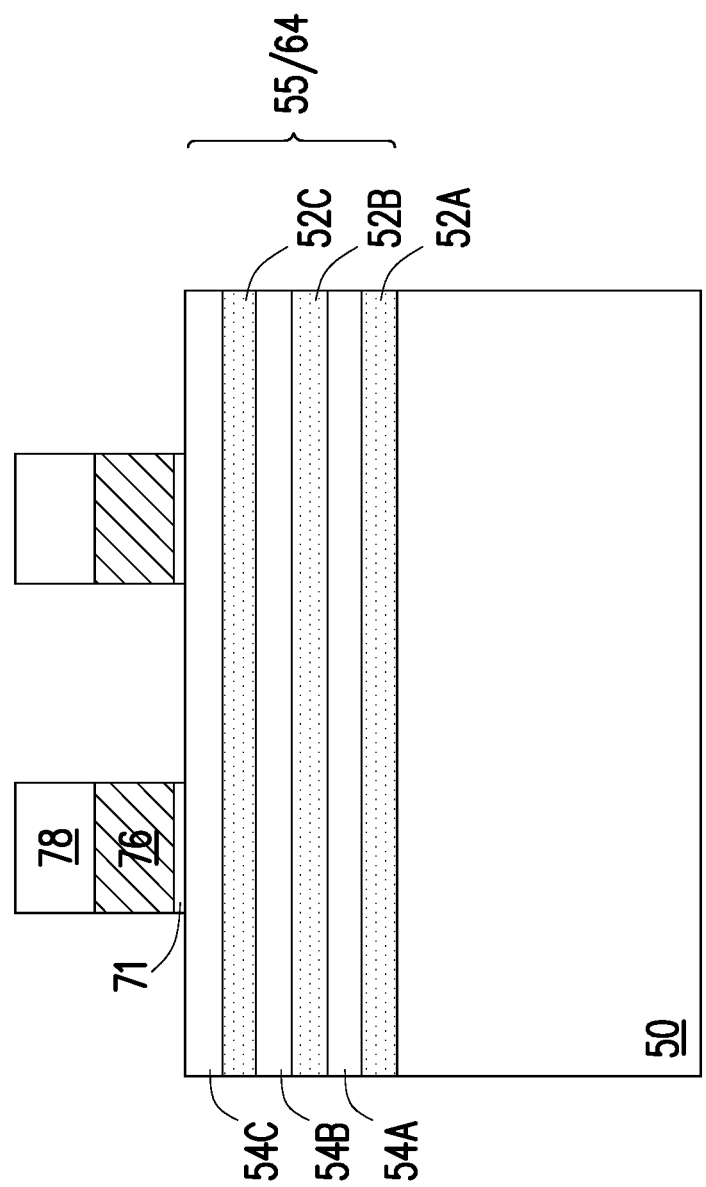

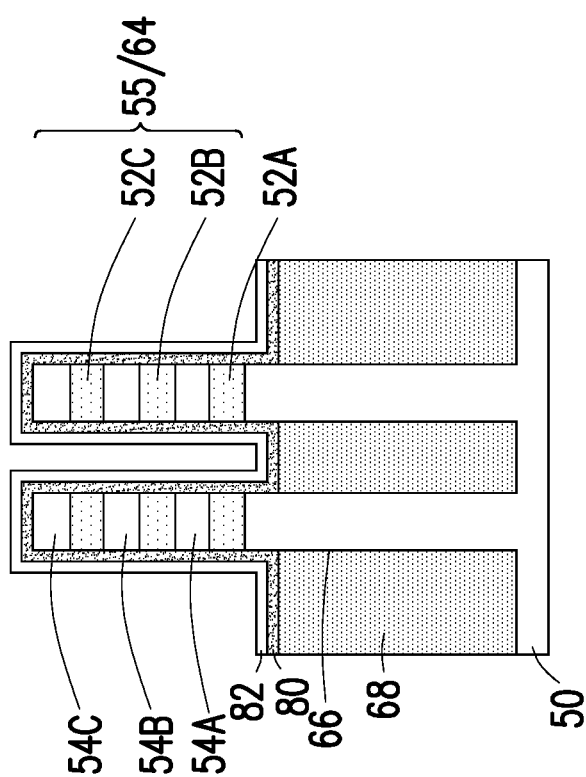
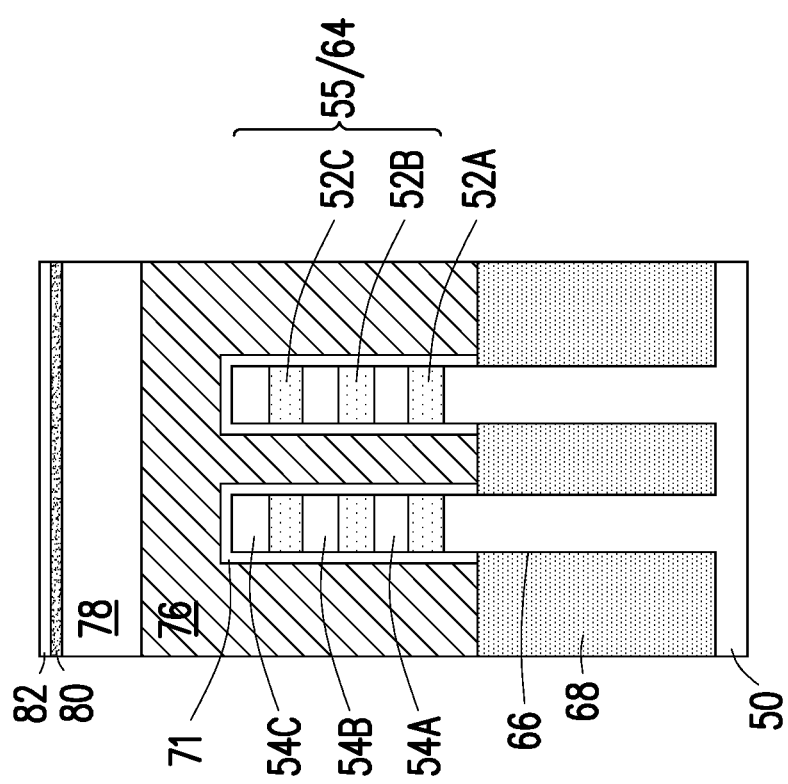
FIG. 10A
FIG. 10B

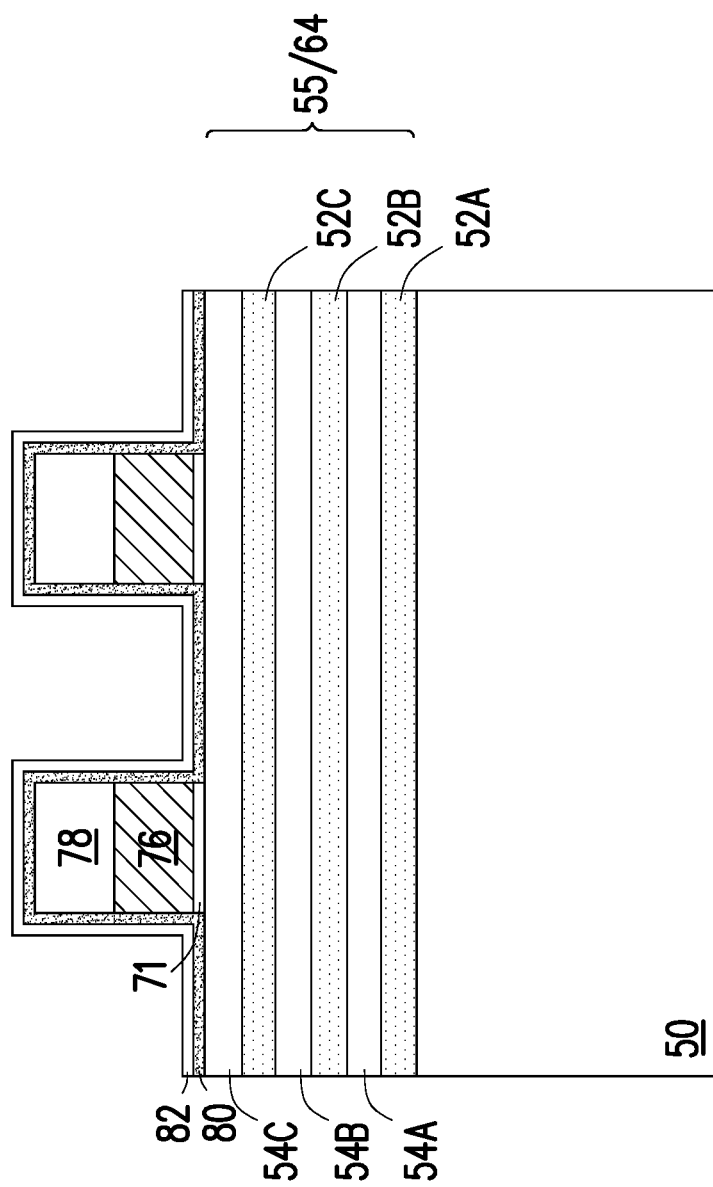

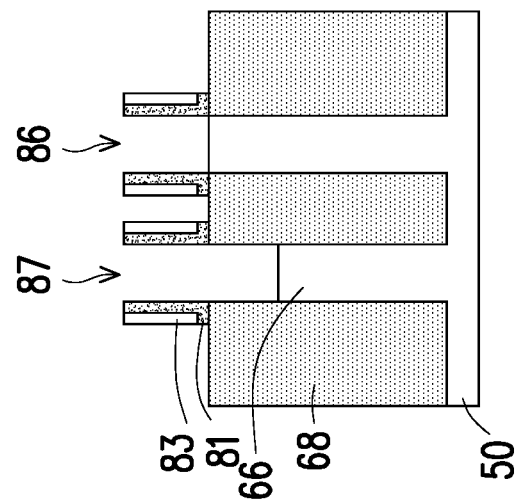
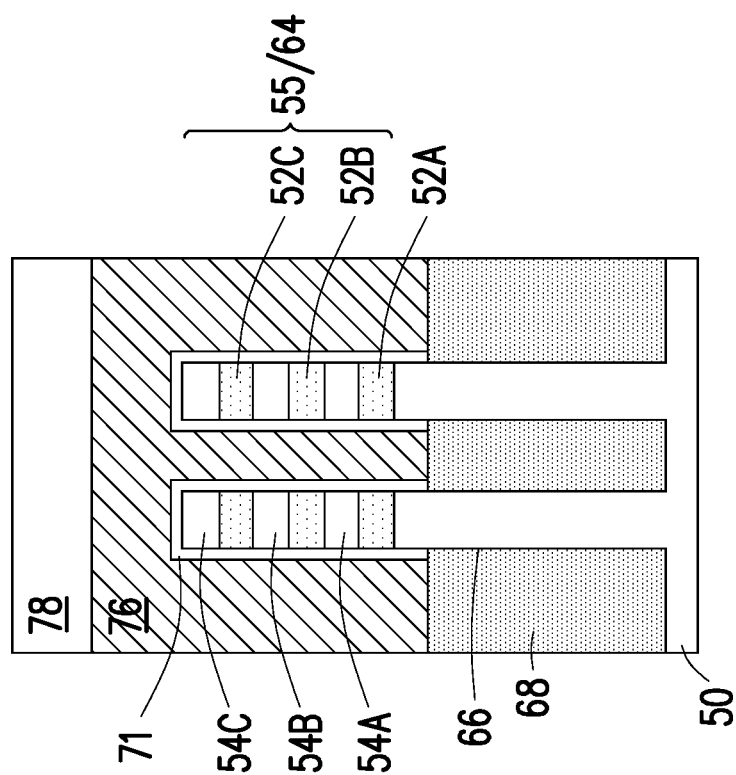
FIG. 12B
FIG. 12A

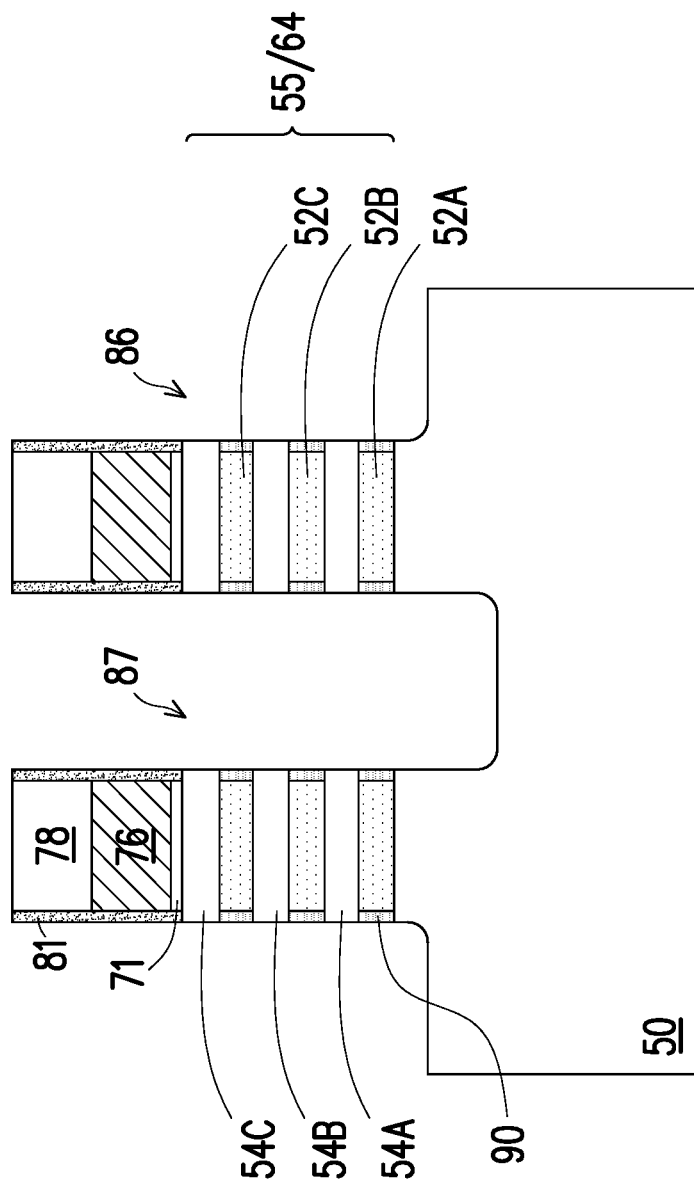

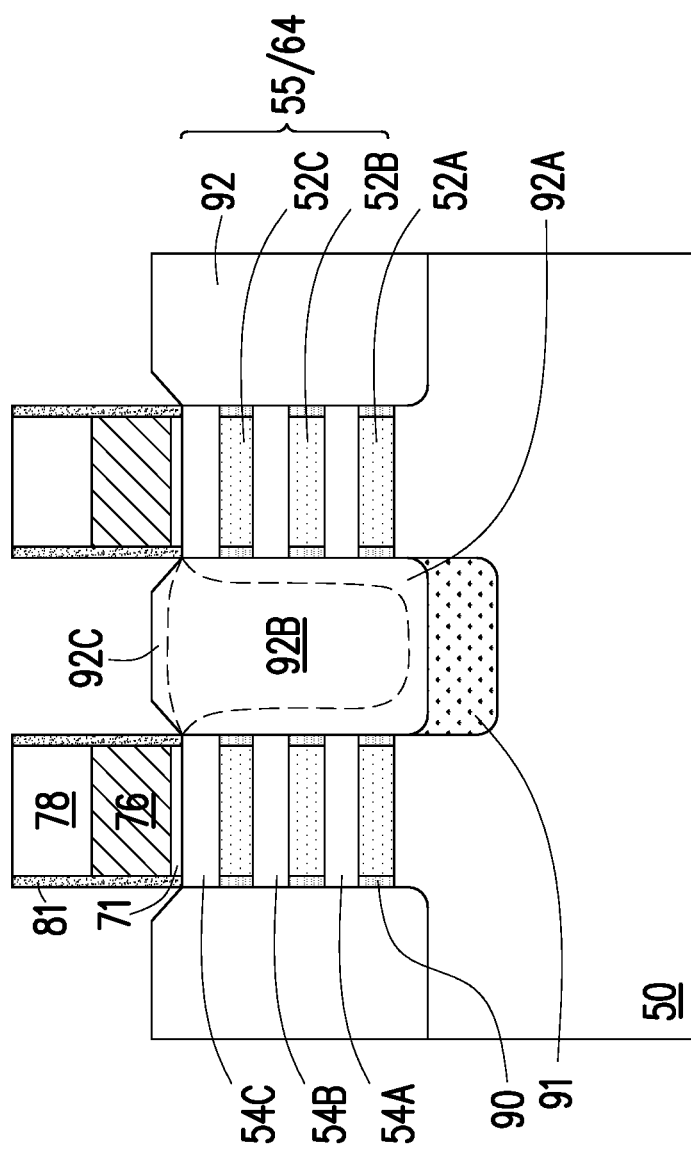
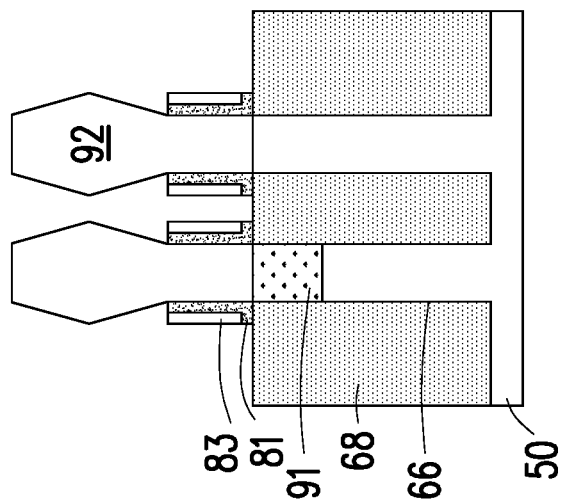
FIG. 15C
FIG. 15D

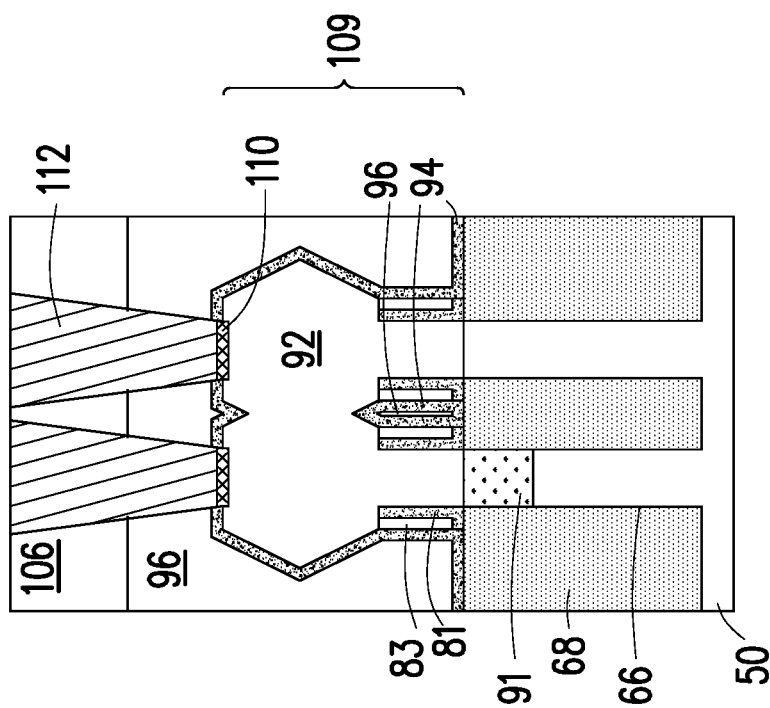
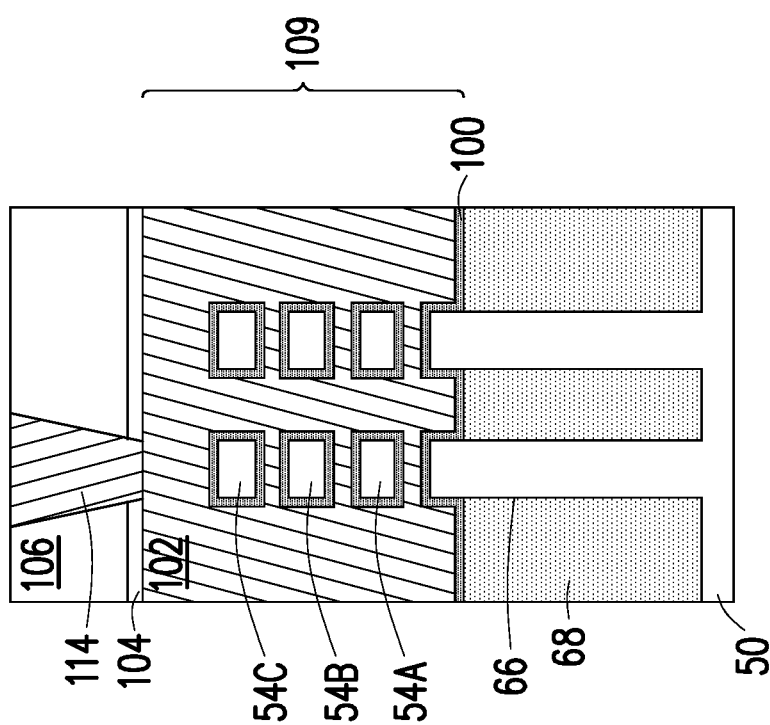
FIG. 23B
FIG. 23A

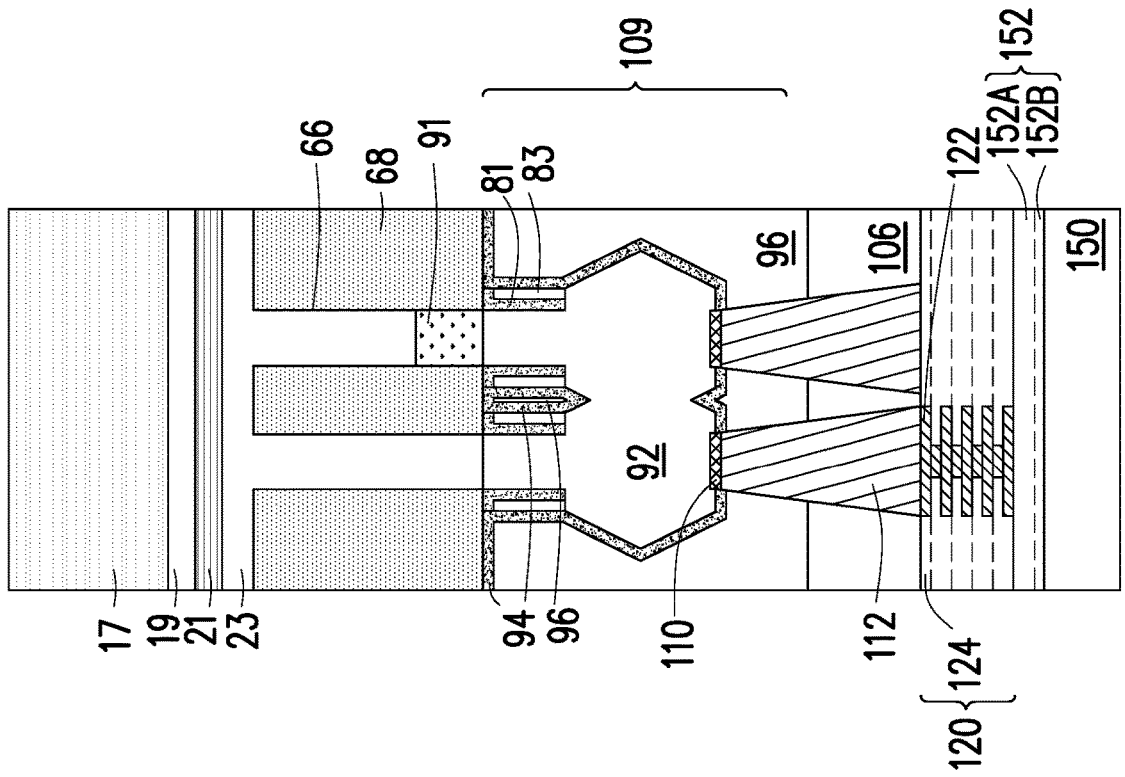
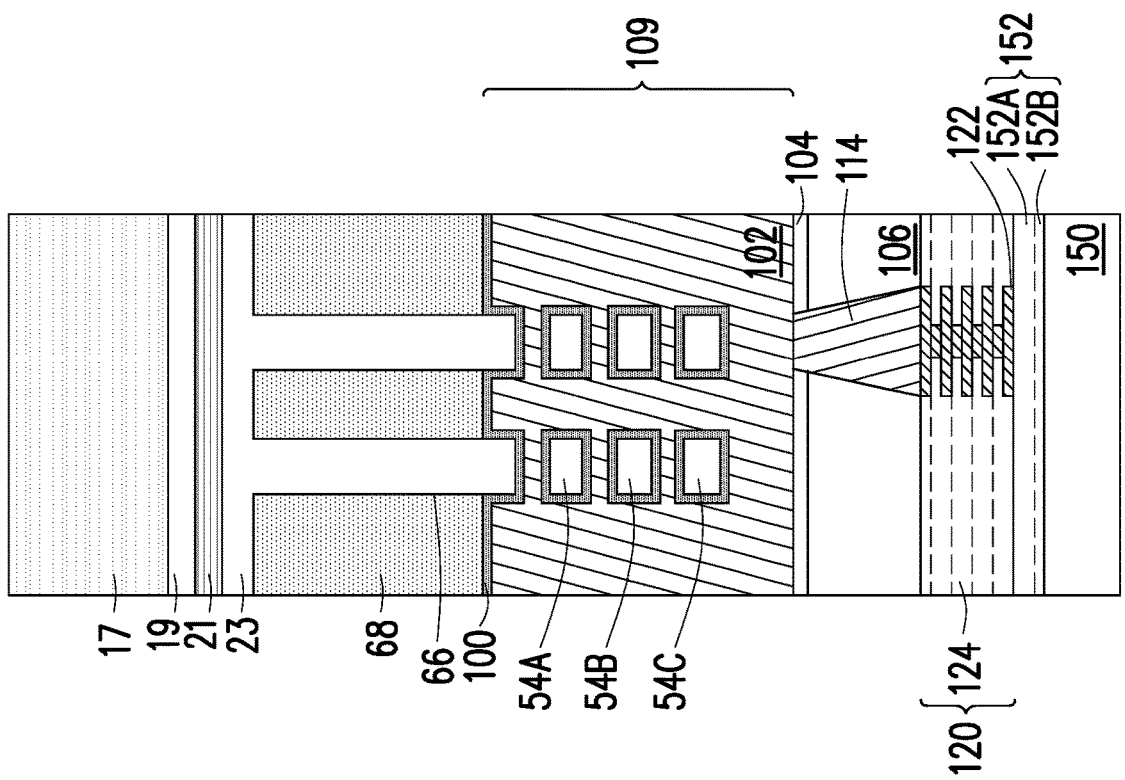
FIG. 26B
FIG. 26A

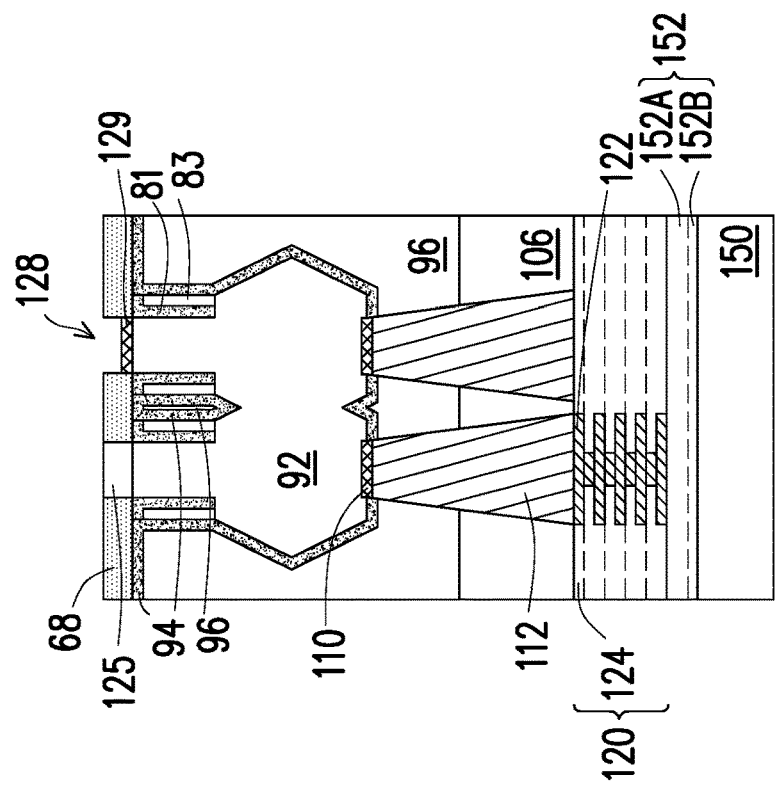
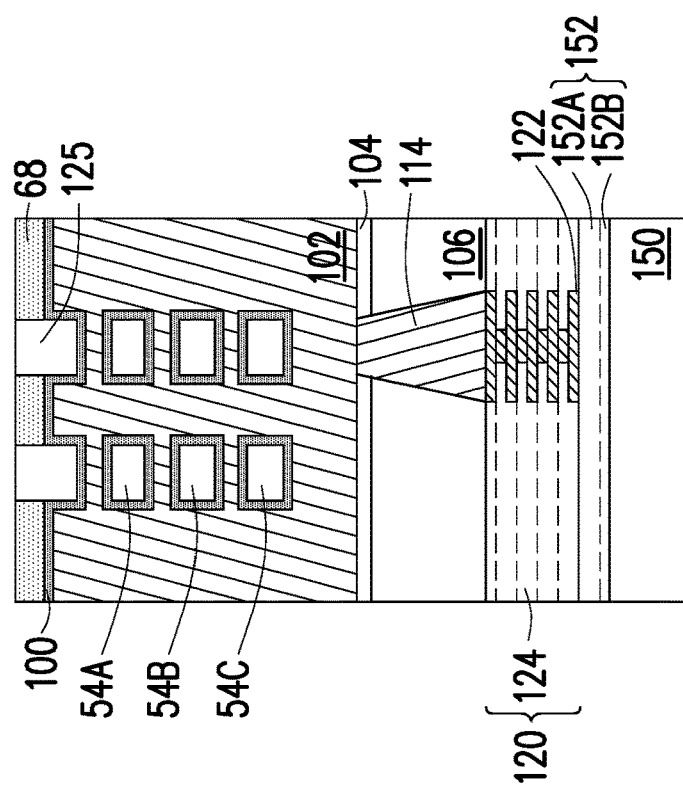
FIG. 31B
FIG. 31A

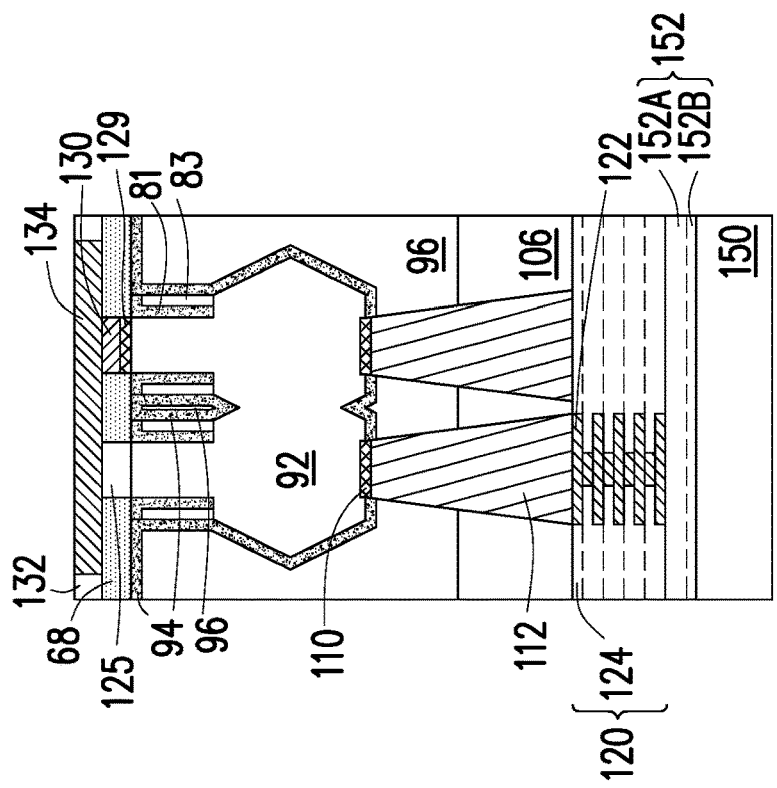
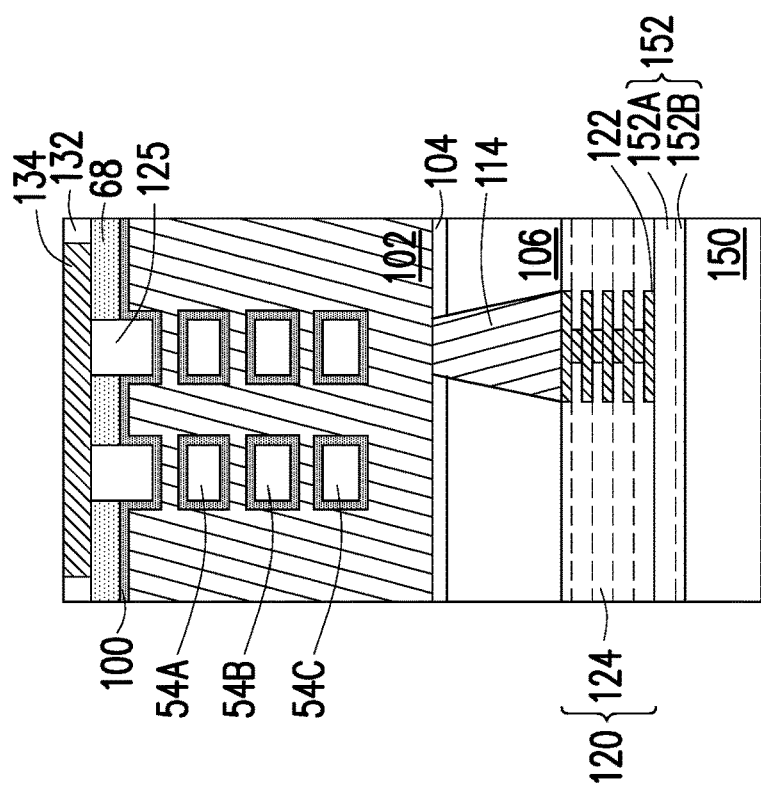
FIG. 33B
FIG. 33A

THIN FILM TRANSFER USING SUBSTRATE WITH ETCH STOP LAYER AND DIFFUSION BARRIER LAYER

PRIORITY CLAIM AND CROSS-REFERENCE

This application claims the benefit of U.S. Provisional Application No. 63/055,383, filed on Jul. 23, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5, 6, 7, 8, 9A, 9B, 9C, 10A, 10B, 10C, 11A, 11B, 11C, 12A, 12B, 12C, 13A, 13B, 13C, 14A, 14B, 14C, 14D, 15A, 15B, 15C, 15D, 15E, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 33D, 34A, 34B, and 34C are cross-sectional views of intermediate stages in the manufacturing of nano-FETs, in accordance with an embodiment.

DETAILED DESCRIPTION

Figure 1:
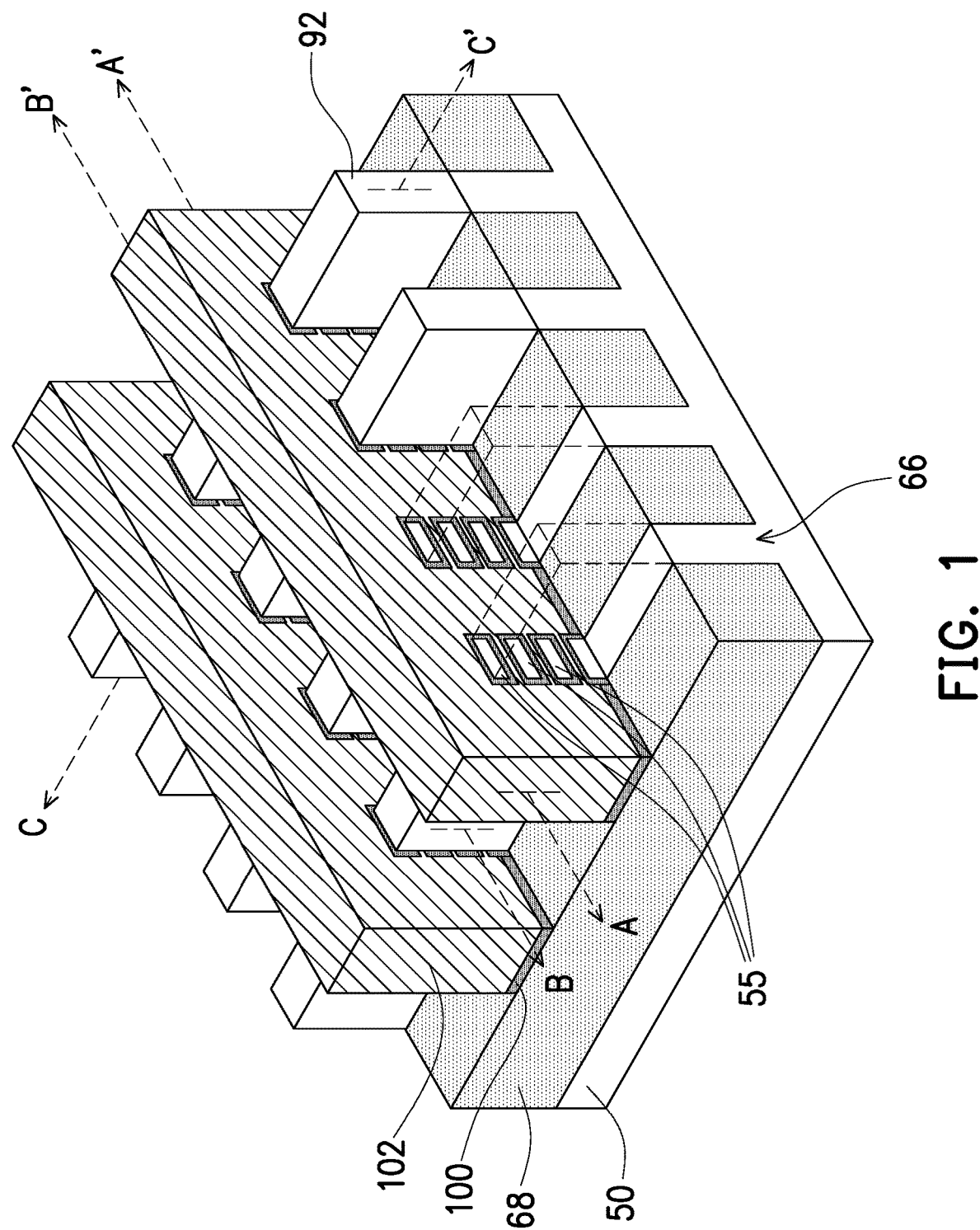
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion, the same or similar reference number in different figures refers to the same or similar element formed by a same or similar formation method using a same or similar material(s). In addition, figures with the same reference number but different alphabets (e.g., FIGS. 9A, 9B, and 9C) illustrate various views of a same structure at a same stage of manufacturing, but along different cross-sections.

In some embodiments, a multi-layered substrate includes a sacrificial substrate, an etch stop layer over the sacrificial substrate, a diffusion barrier over the etch stop layer, and a semiconductor layer over the diffusion barrier layer. The etch stop layer is formed of a highly doped semiconductor material to provide excellent etching selectivity over the diffusion barrier layer. The diffusion barrier layer comprises alternating layers of silicon and oxygen-inserted partial monolayers, and reduces out-diffusion of the dopant of the etch stop layer into the semiconductor layer of the substrate. As a result, a thin (e.g., <100 nm), high-quality semiconductor layer suitable for forming high-performance semiconductor devices is formed over the diffusion barrier layer. The semiconductor layer can be easily transferred to a workpiece (e.g., a wafer, a carrier, or the like) by a bonding process and a subsequent backside thinning process using selective etching processes facilitated by the structure of the substrate.

Some embodiments discussed herein are described in the context of a die including nano-FETs. However, various embodiments may be applied to whole wafers or dies including other types of transistors (e.g., fin field-effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

Figure 2A:
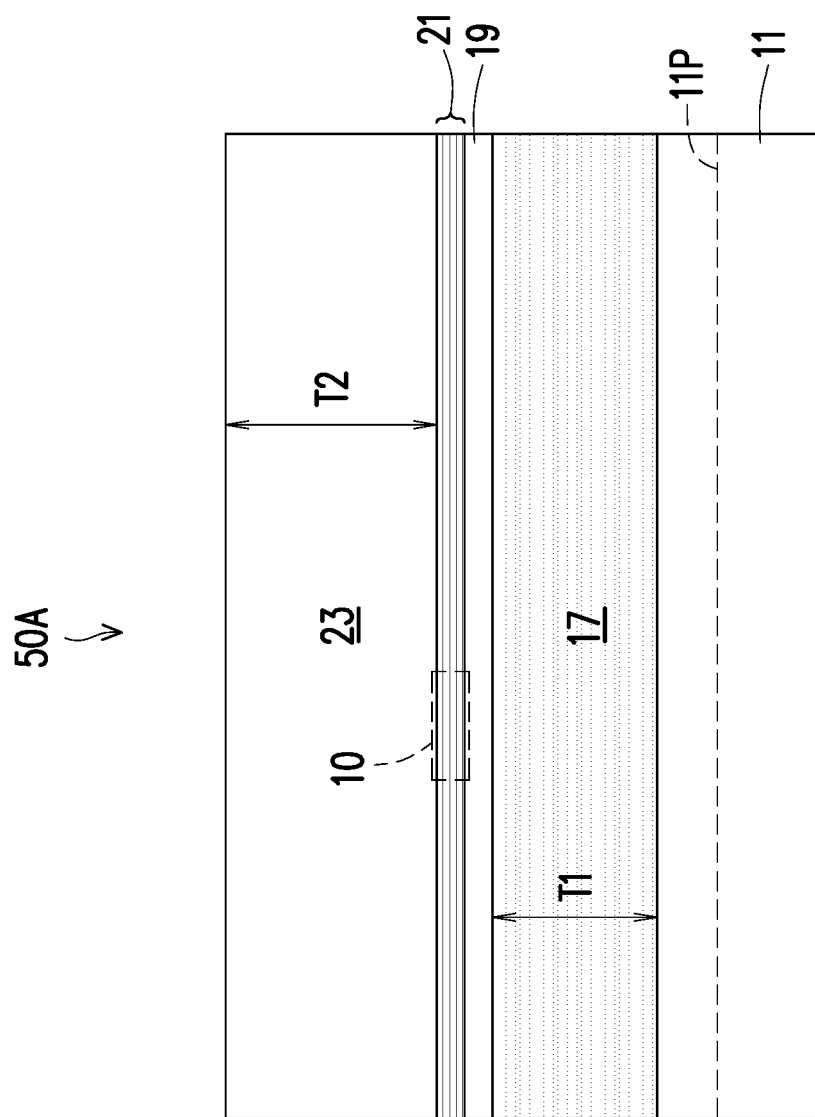
FIGS. 2A and 2B illustrate cross-sectional views of a substrate having etching stop layer and diffusion barrier layer, in accordance with an embodiment.
Figure 2B:
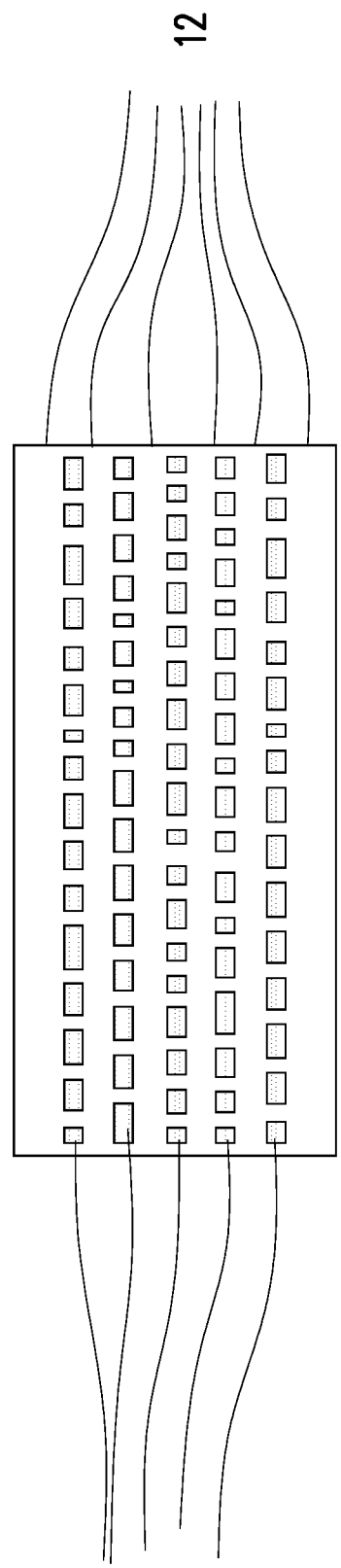

FIGS. 2A and 2B illustrate cross-sectional views of a substrate 50A having etching stop layer and diffusion barrier layer, in accordance with an embodiment. The substrate 50A, the substrate 50B in FIG. 3 and the substrate 50C in FIG. 4 are different embodiments of the substrate 50, and may be used as, e.g., the substrate 50 in FIG. 1 or the substrate 50 in FIGS. 5 through 34C.

Referring to FIG. 2A, the substrate 50A has a multi-layered structure that includes a sacrificial substrate 11 (may also be referred to as a substrate 11). The multi-layered structure further includes an etch stop layer 17, a capping layer 19, a diffusion barrier layer 21, and a semiconductor layer 23 (e.g., a layer of epitaxial semiconductor material) formed successively over the substrate 11.

In some embodiments, the substrate 11 is a semiconductor substrate, such as a bulk semiconductor, which may be doped (e.g., with a p-type or an n-type dopant) or undoped. For example, the substrate 11 may be a p− substrate or a p+ substrate. As another example, the substrate 11 may include a lower portion (e.g., the portion below dashed line 11P in FIG. 2A) that is a p+ substrate and include an upper portion (e.g., the portion above the dashed line 11P in FIG. 2A) that is a p− epitaxial silicon layer. The substrate 11 may be a wafer, such as a silicon wafer. In some embodiments, the semiconductor material of the substrate 11 may include silicon; germanium; a compound semiconductor including silicon carbide, an alloy semiconductor including silicon-germanium, or combinations thereof.

In some embodiments, the etch stop layer 17 is a semiconductor material doped by a dopant. The semiconductor material may be, e.g., silicon or silicon germanium, and the dopant may be, e.g., boron, phosphorus, arsenic, indium, or antimony. For example, the etch stop layer 17 may be a layer of silicon germanium (SiGe) doped by boron, or a layer of silicon doped by boron. The etch stop layer 17 may be formed by a suitable formation method, such as chemical vapor deposition (CVD). A concentration of the dopant (e.g., boron) in the etch stop layer 17 is between about 2E19 atoms/cm$^3$ and about 5E21 atoms/cm$^3$, in some embodiments. For example, in an embodiment where the etch stop layer 17 is silicon doped by boron (also referred to as a Si:B layer), the concentration of boron in the etch stop layer 17 may be about 4E20 atoms/cm$^3$. As another example, in an embodiment where the etch stop layer 17 is silicon germanium doped by boron (also referred to as SiGe:B layer), the concentration of boron in the etch stop layer 17 may be about 2E20 atoms/cm$^3$. A thickness T1 of the etch stop layer 17 may be between about 5 nm and about 100 nm, as an example. In subsequent processing, the sacrificial substrate 11, the etch stop layer 17, the capping layer 19 and the diffusion barrier layer 21 are removed by one or more etching, sometimes in combination with a mechanical thinning processes, and the etch stop layer 17 functions as an etch stop layer when the portion of the substrate 11 immediately adjacent to layer 17 is removed by a selective etching process.

Note that doped semiconductor layer (e.g., SiGe:B) has been used to enhance device performance, such as to improve channel mobility. Therefore, in a conventional design, doped semiconductor layer may be a part of the final product to improve the performance of the semiconductor device formed. The doped semiconductor material (e.g., Si:B) of the etch stop layer 17 in the present disclosure, however, is used as an etch stop layer, and is removed from the final product. The concentration of dopant (e.g., boron) in the etch stop layer 17 of the present disclosure may be orders of magnitude higher (e.g., hundreds of times more) than that used in a doped semiconductor layer of a conventional design. Such a high dopant concentration achieves excellent etching selectivity for the etch stop layer 17. For example, when the substrate 11 (e.g., a silicon substrate) is removed in a subsequent etching process, an etching selectivity of 50 or more is achieved between the substrate 11 and etch stop layer 17. In other words, the substrate 11 is etched at an etching rate that is 50 times or more than that of the etch stop layer 17. Such a high etching selectivity is advantageous for applications where the semiconductor layer 23 is transferred to a different structure. Without the high etching selectivity provided by the disclosed etch stop layer 17, transferring of the semiconductor layer 23 may be too time-consuming to be economically feasible. Additionally, high etching selectivity is advantageous when thickness uniformity of the transferred layer is important to maintaining tight device performance distributions. The high doping concentration in the etch stop layer 17, however, if not addressed, will cause out-diffusion of the dopant into adjacent layers. The subsequently formed diffusion barrier layer 21 provides protection against the out-diffusion of the dopant of the etch stop layer 17.

In some embodiments, the as-deposited capping layer 19 is an epitaxy semiconductor layer (e.g., an un-doped epitaxial silicon layer), and may be formed by a suitable formation method such as CVD. The capping layer 19 may function as a buffer layer between the etch stop layer 17 and the diffusion barrier layer 21 to prevent or reduce defects in the epitaxial material of the diffusion barrier layer 21. A thickness of the capping layer 19 is between about 1 nm and about 30 nm, in some embodiments. In some embodiments, although the as-deposited capping layer 19 is an un-doped layer, the dopant in the etch stop layer 17 diffuses into the capping layer 19 and turns the capping layer 19 into a doped semiconductor layer, in which case there may be a gradient in the dopant concentration in the doped capping layer 19, with the dopant concentration decreasing as the doped capping layer 19 extends away from the etch stop layer 17.

In accordance with some embodiments, the diffusion barrier layer 21 is a layer stack comprising silicon layers 12 (see FIG. 2B) interleaved with oxygen-inserted partial monolayers 14. In other words, the diffusion barrier layer 21 comprises alternating layers of silicon layers 12 and oxygen-inserted partial monolayers 14 (may also be referred to as partial monolayers of oxygen, or discontinuous oxygen layers). FIG. 2B illustrates a zoomed-in view of the diffusion barrier layer 21 in an area 10 of FIG. 2A.

As illustrated in FIG. 2B, the diffusion barrier layer 21 includes a first number of silicon layers 12, where each of the silicon layers 12 is an un-doped epitaxial silicon layer formed by, e.g., a CVD process used for epitaxial growth of a semiconductor material. The silicon layer 12 may be formed using a precursor comprising silicon, such as silane ($SiH_4$), dichlorosilane (DCS), or the like. Each of the silicon layers 12 may have a thickness between about 1 nm and about 30 nm, as an example. Note that the silicon layers 12 do not have to be of the same thickness, and each of the silicon layers 12 may be of any suitable thickness, as one skilled in the art readily appreciates.

Still referring to FIG. 2B, the diffusion barrier layer 21 further includes a second number of oxygen-inserted partial monolayers 14. In the illustrated example, the second number is one less than the first number. For example, FIG. 2B illustrates six silicon layers 12 and five oxygen-inserted partial monolayers 14 as a non-limiting example. The number of the silicon layers 12 and the oxygen-inserted partial monolayers 14 may be any suitable number, as one skilled in the art readily appreciates. A thickness of each of the oxygen-inserted partial monolayers 14 may be less than about 0.5 nm. In some embodiments, a concentration of oxygen in each of the second number of oxygen-inserted partial monolayers 14 is several orders of magnitude (e.g., 100 times, 1000 times, or more) higher than a background oxygen concentration level, where the background oxygen concentration level refers to an oxygen level due to unintentional incorporation of oxygen that may come from the process chamber, a source material or the wafer surface. The background oxygen concentration level may depend on, e.g., the best-practices, capabilities and/or requirements for each manufacturing process or product, as one skilled in the art appreciates.

In some embodiments, each of the oxygen-inserted partial monolayers 14 is an epitaxial silicon layer into which oxygen has been incorporated. Each of the oxygen-inserted partial monolayers 14 may be formed by a same CVD tool used for epitaxial growth of the silicon epitaxial layers 12. In some embodiments, a temperature of the CVD process for forming the diffusion barrier layer 21 is between about 400° C. and about 800° C. For example, a precursor comprising oxygen (e.g., an oxygen-containing gas) is supplied to the CVD epitaxy tool chamber for the formation of a first oxygen-inserted partial monolayer 14. The precursor may be carried into the CVD epitaxy tool chamber by a carrier gas such as $H_2$, $N_2$, or another suitable inert gas. In some embodiments, the oxygen atoms occupy the interstitial sites in the silicon lattice to form the oxygen-inserted partial monolayers 14. The above processing of forming alternate layers of silicon and oxygen-inserted partial monolayers repeats until a target number of silicon layers 12 and oxygen-inserted partial monolayers 14 are formed. In some embodiments, diffusion of the dopant (e.g., boron) of the etch stop layer 17 into adjacent silicon layers (e.g., 23) occurs via an interstitial-mediated mechanism, the presence of oxygen atoms in the interstitial sites of the oxygen-inserted partial monolayers 14 therefore blocks or reduces diffusion of the dopant.

In some embodiments, if the dosage of oxygen in the oxygen-inserted partial monolayer 14 is too low, the diffusion barrier layer 21 may not provide enough protection against out-diffusion of the dopant (e.g., boron) of the etch stop layer 17, e.g., during subsequent thermal processes, such as an anneal process to activate the dopant in the etch stop layer 17, an anneal process to activate dopants in subsequently formed source/drain regions, or a thermal process in a subsequent deposition process. If the dosage of oxygen in the oxygen-inserted partial monolayer 14 is too high, the subsequently formed silicon epitaxial layers 12 may become defective and a high-quality epitaxial material (e.g., 23) for forming high performance devices may not be formed, as discussed below in more detail.

In some embodiments, the dosage and/or the concentration of oxygen in the oxygen-inserted silicon layer 14 are chosen to allow formation of a partial monolayer of oxygen. Here the term "partial monolayer" means that the concentration of oxygen in the oxygen-inserted silicon layer 14 is very high (e.g., orders of magnitude, or hundreds of times more compared to that of a typical oxygen-incorporated epitaxial silicon layer used in existing designs) to effectively reduce diffusion of the dopant (e.g., boron) of the etch stop layer 17, but not too high (e.g., as high as a full monolayer of oxygen) that the silicon lattice is disrupted. In other words, the partial monolayer of oxygen in each of the oxygen-inserted silicon layer 14 allows for lattice alignment between an overlying silicon layer 12 and an underlying silicon layer 12. Without the lattice alignment, dislocation defects may form with each pair of silicon layer 12 and oxygen-inserted partial monolayer 14, and a high-quality crystalline semiconductor layer 23 for high performance devices may not be formed over the diffusion barrier layer 21. Embodiments of the oxygen-inserted silicon layer 14 are not limited to the example discussed above, and other modifications or variations are also possible and are fully intended to be included within the scope of the present disclosure.

Referring back to FIG. 2A, the semiconductor layer 23 is formed over the diffusion barrier layer 21. The semiconductor layer 23 is an epitaxial semiconductor material, e.g., an epitaxial silicon material, formed by a suitable formation method such as a CVD epitaxial process. In subsequent processing, electrical components, such as transistors, are formed in/on the semiconductor layer 23 to form a device layer, and the device layer is then transferred to another semiconductor structure. In an example embodiment, a thickness T2 of the semiconductor layer 23 is less than about 100 nm. Without the diffusion barrier layer 21, such a small thickness (e.g., smaller than 100 nm) may not be achievable, because the lower portion of the semiconductor layer 23 proximate to the etch stop layer 17 may be contaminated by the out-diffusion of the dopant (e.g., boron) of the etch stop layer 17, and electrical components may have to be formed in an upper portion of the semiconductor layer 23 distal from the etch stop layer 17. Therefore, the disclosed diffusion barrier layer 21 allows for a thin semiconductor layer 23 to be formed and used for forming semiconductor devices. The thin semiconductor layer 23, coupled with the factor that less etching of the semiconductor layer 23 may be needed during manufacturing, achieves a smaller total thickness variation (TTV) for the semiconductor layer 23. In addition, the thin semiconductor layer 23 results in less material cost and less manufacturing time.

In some embodiments, the etch stop layer 17 and the diffusion barrier layer 21 are formed in different processing chambers. In some embodiments, the etch stop layer 17, the diffusion barrier layer 21, and the semiconductor layer 23 are formed in a same processing chamber. These and other variations are fully intended to be included within the scope of the present disclosure.

Figure 3:
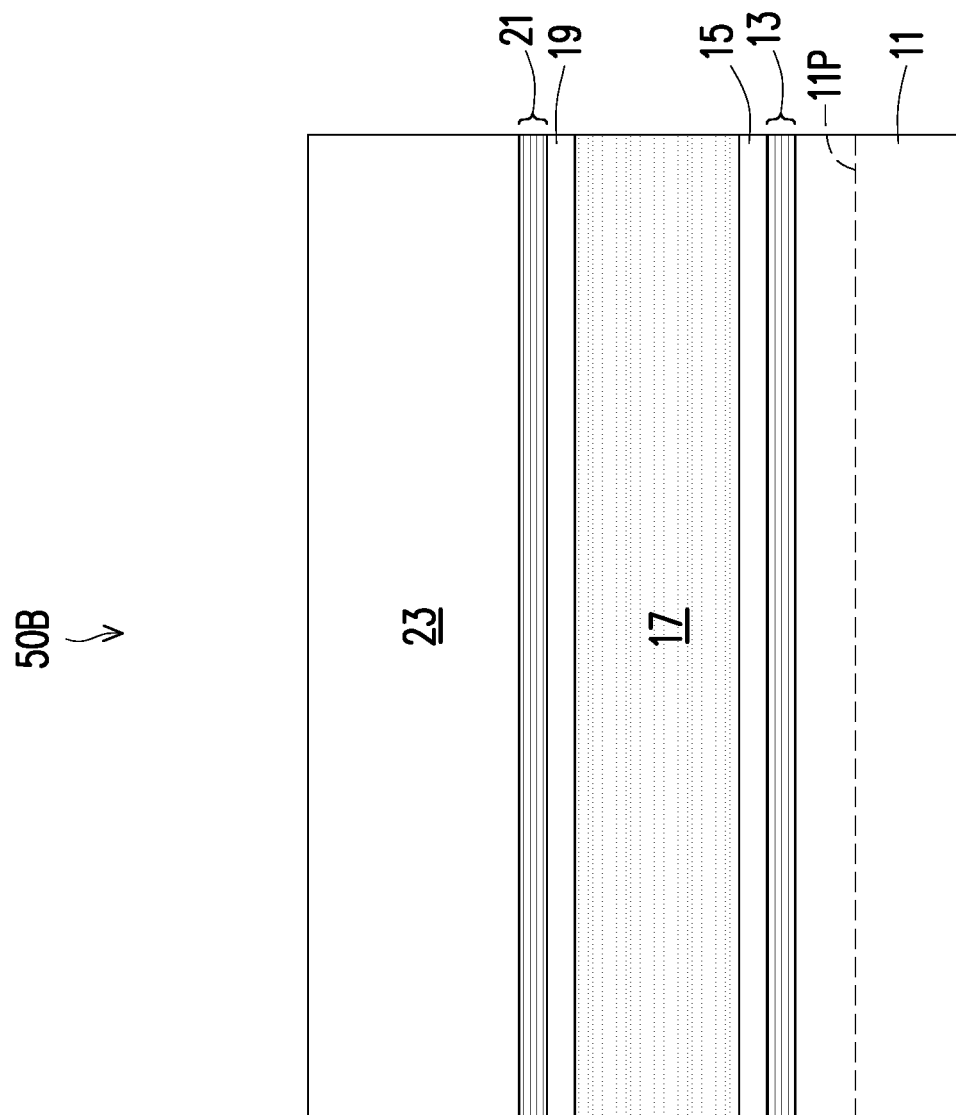
FIG. 3 illustrates a cross-sectional view of a substrate having etching stop layer and diffusion barrier layer, in accordance with another embodiment.
Figure 4:
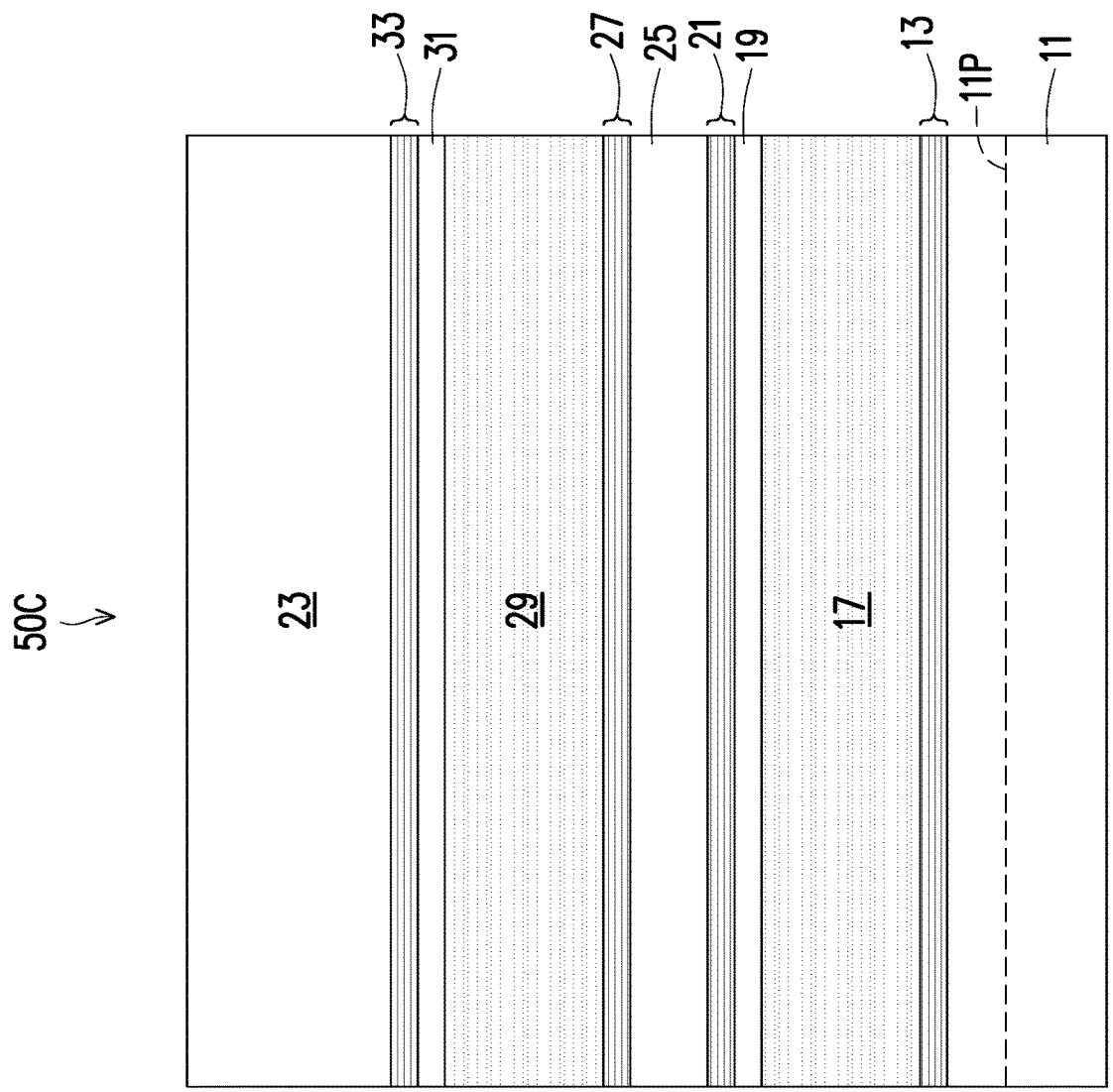
FIG. 4 illustrates a cross-sectional view of a substrate having etching stop layer and diffusion barrier layer, in accordance with yet another embodiment.

FIG. 3 illustrates a cross-sectional view of a substrate 50B having etching stop layer and diffusion barrier layer, in accordance with another embodiment. The substrate 50B is similar to the substrate 50A, but with a capping layer 15 and a diffusion barrier layer 13 formed under the etch stop layer 17. The capping layer 15 and the diffusion barrier layer 13 may be the same as or similar to the capping layer 19 and the diffusion barrier layer 21, respectively, and may be formed of a same or similar formation method using a same or similar material(s), thus details are not repeated. In some embodiments, the capping layer 15 may be omitted in the substrate 50B.

Experiments have been conducted to confirm the effectiveness of the diffusion barrier layer 21. For example, a substrate similar to the substrate 50B, with an etch stop layer 17 formed of silicon doped by boron (Si:B) and a boron concentration of 4.5E20 atoms/cm$^3$, is heated in a spike rapid thermal anneal (RTA) process at 1090° C. for about 1.8 seconds. Compared with a reference substrate without the diffusion barrier layer 21, the diffusion depth of the boron into the semiconductor layer 23 is reduced by about 40% by the substrate 50B having the diffusion barrier layer 21.

FIG. 4 illustrates a cross-sectional view of a substrate 50C having etching stop layer and diffusion barrier layer, in accordance with yet another embodiment. The substrate 50C is similar to the substrate 50B in FIG. 3, but with additional layers, such as an etch stop layer 29, capping layers 31, diffusion barrier layers 27 and 33, and an un-doped semiconductor layer 25 (e.g., an un-doped epitaxial silicon layer). In addition, the capping layer 15 in FIG. 3 is omitted in the example of FIG. 4. The etch stop layer 29 may be the same as or similar to the etch stop layer 17, the capping layer 31 may be the same as or similar to the capping layer 19, and the diffusion barrier layers 27 and 33 may be the same as or similar to the diffusion barrier layers 21 and 13, thus details are not repeated. In some embodiments, a capping layer same as or similar to the capping layer 19 is formed under (e.g., under and physically contacts) each of the etch stop layers 29 and 17. In an example embodiment, the etch stop layers 17 and 29 are silicon doped by boron (e.g., Si:B), the capping layers 31 and 19 are silicon doped by boron (e.g., Si:B), and the un-doped semiconductor layer 25 is a layer of un-doped epitaxial silicon.

FIGS. 5 through 34C are cross-sectional views of intermediate stages in the manufacturing of nano-FETs, in accordance with an embodiment. FIGS. 5 through 8, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, and 34A illustrate reference cross-section A-A' illustrated in FIG. 1. FIGS. 9B, 10B, 11B, 12B, 13B, 14B, 15B, 15D, 16B, 17B, 18B, 19B, 20B, 21B, 22B, 23B, 24B, 25B, 26B, 27B, 28B, 29B, 30B, 31B, 32B, 33B, and 34B illustrate reference cross-section B-B' illustrated in FIG. 1. FIGS. 9C, 10C, 11C, 12C, 13C, 14C, 14D, 15C, 15E, 16C, 17C, 18C, 19C, 20C, 21C, 22C, 23C, 24C, 25C, 26C, 27C, 28C, 29C, 30C, 31C, 32C, 33C, 33D, and 34C illustrate reference cross-section C-C' illustrated in FIG. 1.

Figure 5:
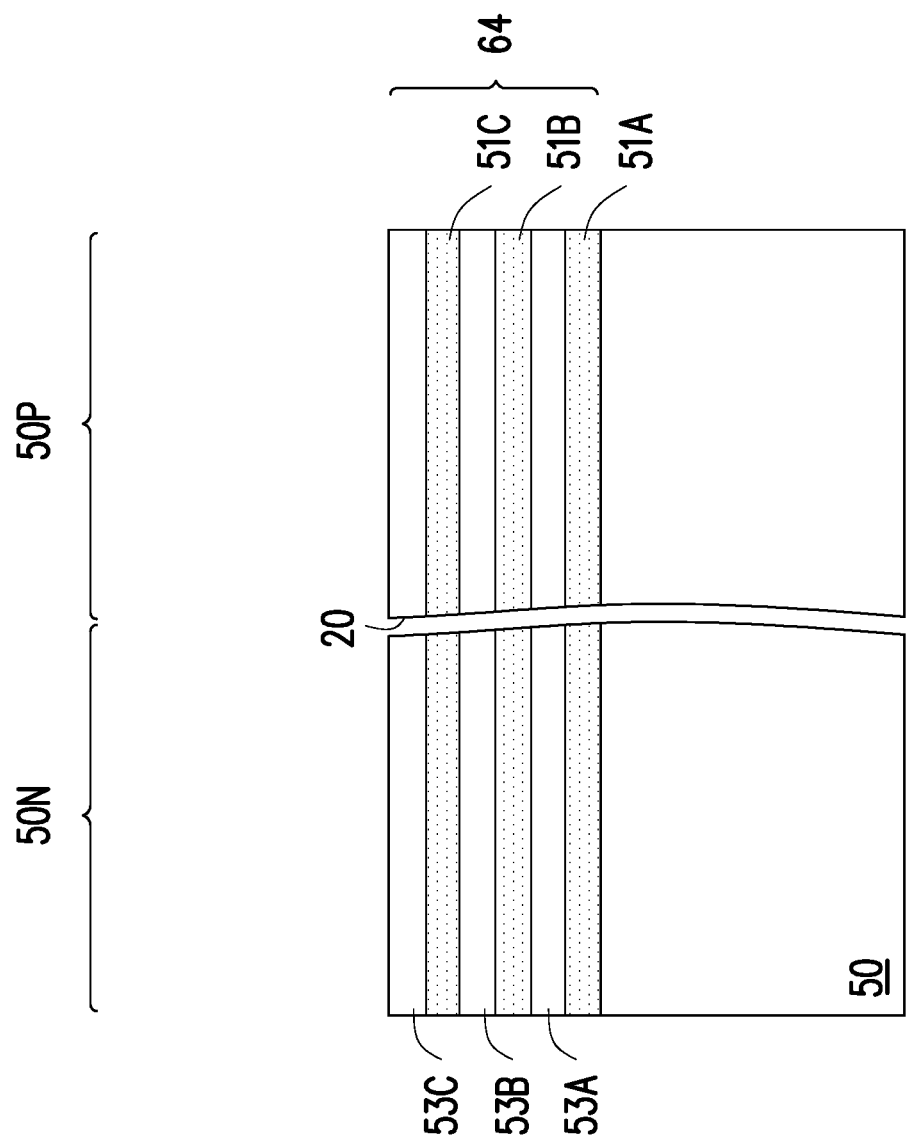

In FIG. 5, a substrate 50 is provided. The substrate 50 may be any of the disclosed embodiments, such as substrate 50A, substrate 50B, or substrate 50C. For simplicity, details of the substrate 50 may not be illustrated in subsequent figures.

Further in FIG. 5, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 6:
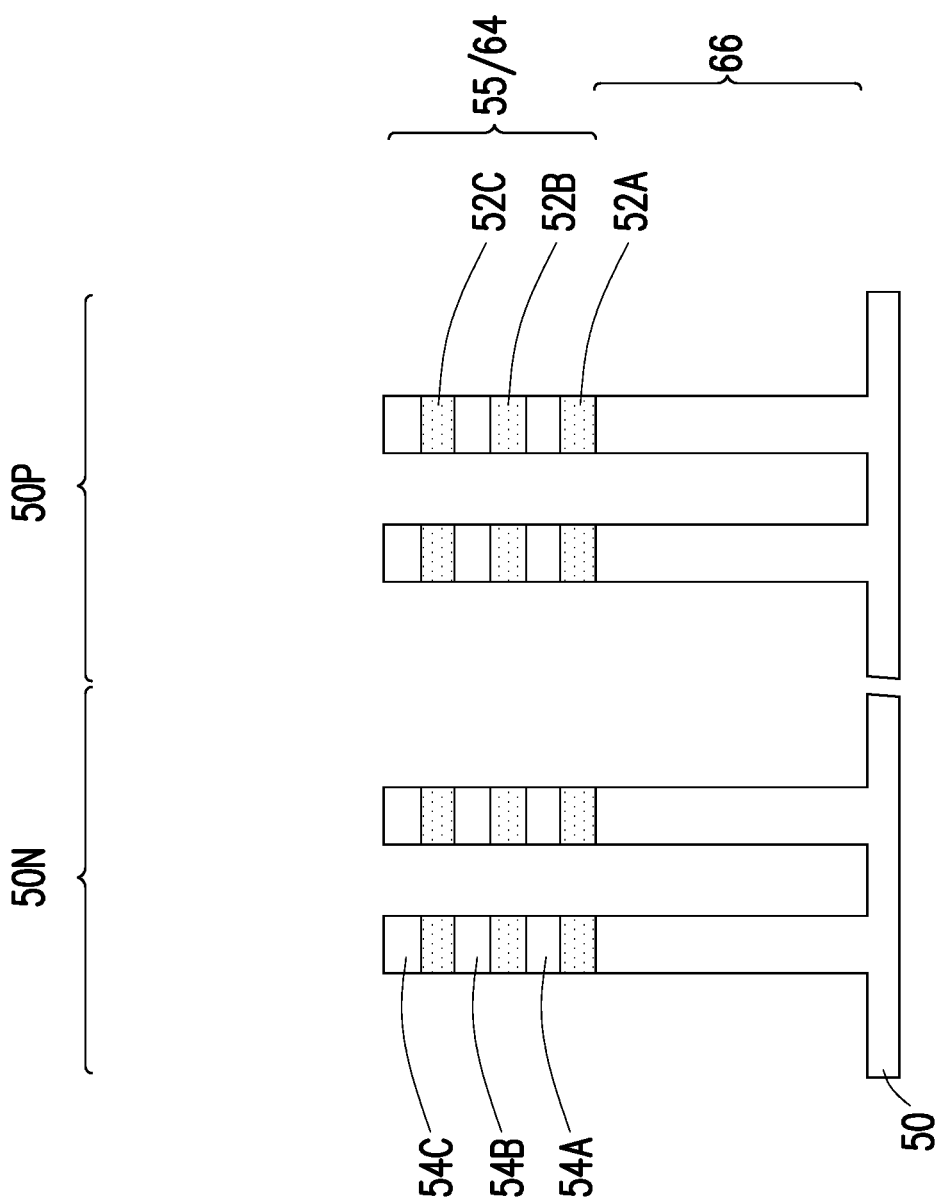

Referring now to FIG. 6, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nano structures 54A-54C (collectively referred to as the second nanostructures 54) from the second semiconductor layers 53. The first nanostructures 52 and the second nanostructures 54 may be collectively referred to as nanostructures 55. In the illustrated embodiment, the fins 66 are formed in the semiconductor layer 23 (see, e.g., FIG. 2A) of the substrate 50. In some embodiments, the etching process to form the fins 66 stops before reaching the diffusion barrier layer (e.g., 21 or 33) of the substrate 50, and therefore, the portion of the substrate 50 connected to the fins 66 may correspond to the remaining portions of the semiconductor layer 23 after the etching process.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 6 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 7:
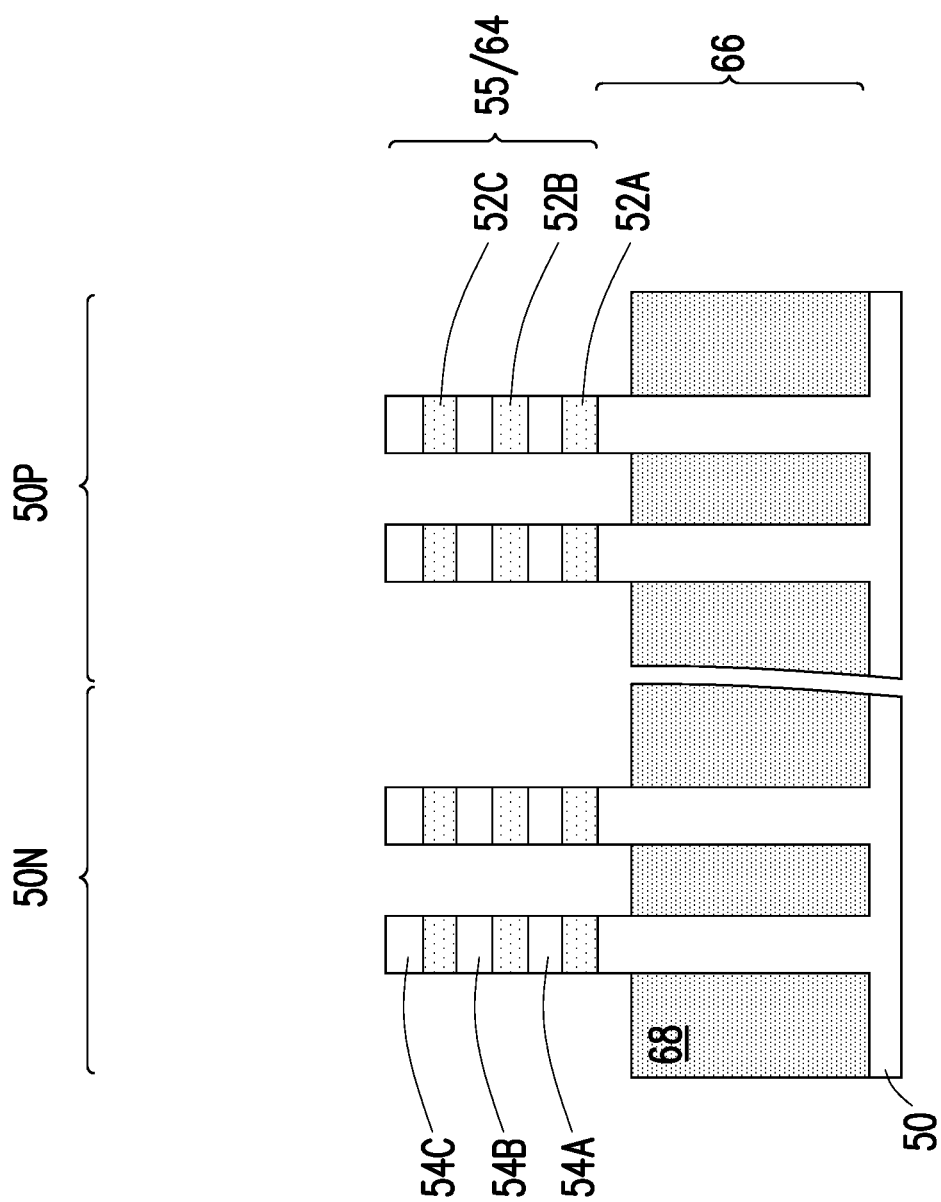

In FIG. 7, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 5 through 7 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 7, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm³ to about $10^{14}$ atoms/cm³. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm³ to about $10^{14}$ atoms/cm³. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 8:
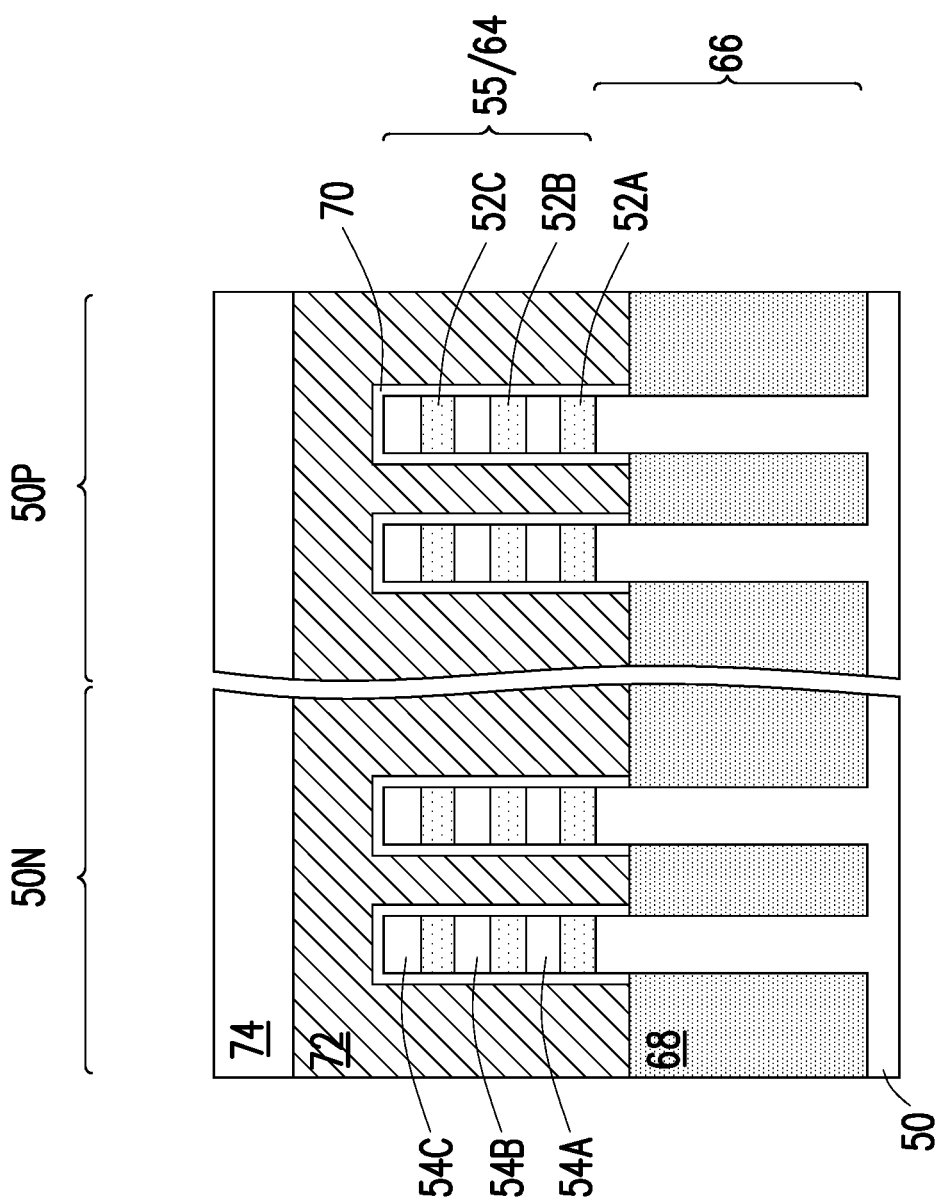

In FIG. 8, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

FIGS. 9A through 21C illustrate various additional steps in the manufacturing of embodiment devices. FIGS. 9A through 21C illustrate features in either the n-type region 50N or the p-type region 50P. In FIGS. 9A through 9C, the mask layer 74 (see FIG. 8) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

In FIGS. 10A through 10C, a first spacer layer 80 and a second spacer layer 82 are formed over the structures illustrated in FIGS. 9A through 9C. The first spacer layer 80 and the second spacer layer 82 will be subsequently patterned to act as spacers for forming self-aligned source/drain regions. In FIGS. 10A through 10C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 7, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm³ to about $1\times10^{19}$ atoms/cm³. An anneal may be used to repair implant damage and to activate the implanted impurities.

Figure 11B:
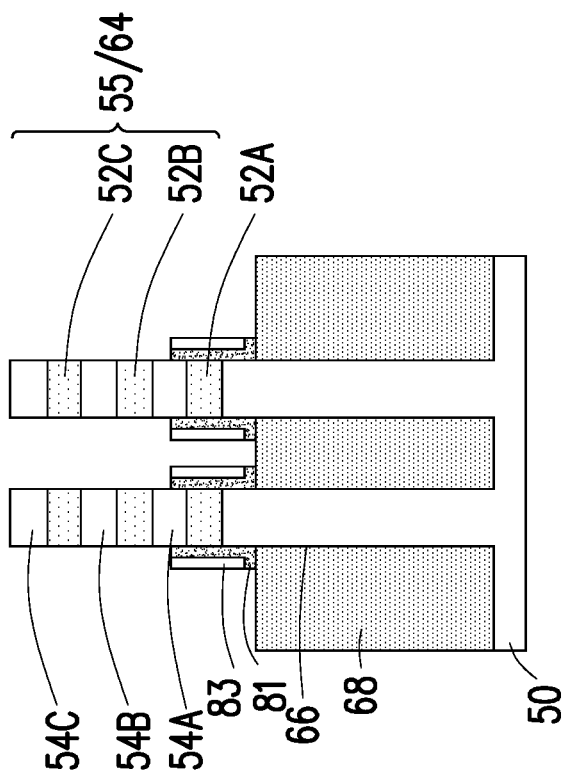
Figure 11A:
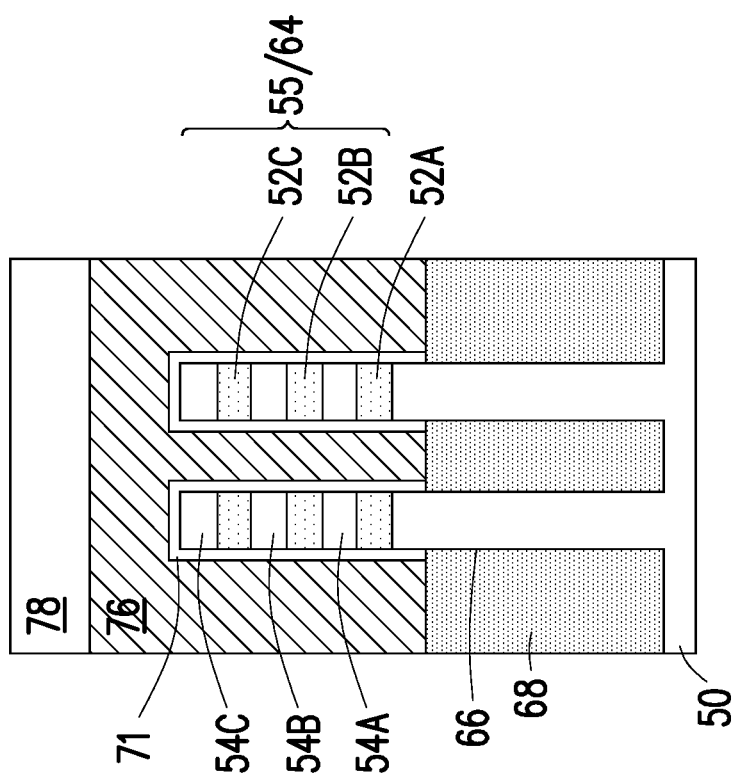
Figure 11C:
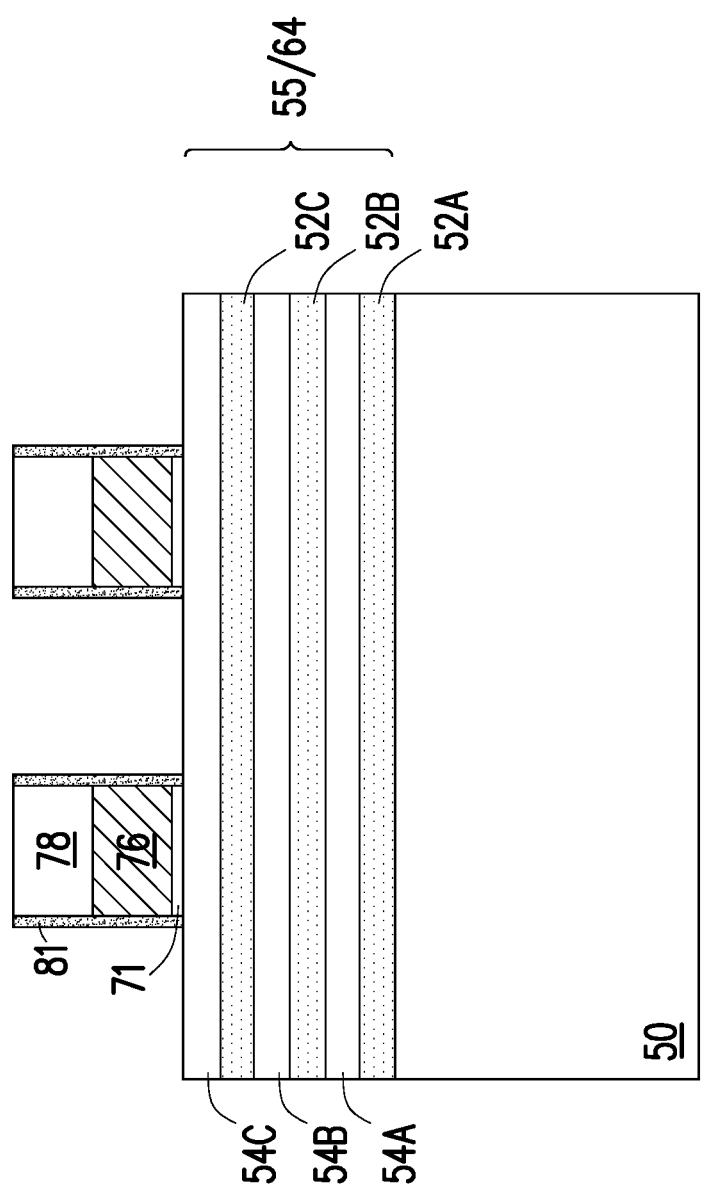

In FIGS. 11A through 11C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 11B. Thereafter, the second spacers 83 acts as a mask while etching exposed portions of the first spacer layer 80, thereby forming first spacers 81 as illustrated in FIGS. 11B and 11C.

As illustrated in FIG. 11B, the first spacers 81 and the second spacers 83 are disposed on sidewalls of the fins 66 and/or nanostructures 55. As illustrated in FIG. 11C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 12C:
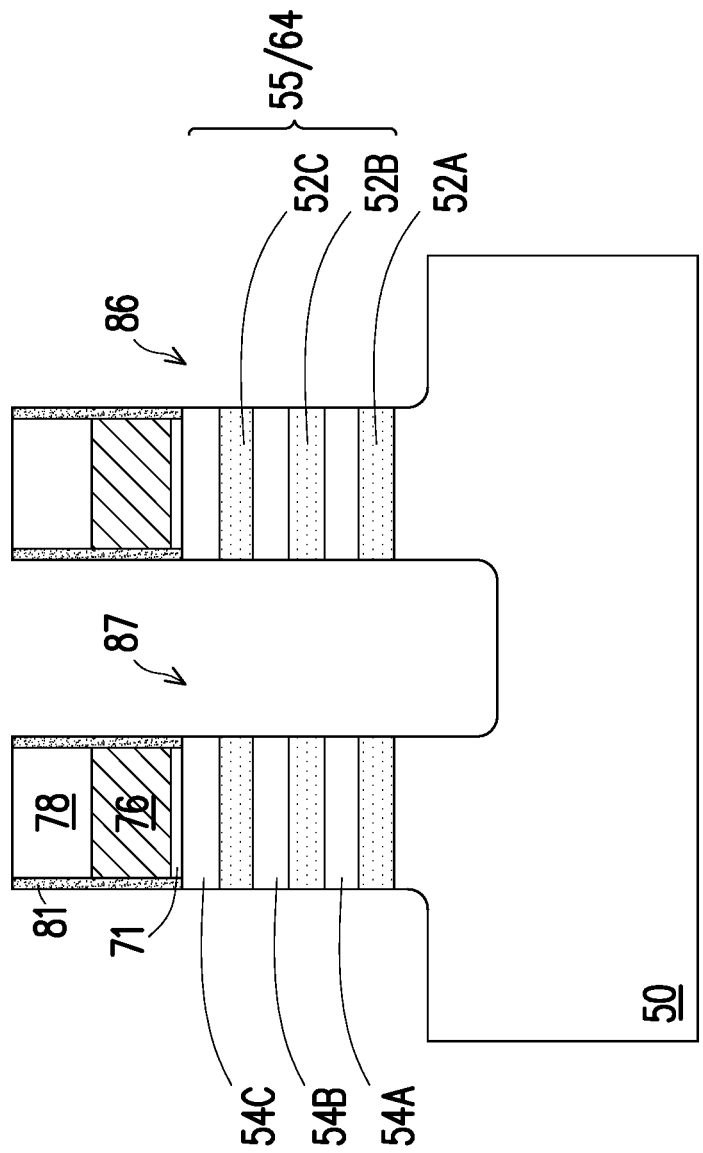

In FIGS. 12A through 12C, first recesses 86 and second recesses 87 are formed in the fins 66, the nanostructures 55, and the substrate 50, in accordance with some embodiments. Epitaxial source/drain regions will be subsequently formed in the first recesses 86 and first epitaxial materials and epitaxial source/drain regions will be subsequently formed in the second recesses 87. The first recesses 86 and the second recesses 87 may extend through the first nanostructures 52 and the second nanostructures 54, and into the substrate 50. As illustrated in FIG. 12B, top surfaces of the STI regions 68 may be level with bottom surfaces of the first recesses 86. In various embodiments, the fins 66 may be etched such that bottom surfaces of the first recesses 86 are disposed below the top surfaces of the STI regions 68 or the like. Bottom surfaces of the second recesses 87 may be disposed below the bottom surfaces of the first recesses 86 and the top surfaces of the STI regions 68. The first recesses 86 and the second recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86 and the second recesses 87. A single etch process or multiple etch processes may be used to etch each layer of the nanostructures 55 and/or the fins 66. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 13B:
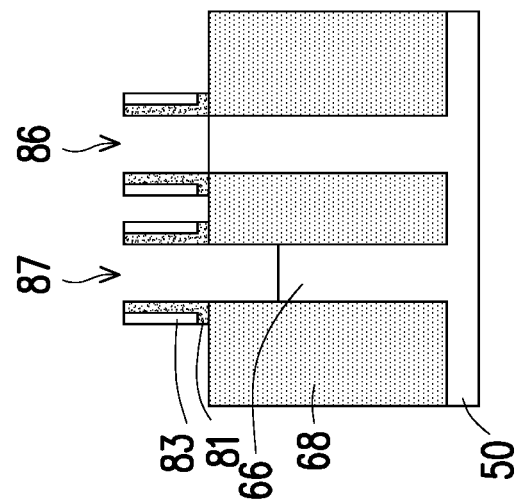
Figure 13A:
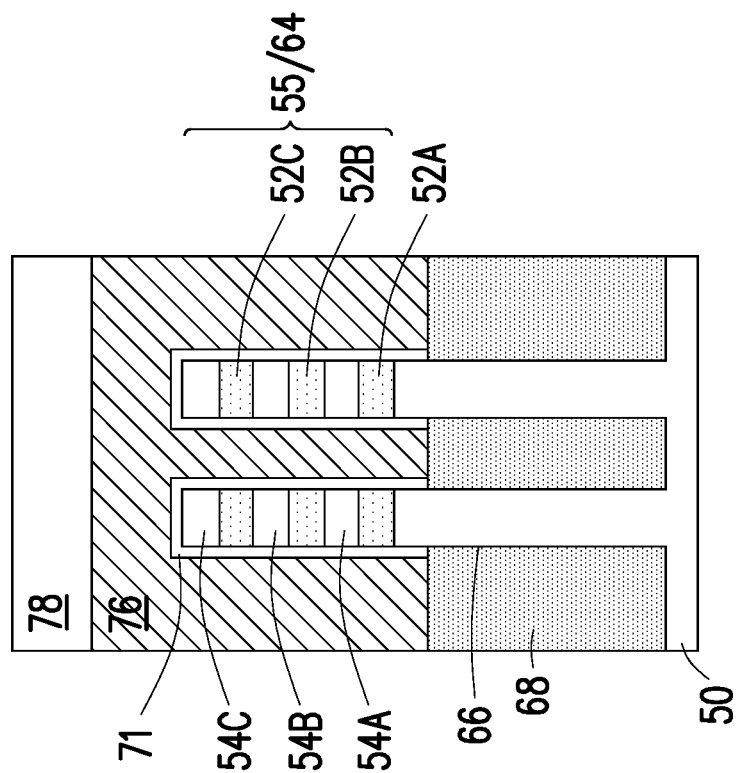
Figure 13C:
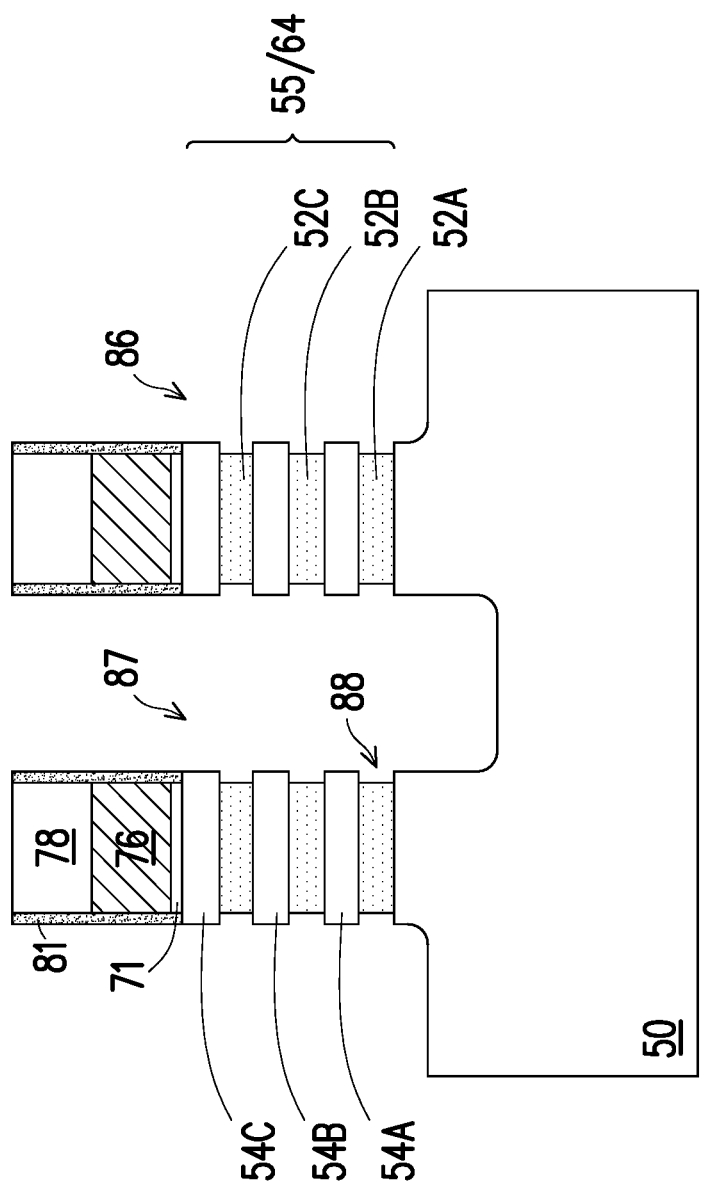

In FIGS. 13A through 13C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 13C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52.

In FIGS. 14A through 14D, first inner spacers 90 are formed in the sidewall recess 88. The first inner spacers 90 may be formed by depositing an inner spacer layer (not separately illustrated) over the structures illustrated in FIGS. 13A through 13C. The first inner spacers 90 act as isolation features between subsequently formed source/drain regions and a gate structure. As will be discussed in greater detail below, source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 14B:
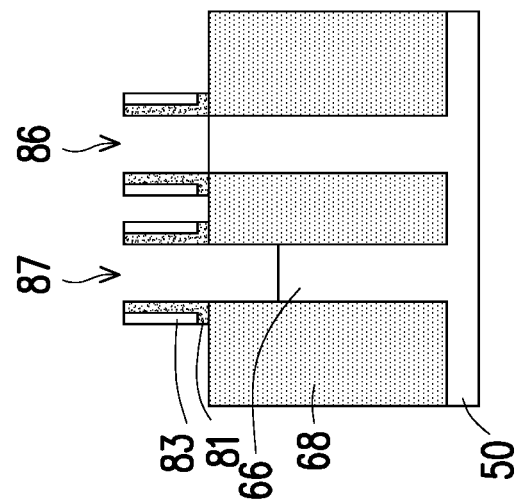
Figure 14A:
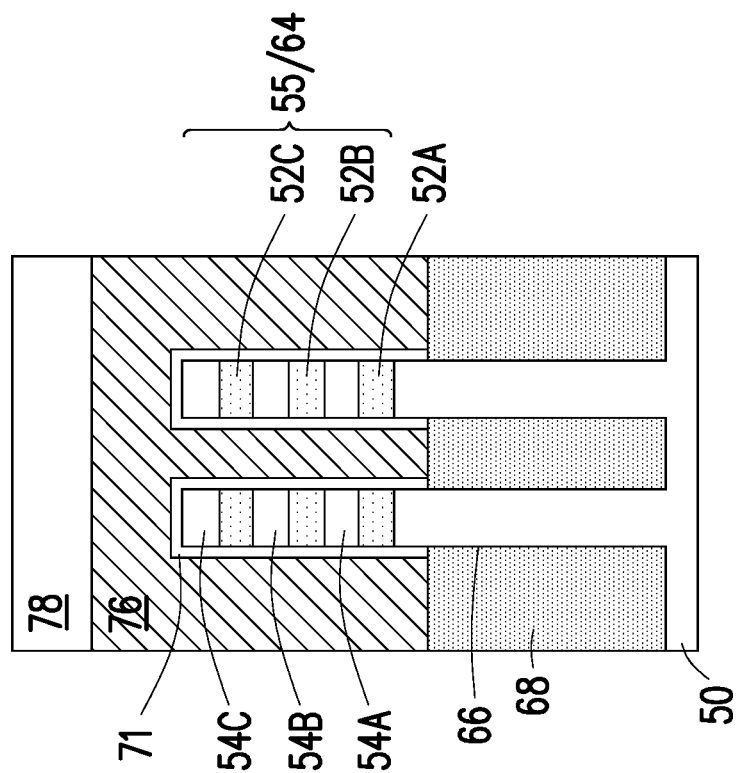
Figure 14D:
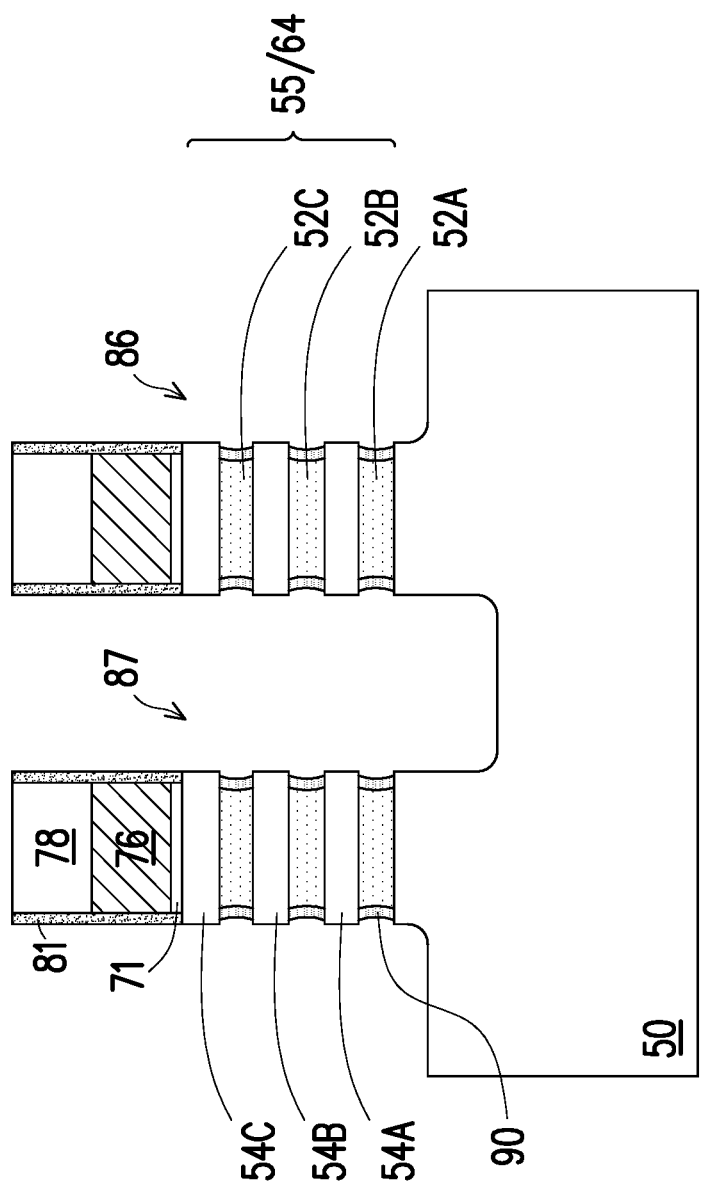

Moreover, although the outer sidewalls of the first inner spacers 90 are illustrated as being straight in FIG. 14C, the outer sidewalls of the first inner spacers 90 may be concave or convex. As an example, FIG. 14D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

In FIGS. 15A through 15E, first epitaxial materials 91 are formed in the second recesses 87 and epitaxial source/drain regions 92 are formed in the first recesses 86 and the second recesses 87. In some embodiments, the first epitaxial materials 91 may be sacrificial materials, which are subsequently removed to form backside vias (such as the backside vias 130, discussed below with respect to FIGS. 32A through 32C). As illustrated in FIGS. 15B through 15E, top surfaces of the first epitaxial materials 91 may be level with bottom surfaces of the first recesses 86. However, in some embodiments, top surfaces of the first epitaxial materials 91 may be disposed above or below bottom surfaces of the first recesses 86. The first epitaxial materials 91 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial materials 91 may include any acceptable material, such as silicon germanium or the like. The first epitaxial materials 91 may be formed of materials having high etch selectivity to materials of the epitaxial source/drain regions 92, the substrate 50, and dielectric layers (such as the STI regions 68 and second dielectric layers 125, discussed below with respect to FIGS. 24A through 24C). As such, the first epitaxial materials 91 may be removed and replaced with the backside vias without significantly removing the epitaxial source/drain regions 92 and the dielectric layers.

The epitaxial source/drain regions 92 are then formed in the first recesses 86 and over the first epitaxial materials 91 in the second recesses 87. In some embodiments, the epitaxial source/drain regions 92 may exert stress on the second nanostructures 54, thereby improving performance. As illustrated in FIG. 15C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 15B:
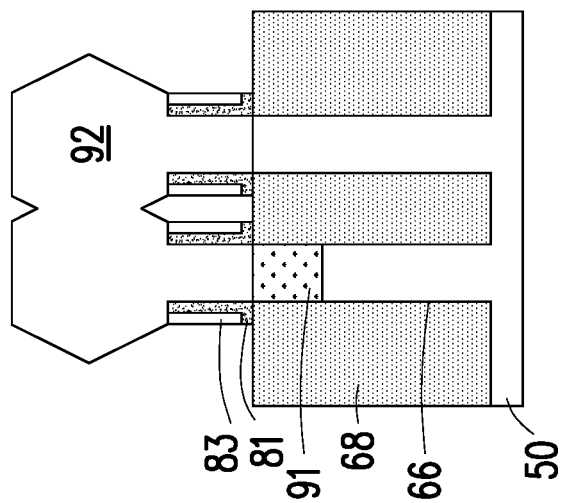

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 15B. In other embodiments, adjacent epitaxial source/drain regions 92 remain separated after the epitaxy process is completed as illustrated by FIG. 15D. In the embodiments illustrated in FIGS. 15B and 15D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 15A:
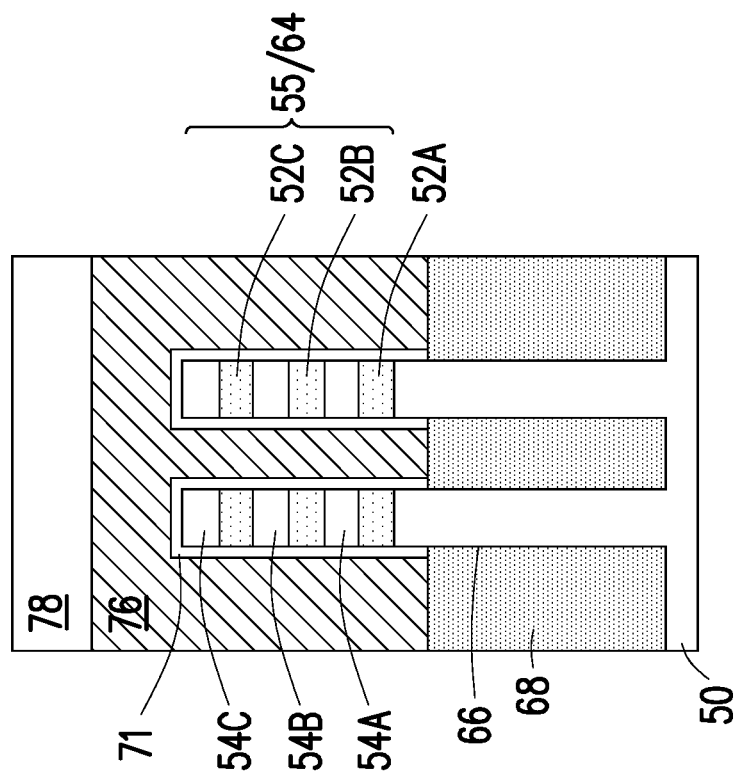
Figure 15E:
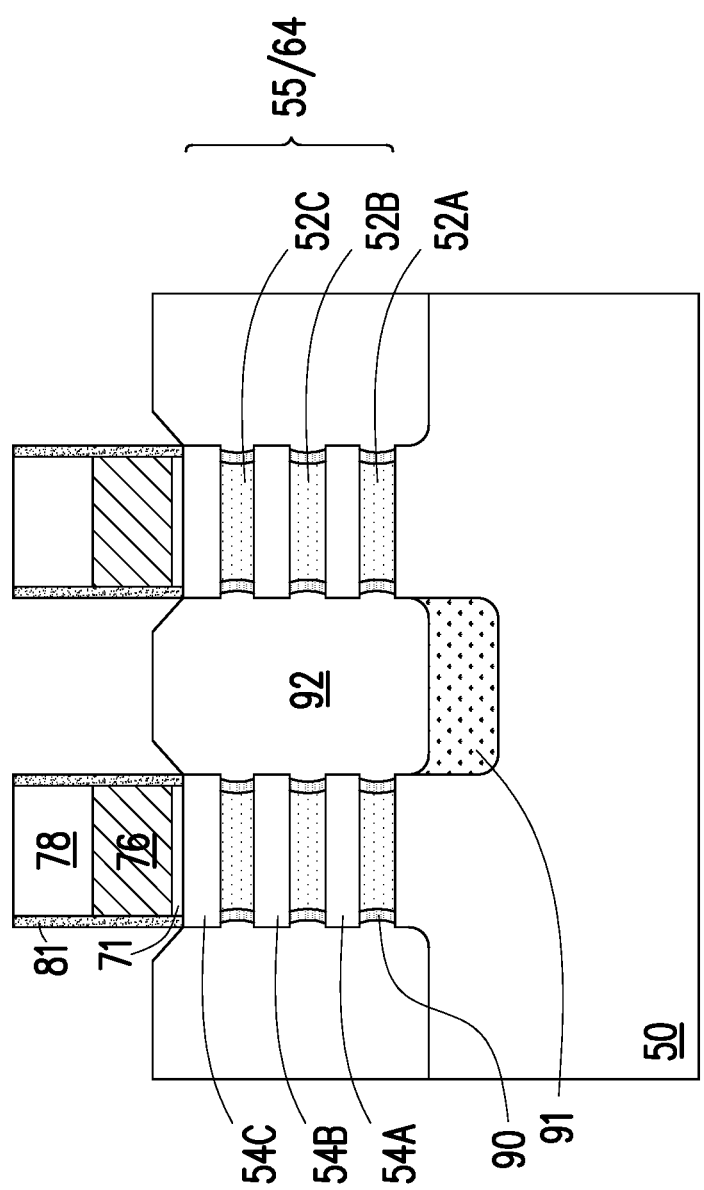

FIG. 15E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 15E, the epitaxial source/drain regions 92 may be formed in contact with the first inner spacers 90 and may extend past sidewalls of the second nanostructures 54.

Figure 16B:
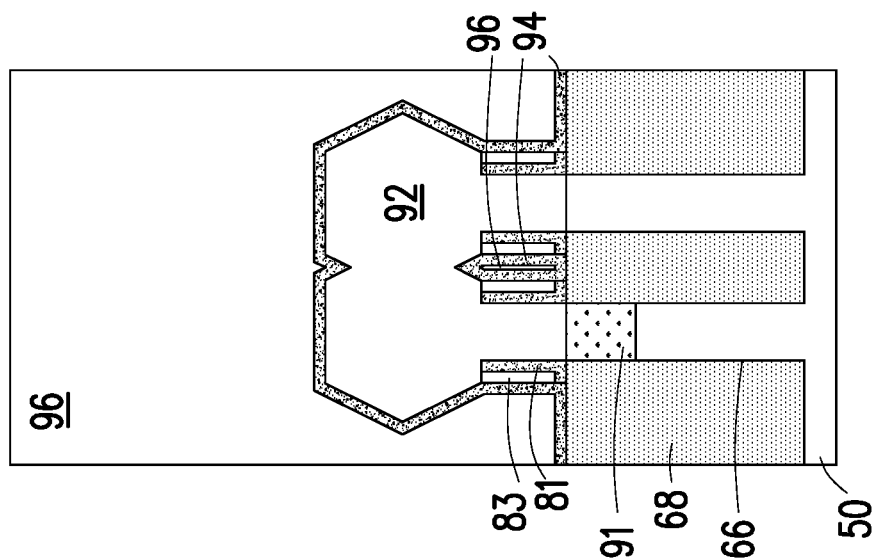
Figure 16A:
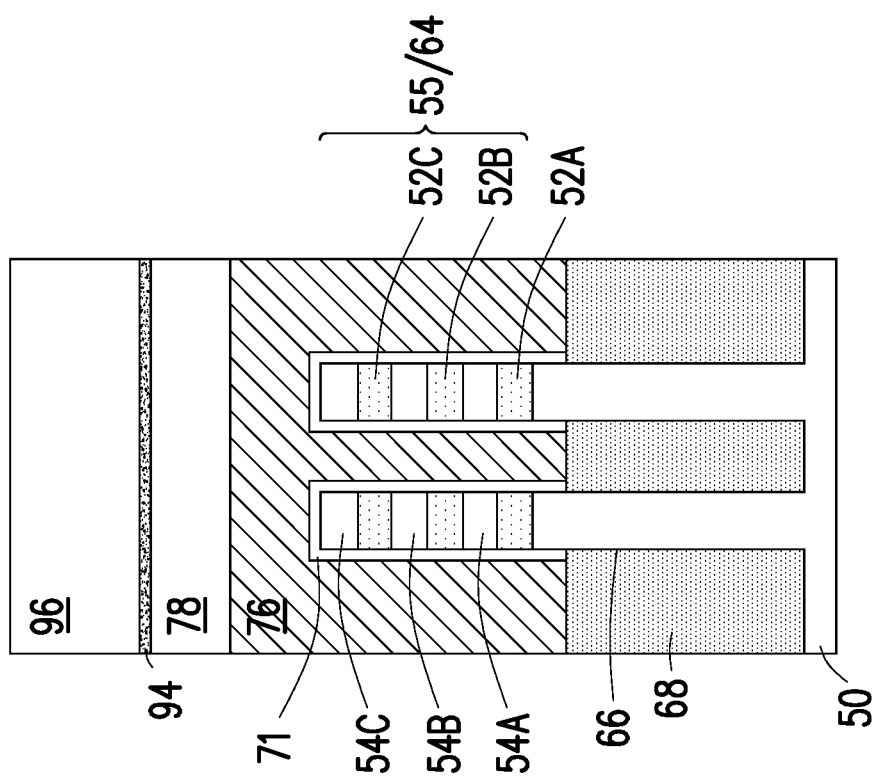
Figure 16C:
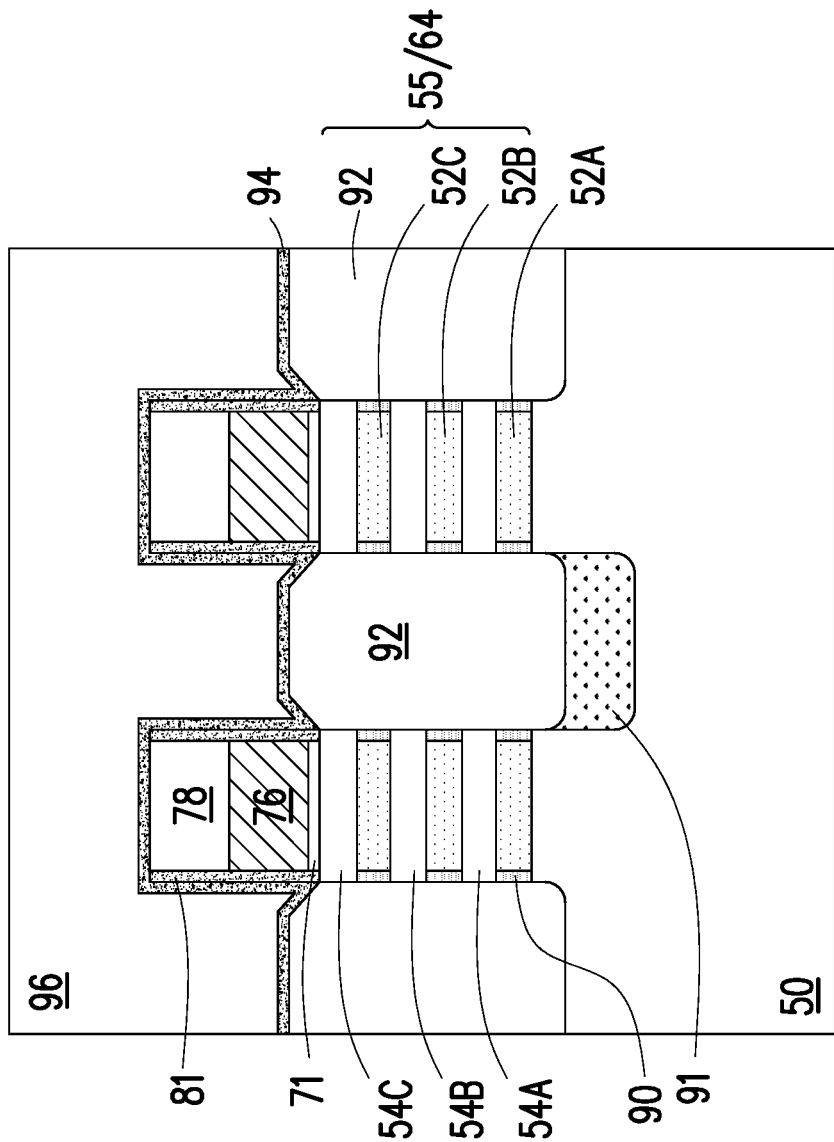

In FIGS. 16A through 16C, a first interlayer dielectric (ILD) 96 is deposited over the structure illustrated in FIGS. 15A through 15C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 17A:
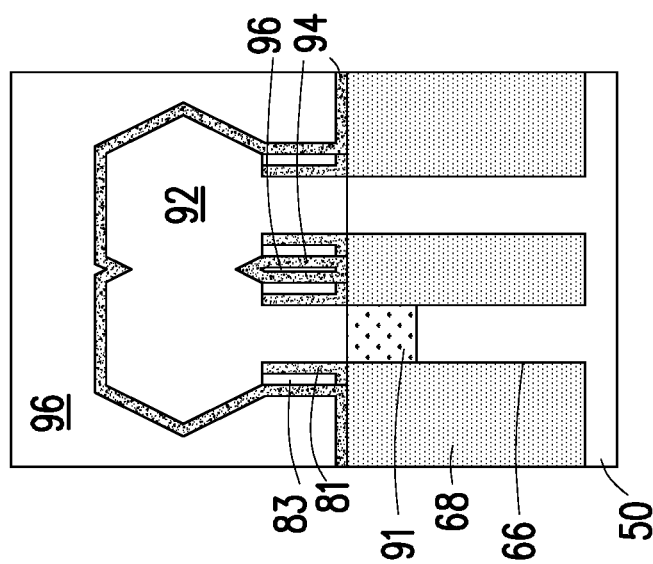
Figure 17B:
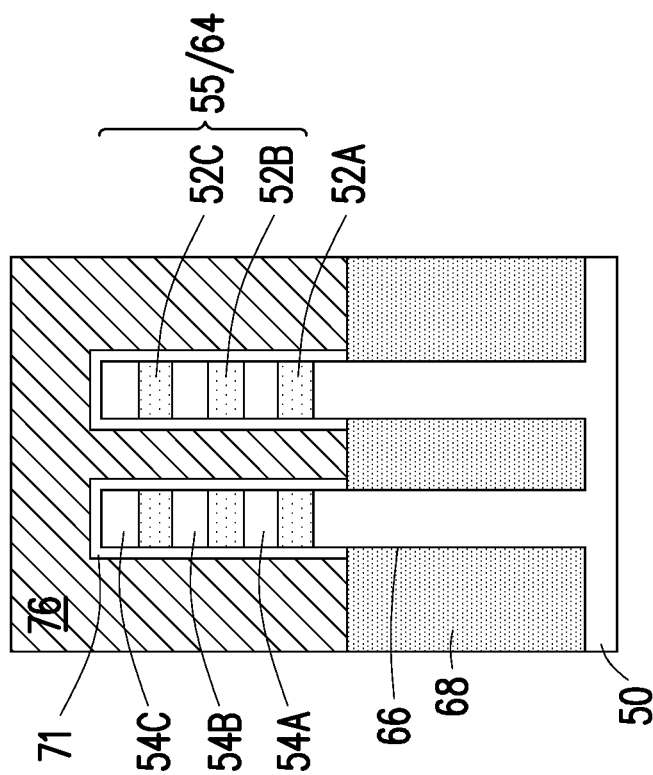
Figure 17C:
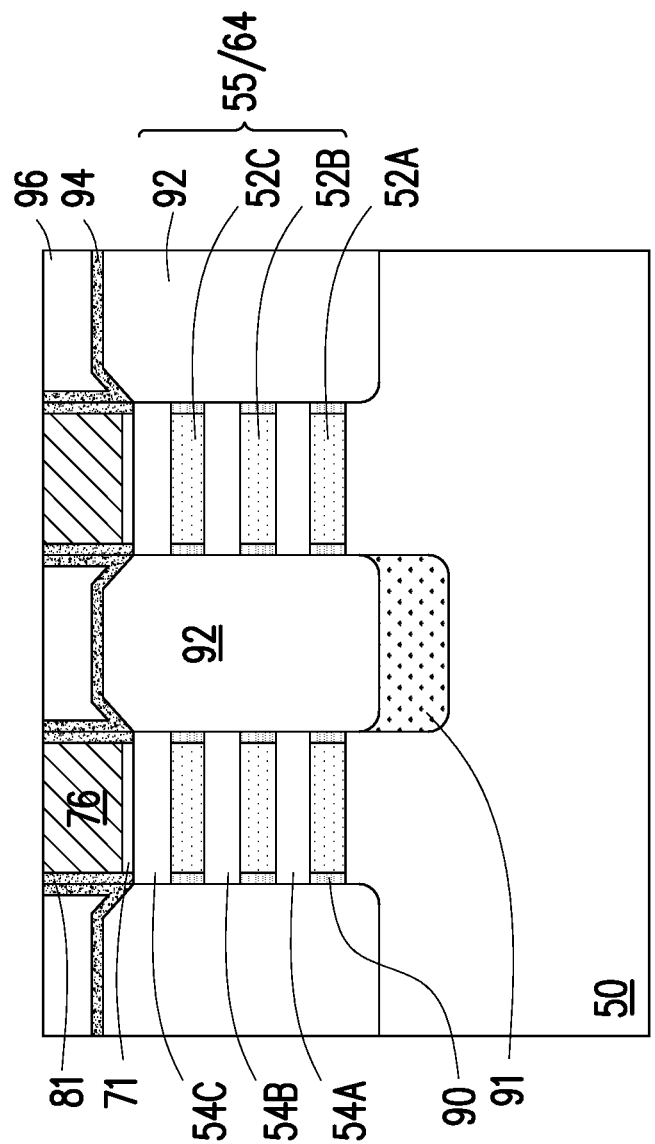

In FIGS. 17A through 17C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 18B:
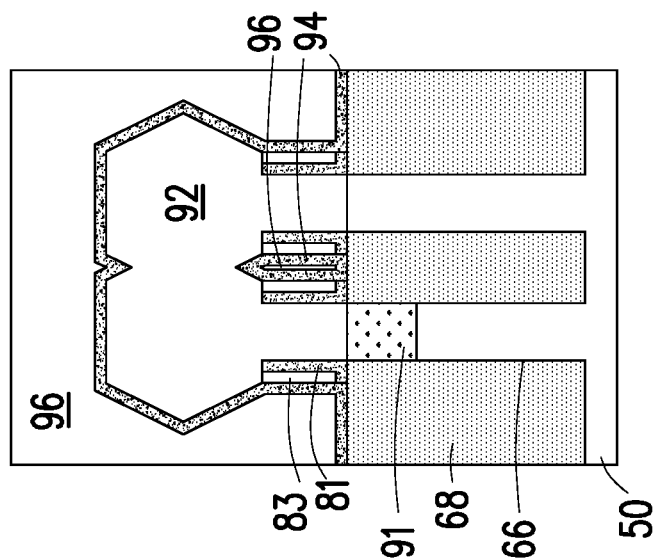
Figure 18A:
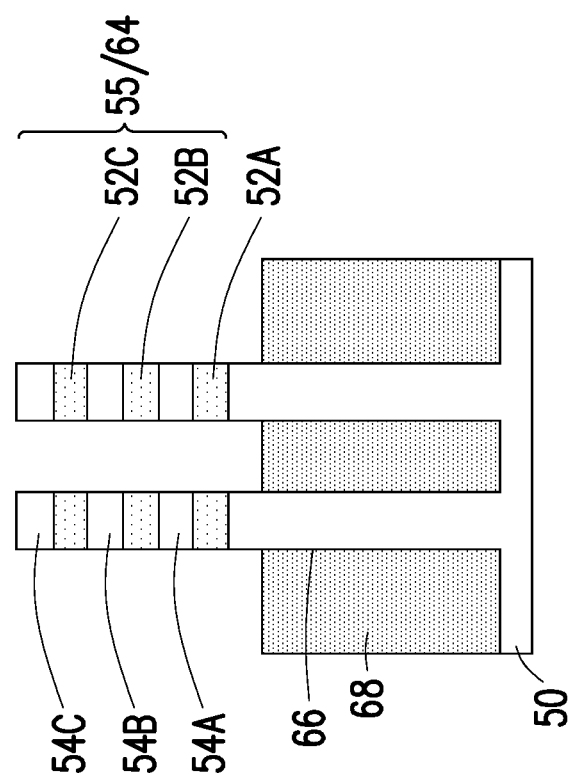
Figure 18C:
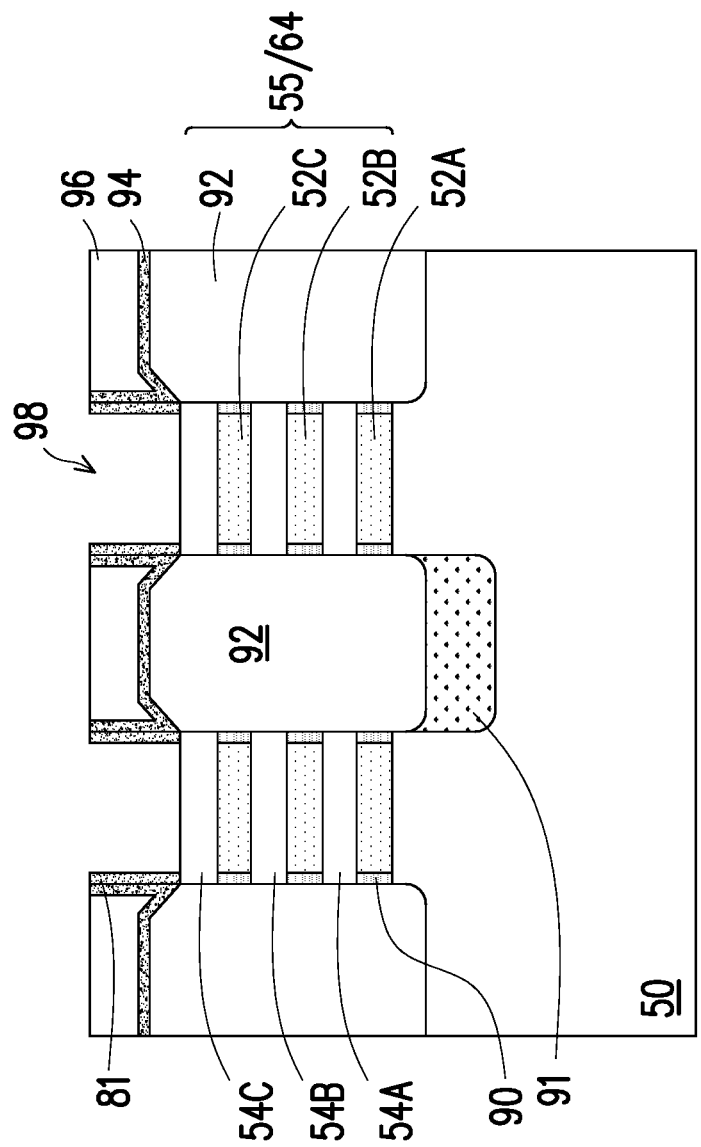

In FIGS. 18A through 18C, the dummy gates 76, and the masks 78 if present, are removed in one or more etching steps, so that third recesses 98 are formed. Portions of the dummy gate dielectrics 60 in the third recesses 98 are also be removed. In some embodiments, the dummy gates 76 and the dummy gate dielectrics 60 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nanoFETs. Portions of the nanostructures 55 which act as the channel regions are disposed between neighboring pairs of the epitaxial source/drain regions 92. During the removal, the dummy gate dielectrics 60 may be used as etch stop layers when the dummy gates 76 are etched. The dummy gate dielectrics 60 may then be removed after the removal of the dummy gates 76.

Figure 19B:
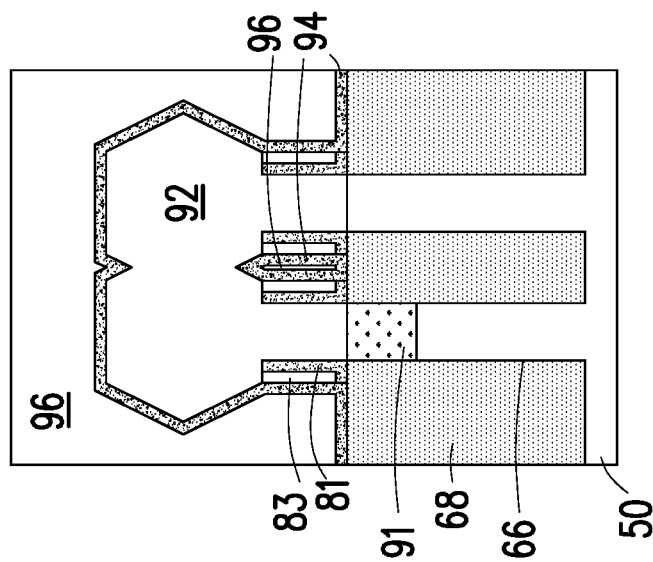
Figure 19A:
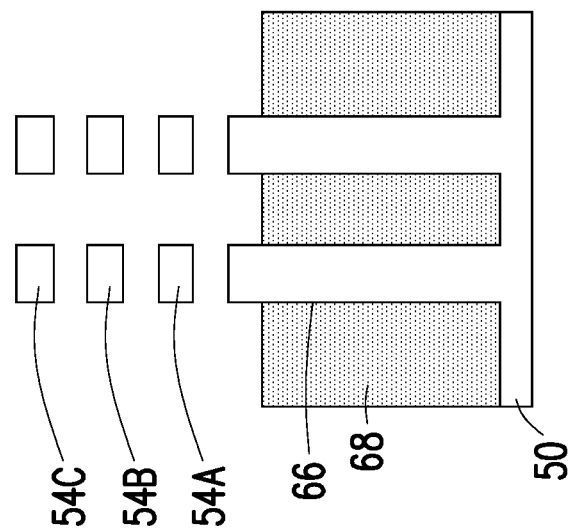
Figure 19C:
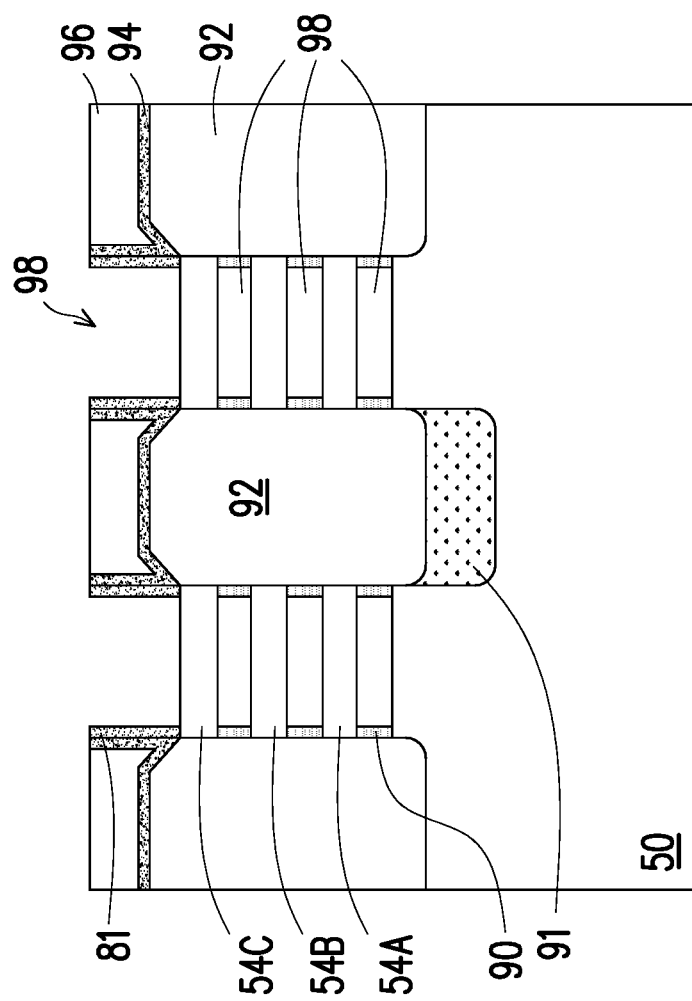

In FIGS. 19A through 19C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52.

Figure 20B:
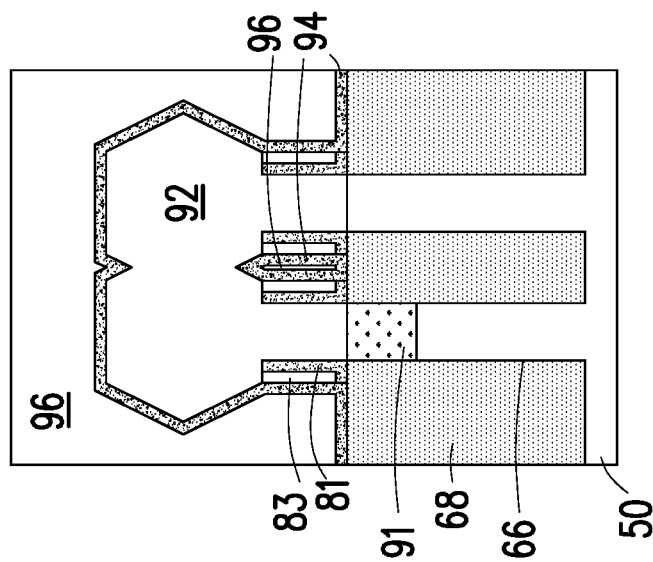
Figure 20A:
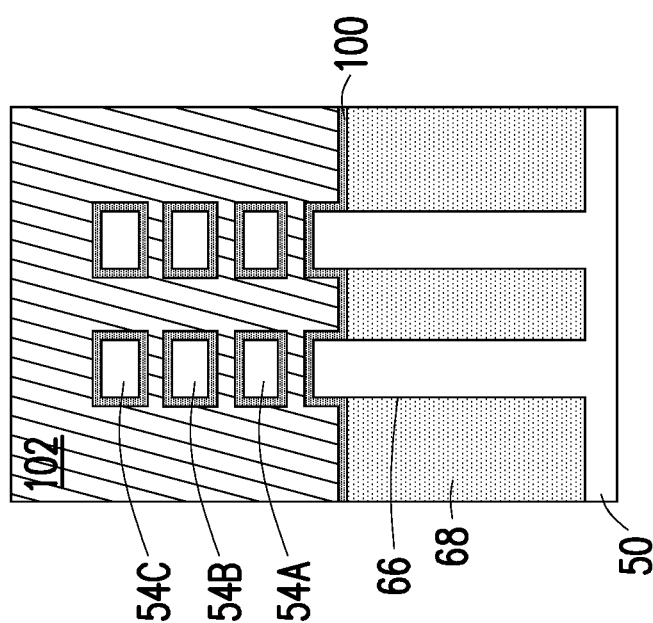
Figure 20C:
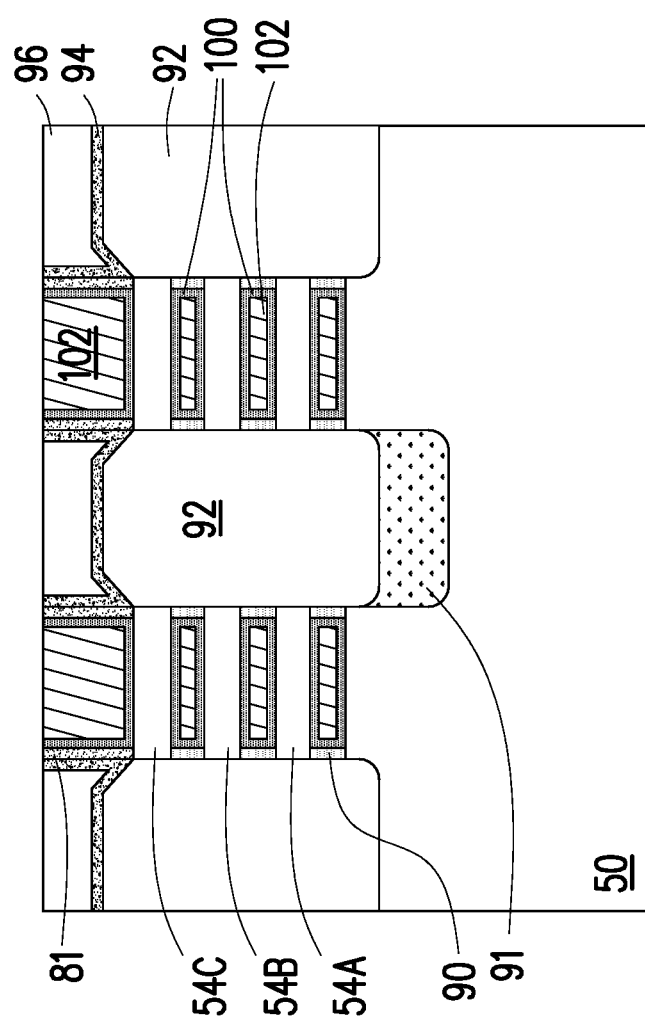

In FIGS. 20A through 20C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 21B:
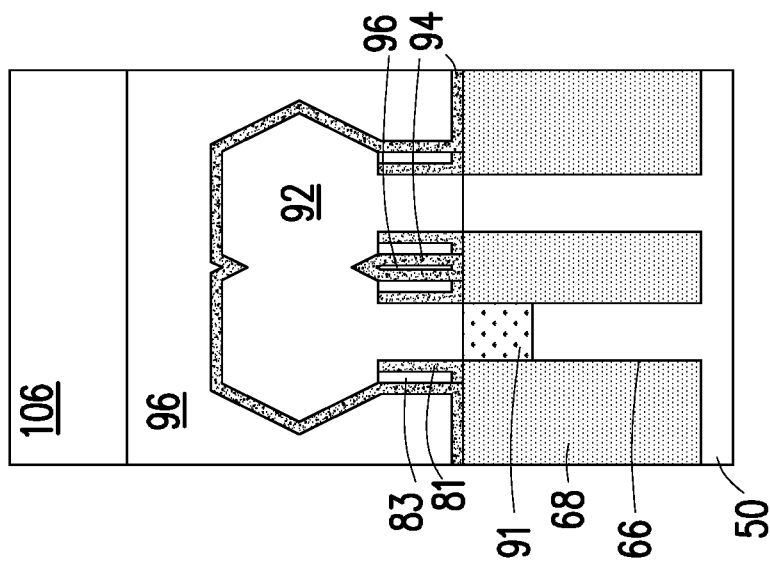
Figure 21A:
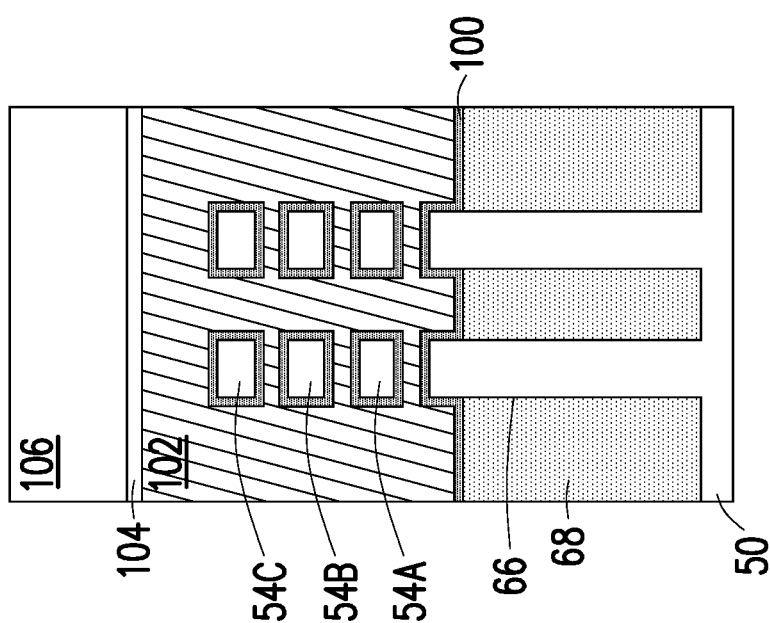
Figure 21C:
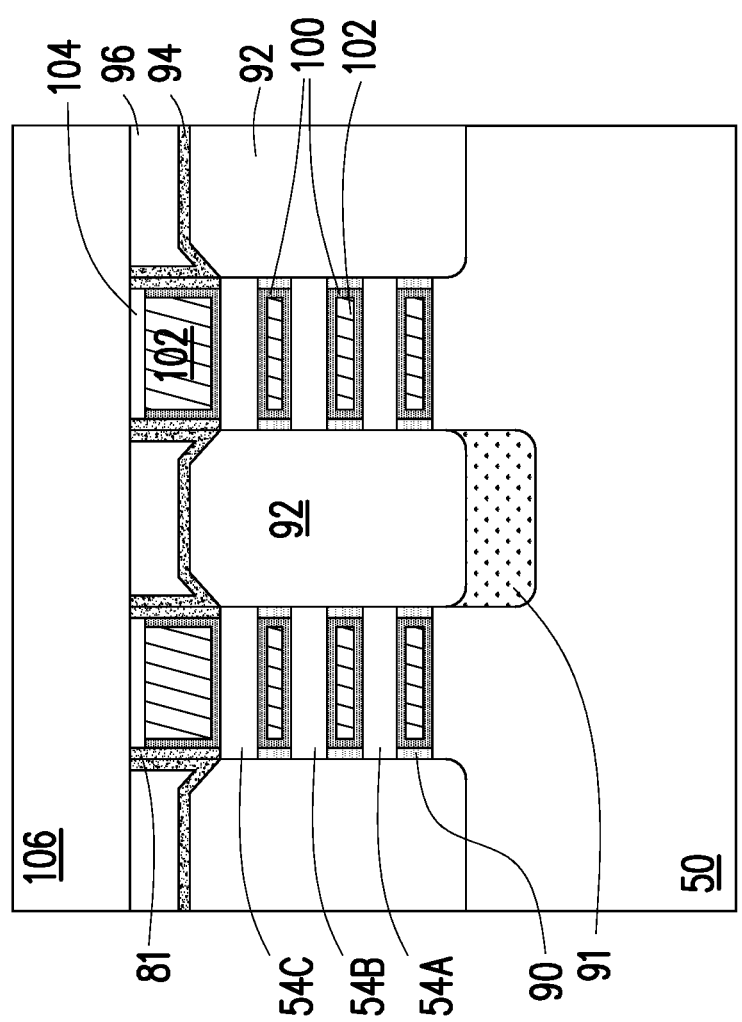

In FIGS. 21A through 21C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS.

20A through 20C) penetrate through the gate masks 104 to contact the top surfaces of the recessed gate electrodes 102.

As further illustrated by FIGS. 21A through 21C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 22B:
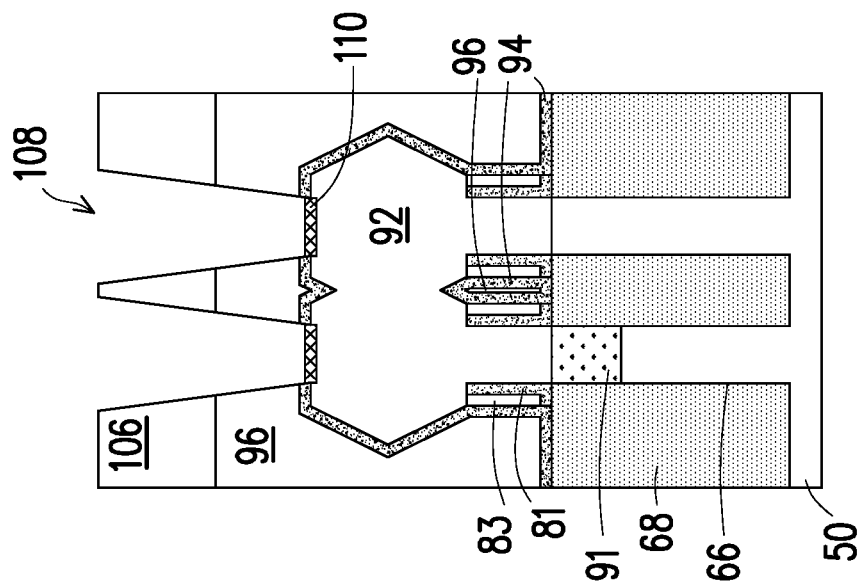
Figure 22A:
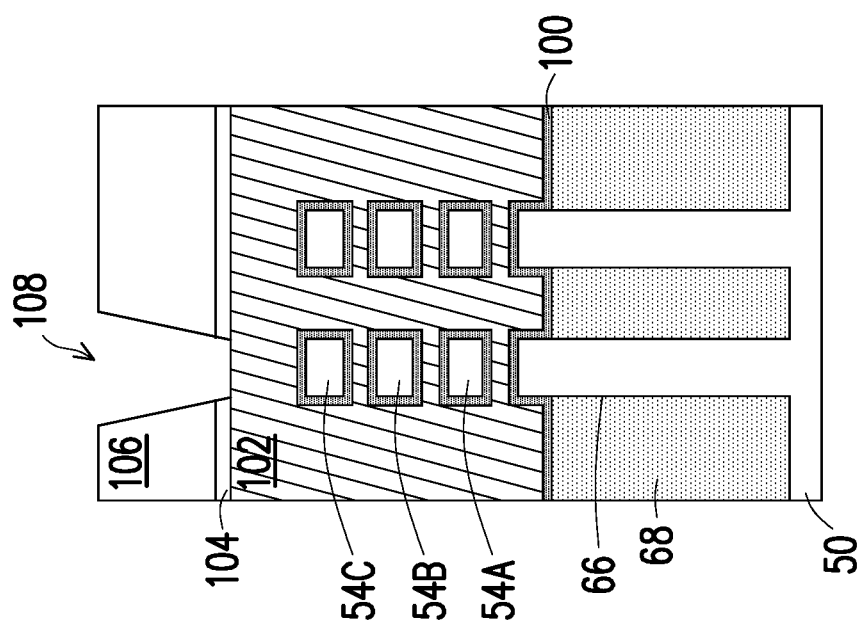
Figure 22C:
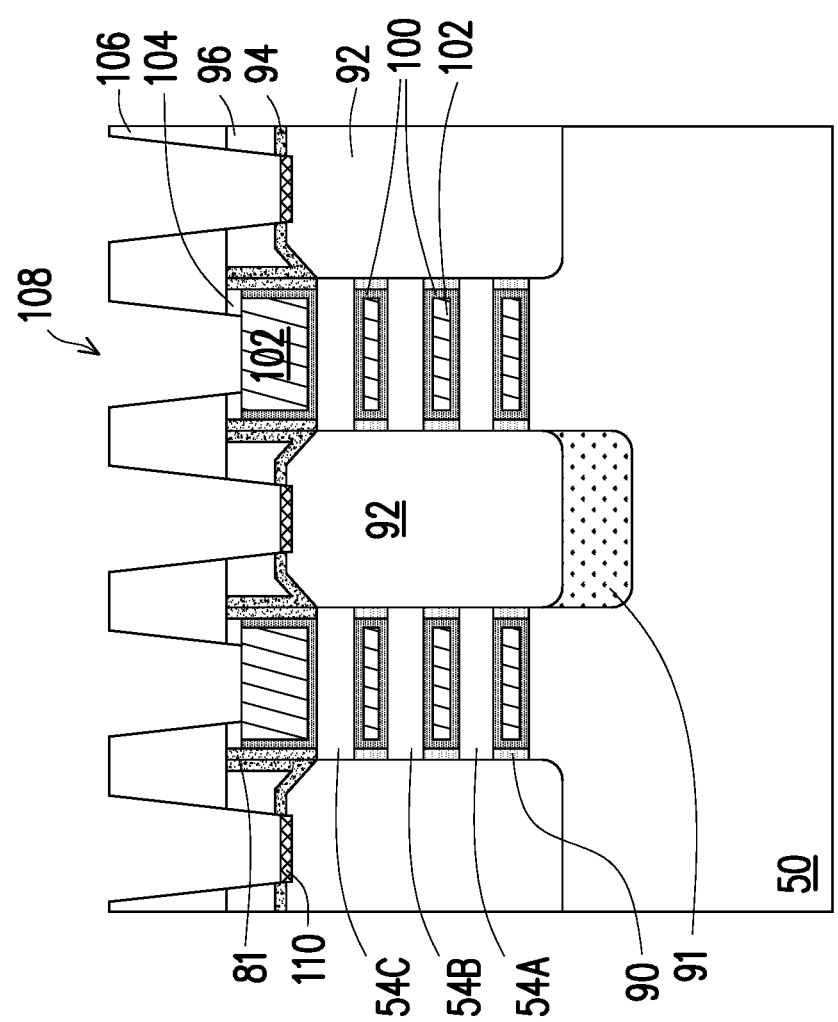

In FIGS. 22A through 22C, the second ILD 106, the first ILD 96, the CESL 94, and the gate masks 104 are etched to form fourth recesses 108 exposing surfaces of the epitaxial source/drain regions 92 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 92 and/or the gate structures, and a bottom of the fourth recesses 108 may be level with (e.g., at a same level, or having a same distance from the substrate 50), or lower than (e.g., closer to the substrate 50) the epitaxial source/drain regions 92 and/or the gate structures. Although FIG. 22C illustrates the fourth recesses 108 as exposing the epitaxial source/drain regions 92 and the gate structures in a same cross-section, in various embodiments, the epitaxial source/drain regions 92 and the gate structures may be exposed in different cross-sections, thereby reducing the risk of shorting subsequently formed contacts.

After the fourth recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi and have a thickness in a range between about 2 nm and about 10 nm.

Figure 23C:
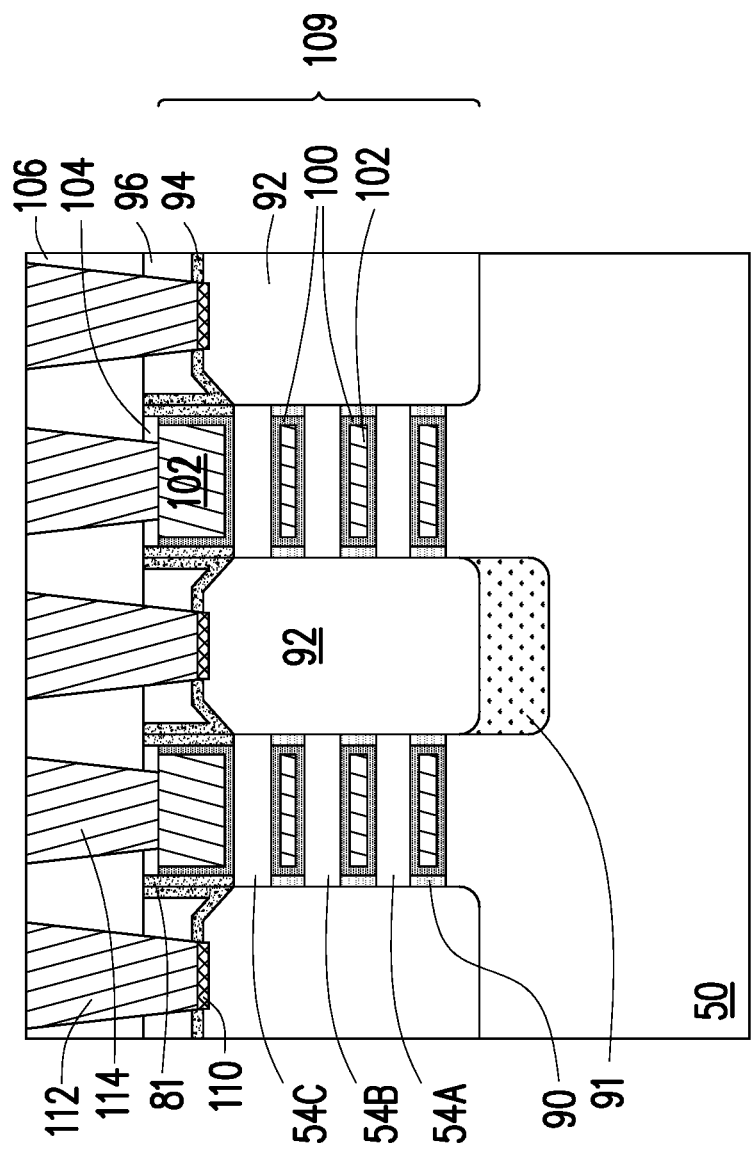

In FIGS. 23A through 23C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the second nanostructures 54, and the gate structures (including the gate dielectric layers 100 and the gate electrodes 102) may collectively be referred to as transistor structures 109. The transistor structures 109 may be formed in a device layer, with a first interconnect structure (such as the front-side interconnect structure 120, discussed below with respect to FIGS. 24A through 24C) being formed over a front-side thereof and a second interconnect structure (such as the backside interconnect structure 136, discussed below with respect to FIGS. 34A through 34C) being formed over a backside thereof. Although the device layer is described as having nano-FETs, other embodiments may include a device layer having different types of transistors (e.g., planar FETs, finFETs, thin film transistors (TFTs), or the like).

Although FIGS. 23A through 23C illustrate a source/drain contact 112 extending to each of the epitaxial source/drain regions 92, the source/drain contacts 112 may be omitted from certain ones of the epitaxial source/drain regions 92. For example, as explained in greater detail below, conductive features (e.g., backside vias or power rails) may be subsequently attached through a backside of one or more of the epitaxial source/drain regions 92. For these particular epitaxial source/drain regions 92, the source/drain contacts 112 may be omitted or may be dummy contacts that are not electrically connected to any overlying conductive lines (such as the first conductive features 122, discussed below with respect to FIGS. 24A through 24C).

FIGS. 24A through 34C illustrate intermediate steps of forming front-side interconnect structures and backside interconnect structures on the transistor structures 109. The front-side interconnect structures and the backside interconnect structures may each comprise conductive features that are electrically connected to the nano-FETs formed on the substrate 50. The process steps described in FIGS. 24A through 34C may be applied to both the n-type region 50N and the p-type region 50P. As noted above, a back-side conductive feature (e.g., a backside via or a power rail) may be connected to one or more of the epitaxial source/drain regions 92. As such, the source/drain contacts 112 may be optionally omitted from the epitaxial source/drain regions 92.

Figure 24B:
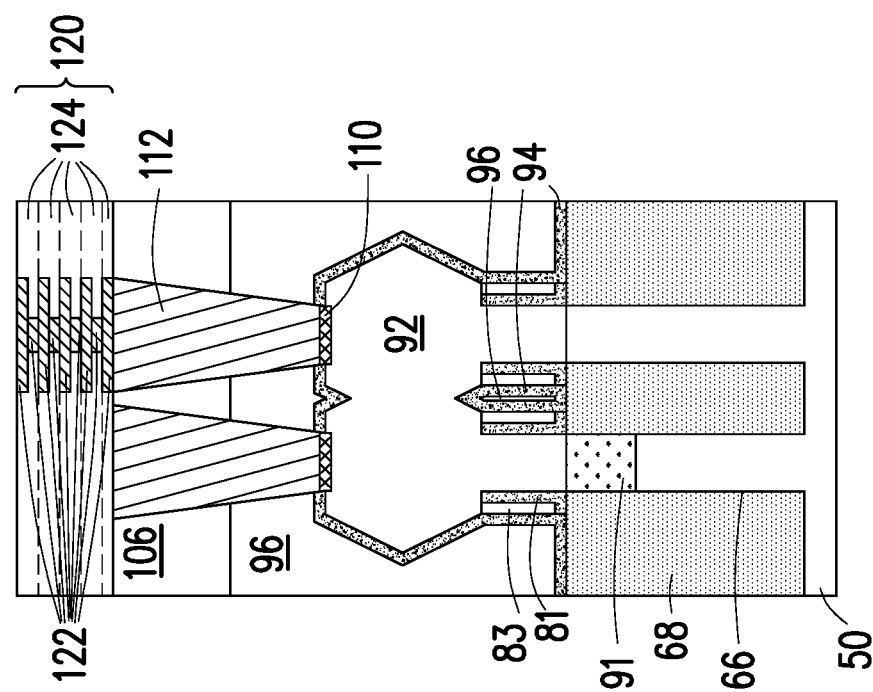
Figure 24A:
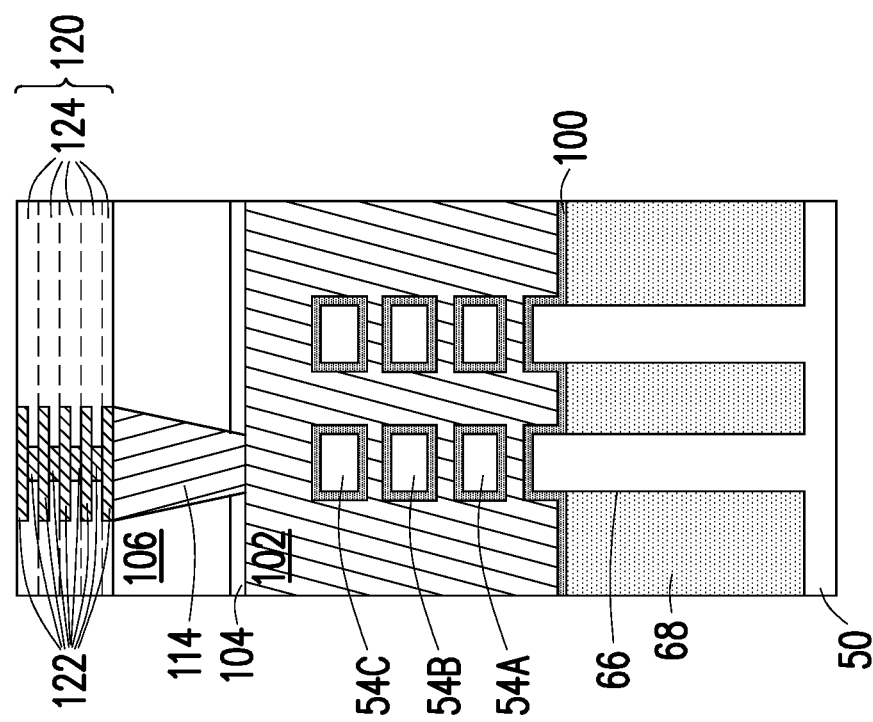
Figure 24C:
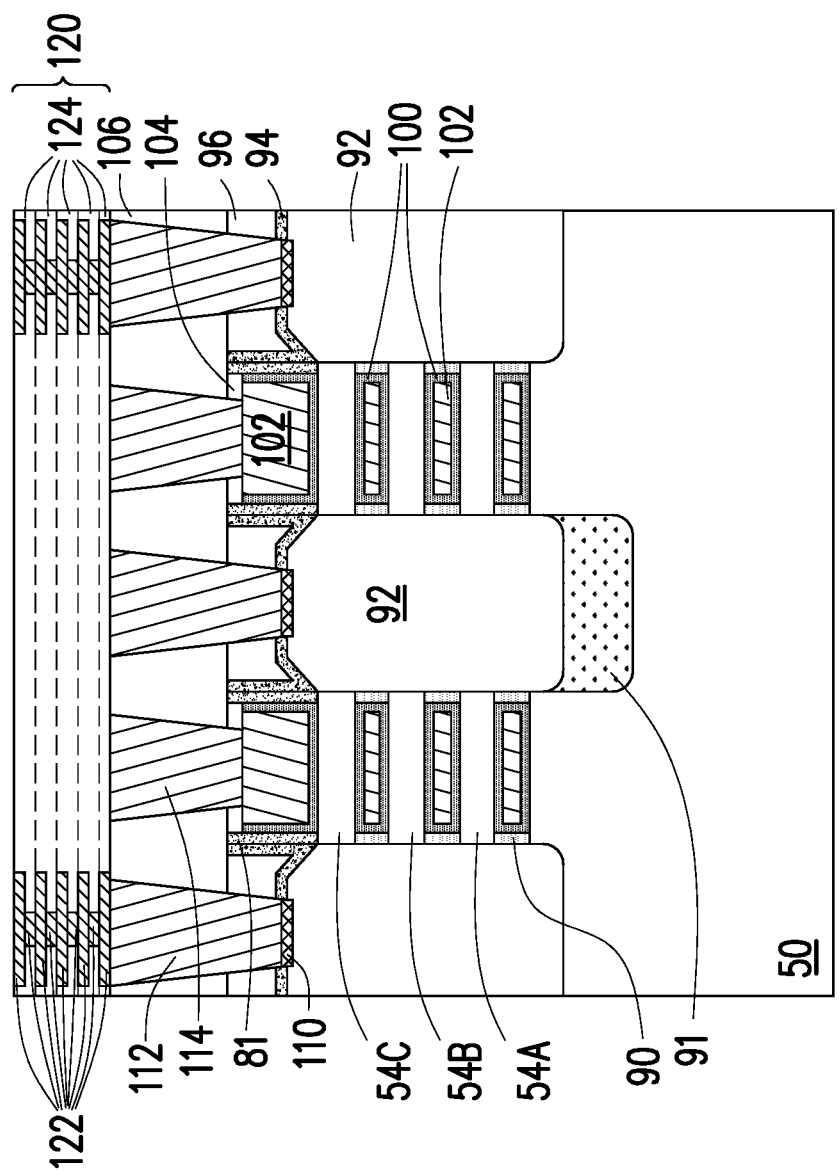

In FIGS. 24A through 24C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 24A through 24C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 25A:
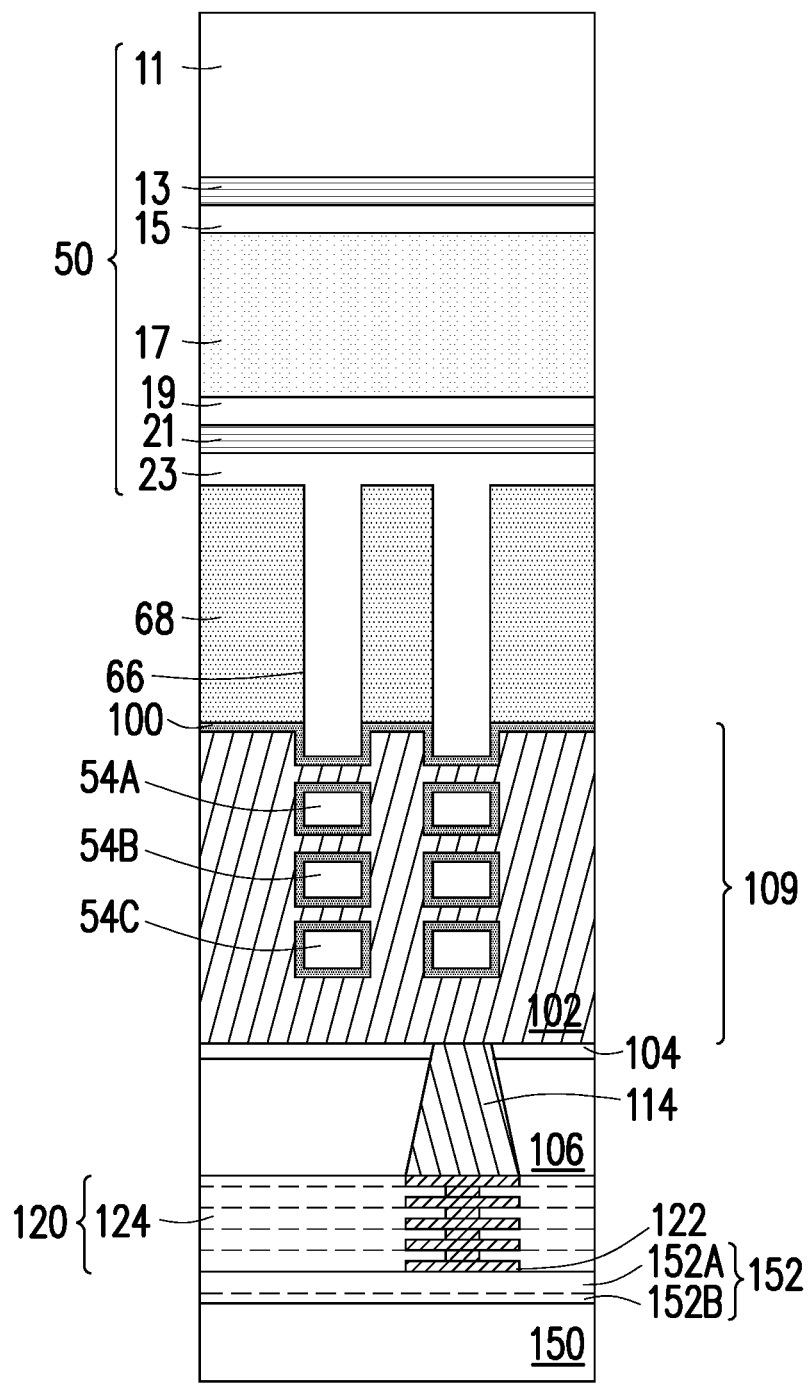
Figure 25B:
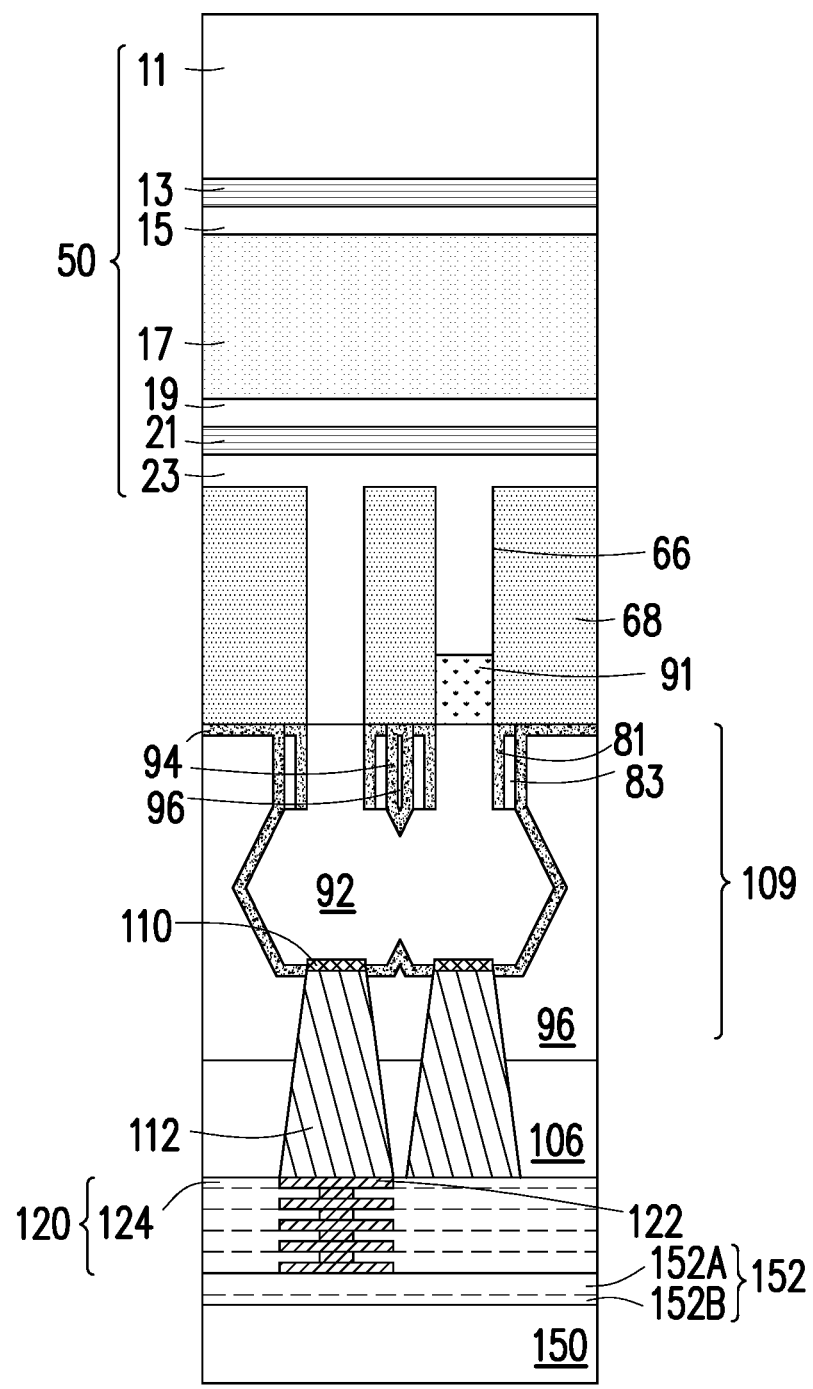
Figure 25C:
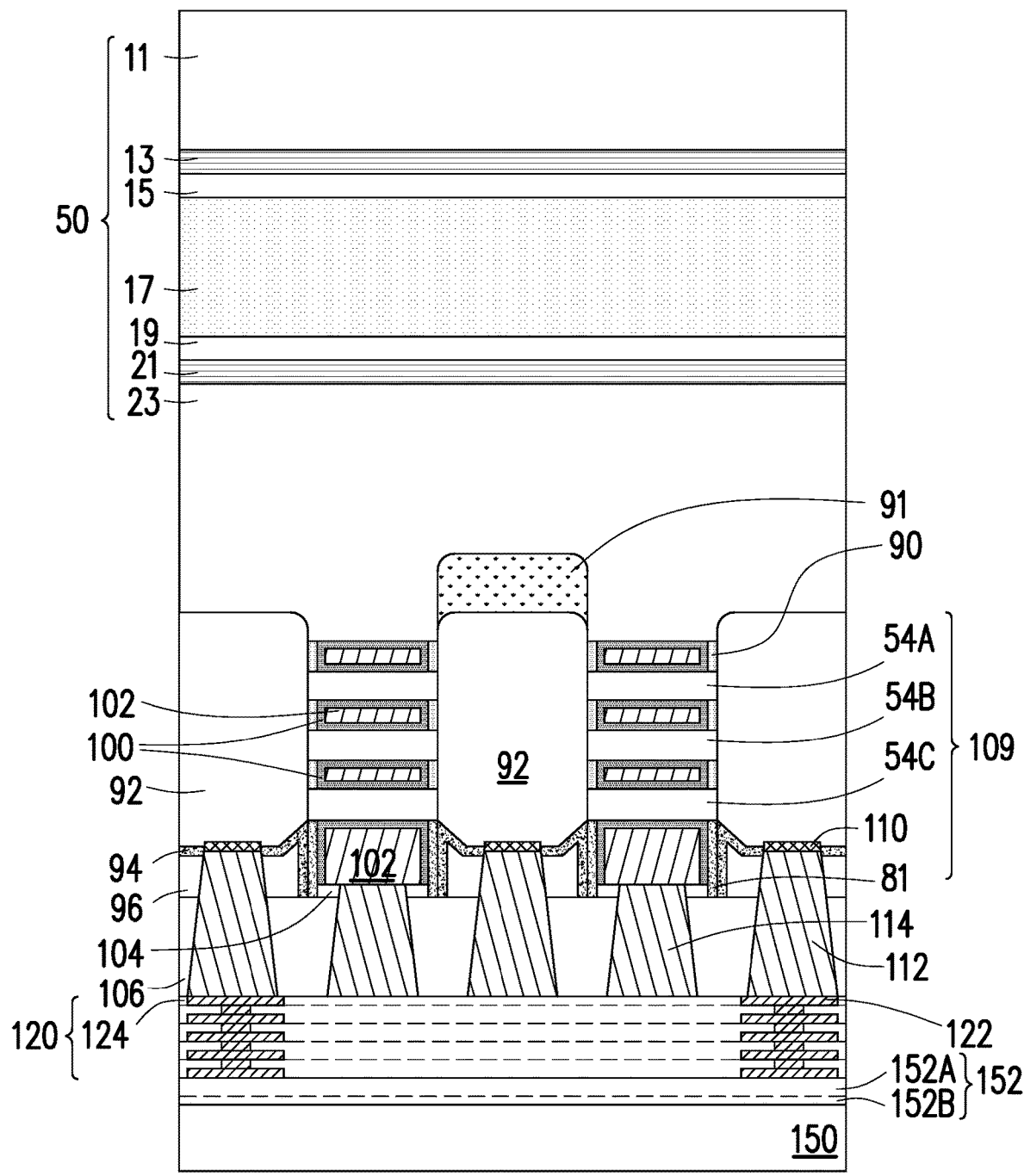

In FIGS. 25A through 25C, a carrier substrate 150 (may also be referred to as a carrier) is bonded to a top surface of the front-side interconnect structure 120 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In various embodiments, the carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high density plasma (HDP) oxide, or the like) that is deposited by CVD, ALD, PVD, or the like. The second bonding layer 152B may likewise be an oxide layer that is formed on a surface of the carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120.

Further in FIGS. 25A through 25C, after the carrier substrate 150 is bonded to the front-side interconnect structure 120, the device may be flipped such that a backside of the transistor structures 109 faces upwards. The backside of the transistor structures 109 may refer to a side opposite to the front-side of the transistor structures 109 on which the active devices are formed. Note that a detailed structure of the substrate 50, which is the same as the substrate 50B of FIG. 3, is illustrated in FIGS. 25A through 25C as a non-limiting example. One skilled in the art will readily appreciate that other embodiments of the substrate 50 (e.g., 50A, 50C) may also be used.

Figure 26C:
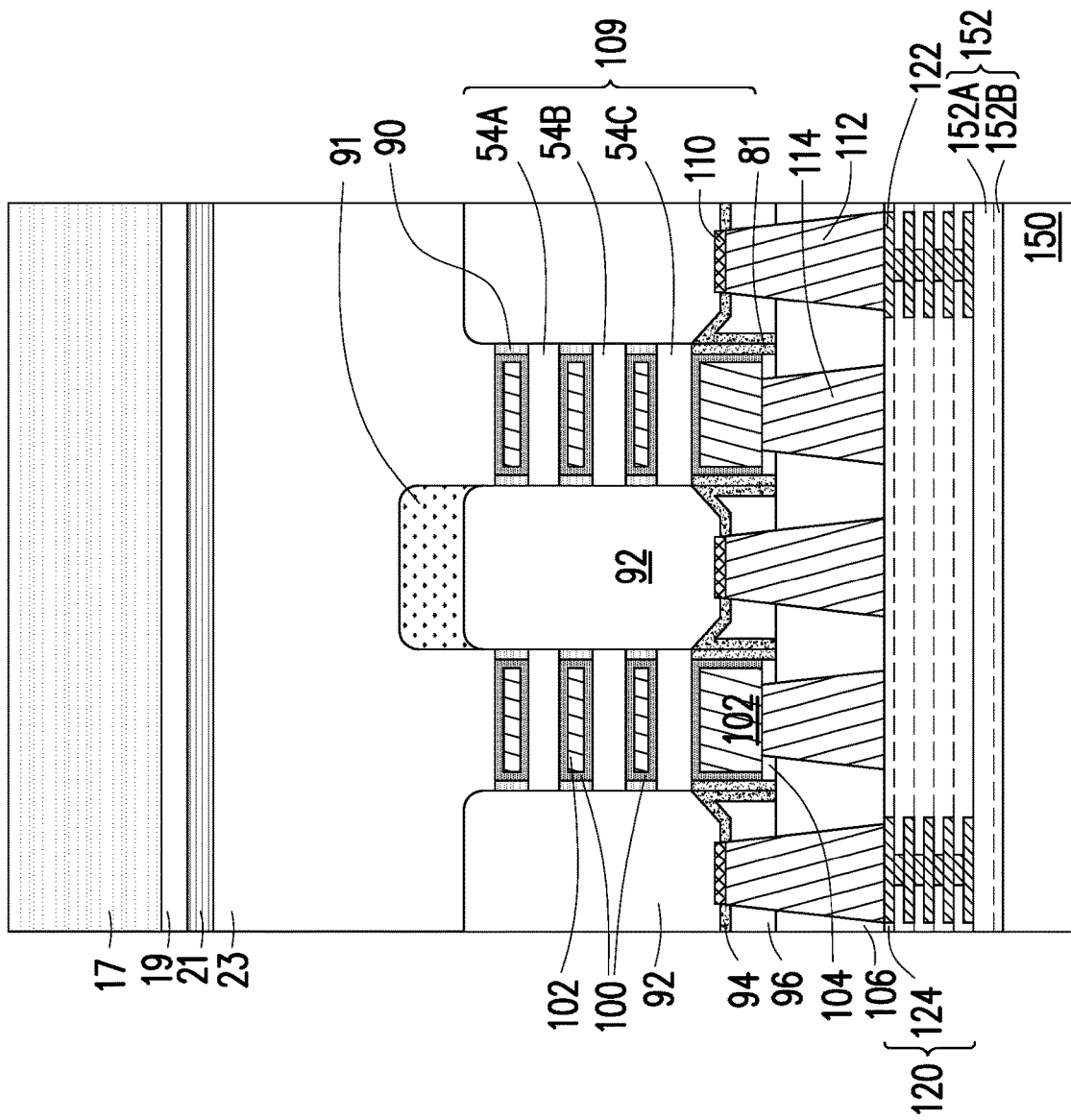

In FIGS. 26A through 26C, portions of the substrate 50 distal from the carrier substrate 150, such as the substrate 11 (e.g., a silicon substrate), the diffusion barrier layer 13, and the capping layer 15, are selectively removed by an etching process using an etchant selective to the materials of the substrate 11, the diffusion barrier layer 13, and the capping layer 15. For example, a combination of a mechanical wafer thinning process and an etching process using a mixture of hydrofluoric acid (HF), nitric acid ($HNO_3$), acetic acid ($CH_3COOH$), and TMAH as etchants may be performed to selectively remove the substrate 11, the diffusion barrier layer 13, and the capping layer 15, and to expose the etch stop layer 17.

Figure 27B:
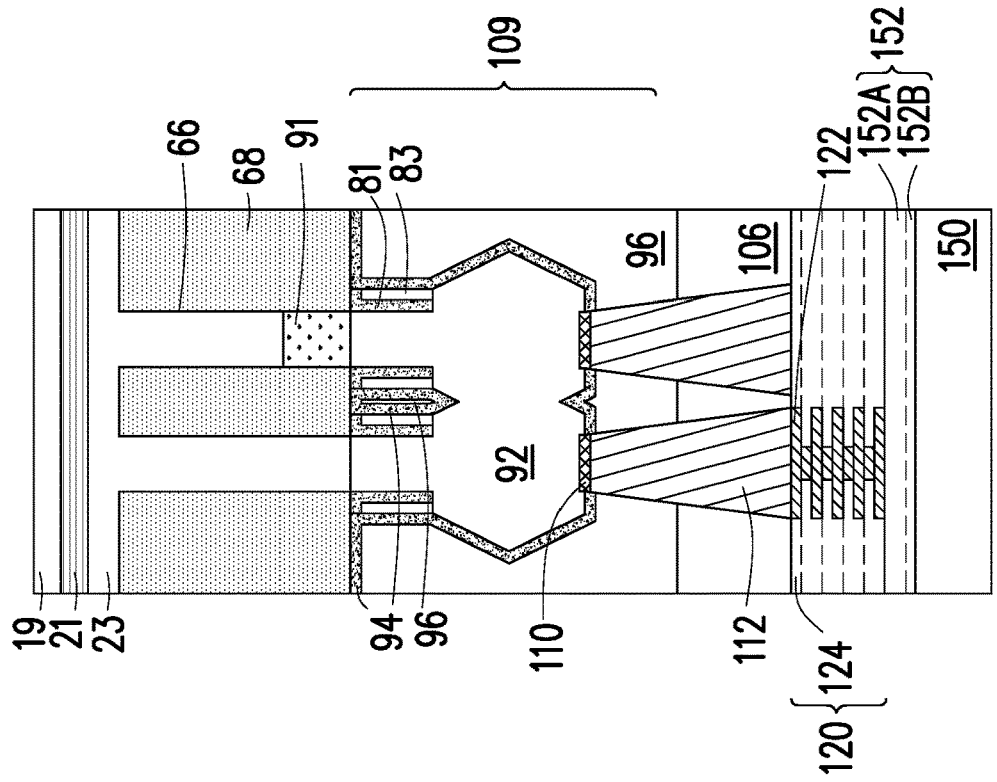
Figure 27A:
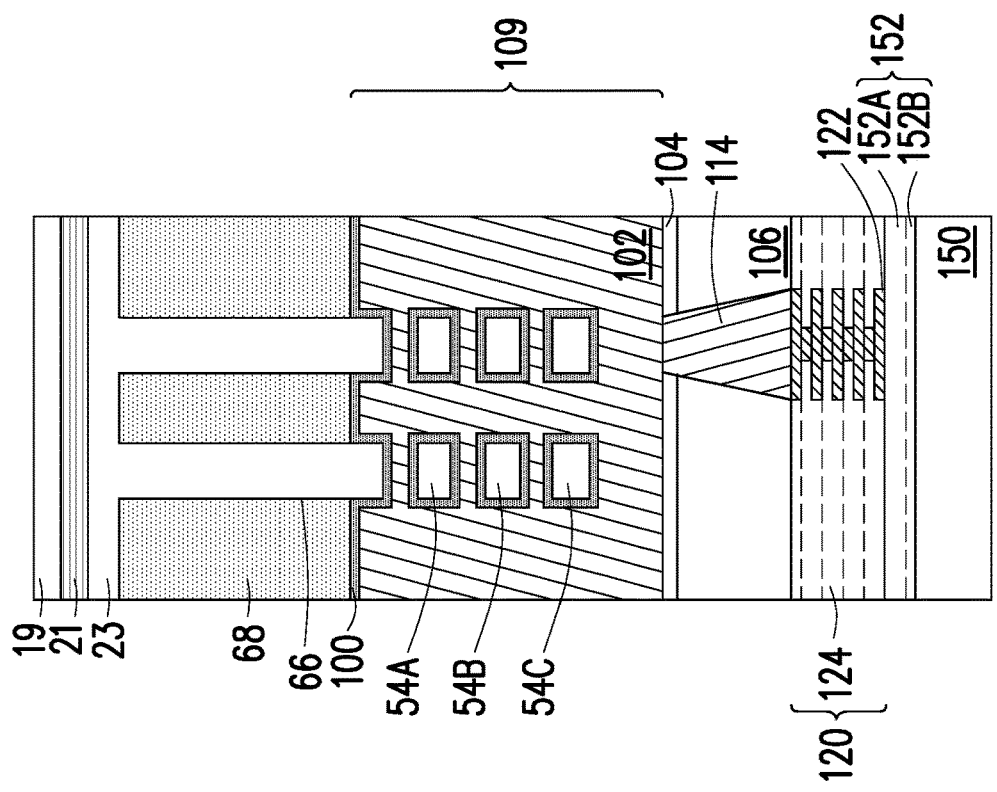
Figure 27C:
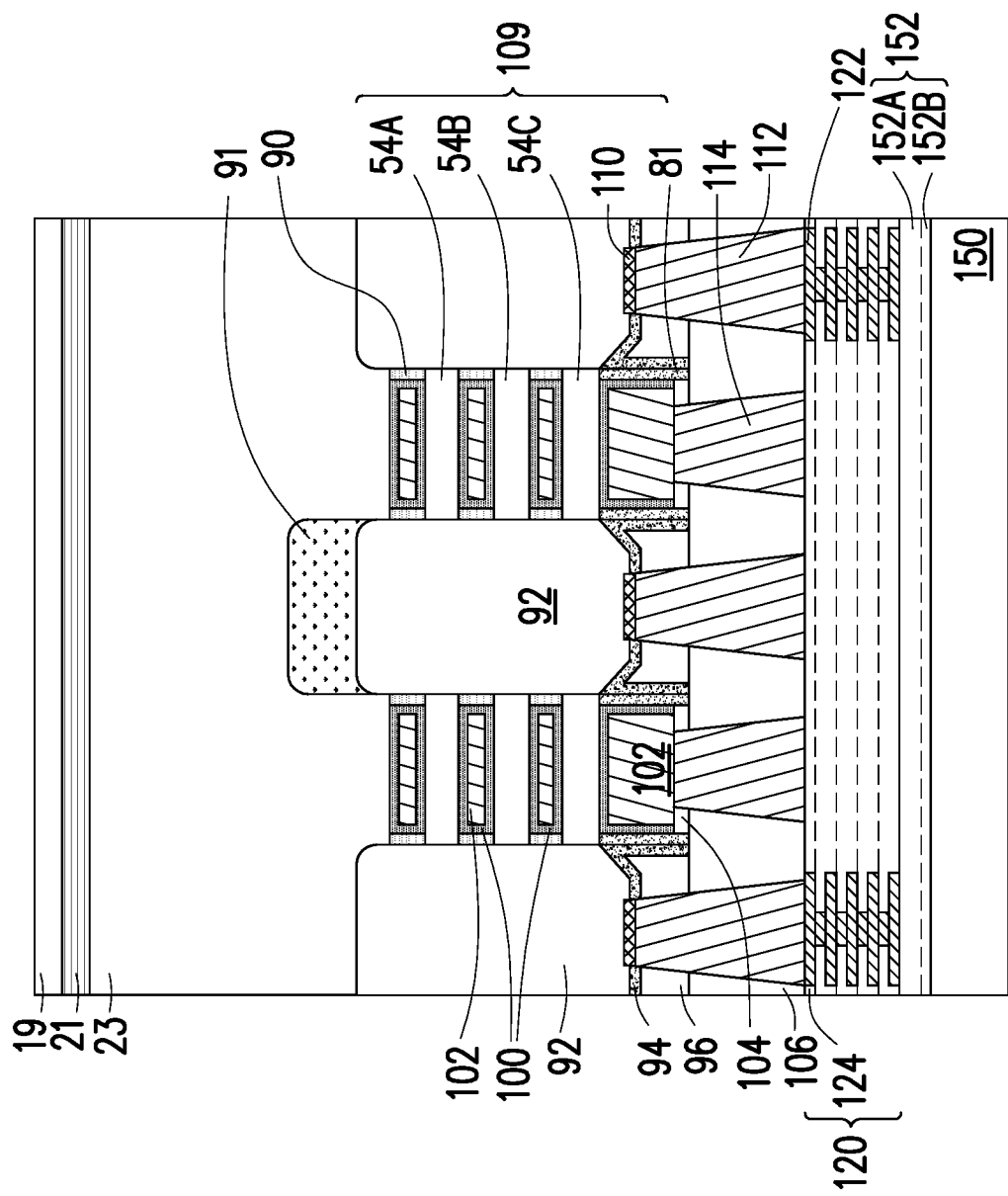

In FIGS. 27A through 27C, the etch stop layer 17 is selectively removed by an etching process using an etchant selective to the material of the etch stop layer 17. For example, for an etching stop layer 17 comprising silicon germanium (e.g., SiGe:B), an etching process using a mixture of hydrofluoric acid (HF), hydrogen peroxide ($H_2O_2$), and acetic acid ($CH_3COOH$) may be performed to selectively removed the etch stop layer 17. After the selective etching of the etch stop layer 17, the capping layer 19 is exposed.

Figure 28B:
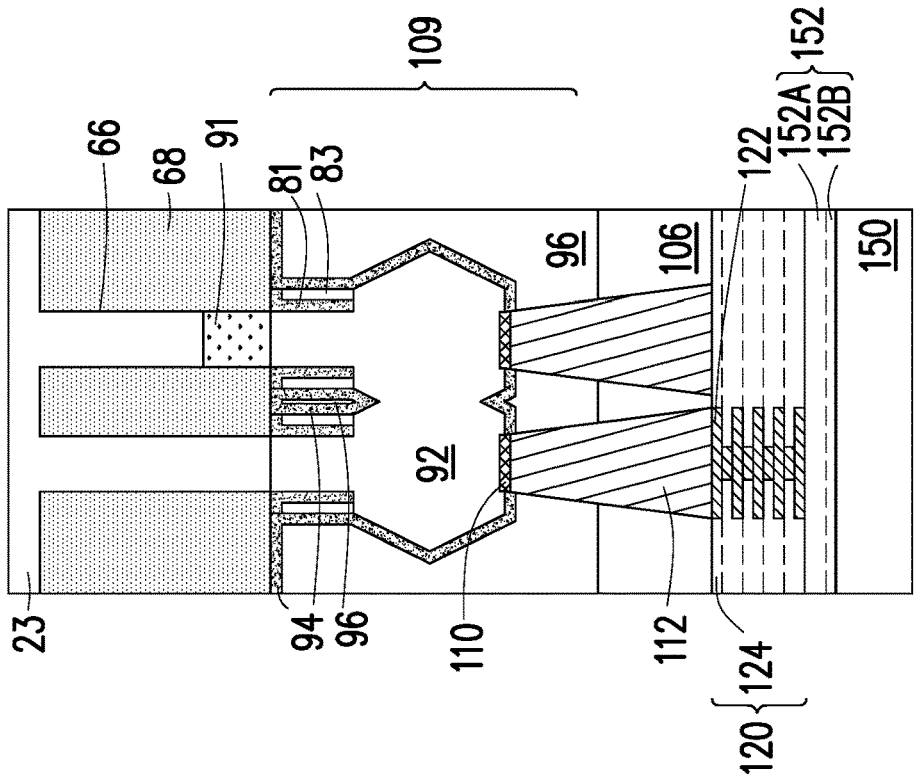
Figure 28A:
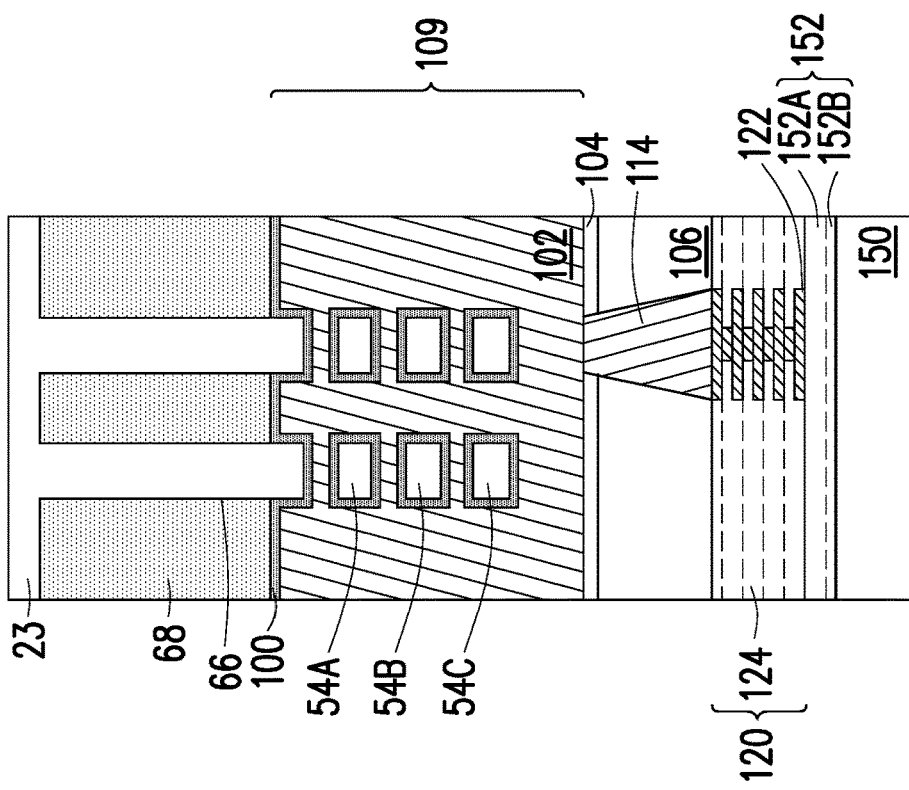
Figure 28C:
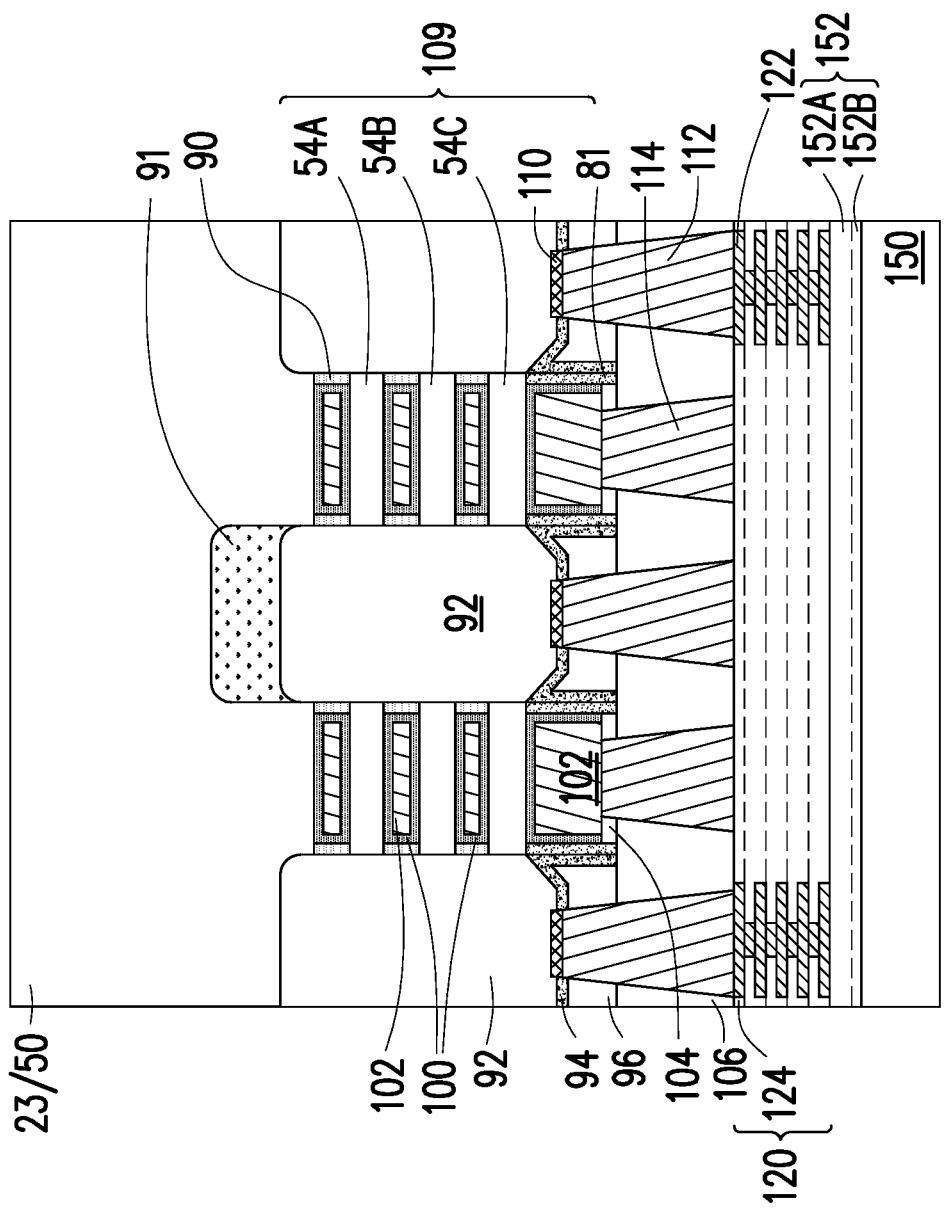

In FIGS. 28A through 28C, a planarization process, such as CMP, is performed to remove the capping layer 19 and the diffusion barrier layer 21. The semiconductor layer 23 is exposed after the planarization process. The processing steps shown in FIGS. 25A through 28C illustrate the transfer of the device layer (which includes the semiconductor layer 23 and the electrical components such as transistors formed thereon) and the front-side interconnect structure 120 to the carrier substrate 150.

Note that the substrate 50B is used as an example in the processing steps of FIGS. 25A through 28C. One of ordinary skill in the art, upon reading this disclosure, will be able to adapt the processing steps for other types of substrate (e.g., 50A and 50C). For instance, consider an example where the substrate 50 has the structure of the substrate 50C of FIG. 4. In particular, consider an example where the etch stop layers 17/29 and the capping layers 19/31 are silicon doped by boron (Si:B), and the un-doped semiconductor layer 25 is un-doped epitaxial silicon. The following processing steps may be followed to transfer the device layer and the front-side interconnect structure 120 to the carrier substrate 150: A first portion of the substrate 11 distal from the carrier substrate 150 may be removed by a grinding process. Next, a second portion of the substrate 11 exposed after the grinding process may be removed by etching using a mixture of hydrofluoric acid (HF), nitric acid (HNO$_3$), and acetic acid (CH$_3$COOH). Next, an etching process using TMAH is performed to selectively remove the remaining portion of the substrate 11 and the diffusion barrier layer 13. Next, an etching process using the mixture of hydrofluoric acid (HF), hydrogen peroxide (H$_2$O$_2$), and acetic acid (CH$_3$COOH) is performed to selectively remove the etch stop layer 17 and the capping layer 19. Next, an etching process using TMAH is performed to selectively remove the diffusion barrier layer 21, the un-doped semiconductor layer 25, and the diffusion barrier layer 27. Next, an etching process using the mixture of hydrofluoric acid (HF), hydrogen peroxide (H$_2$O$_2$), and acetic acid (CH$_3$COOH) is performed to selectively remove the etch stop layer 29 and the capping layer 31. A CMP process may be performed next to remove the diffusion barrier layer 33 and to expose the semiconductor layer 23.

Figure 29B:
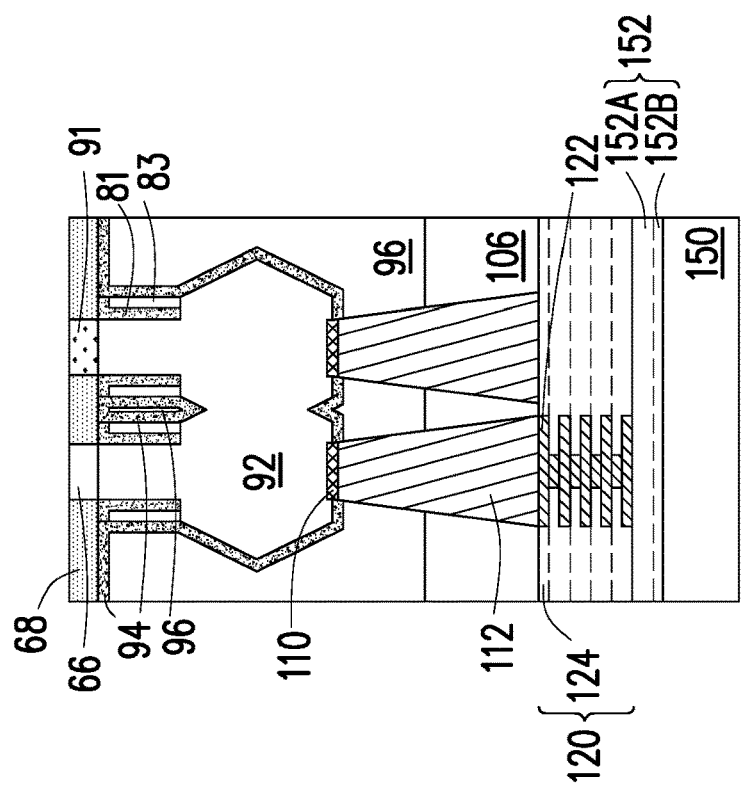
Figure 29A:
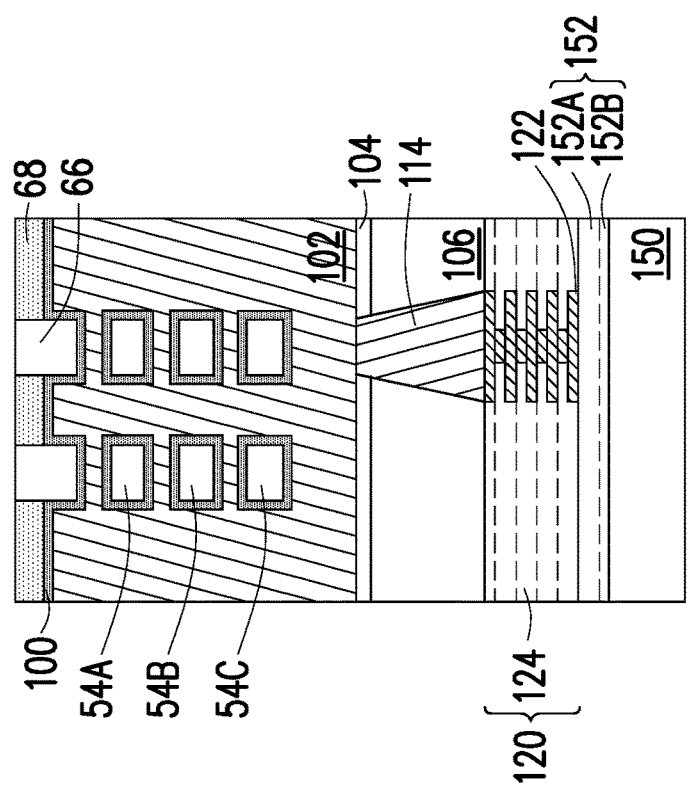
Figure 29C:
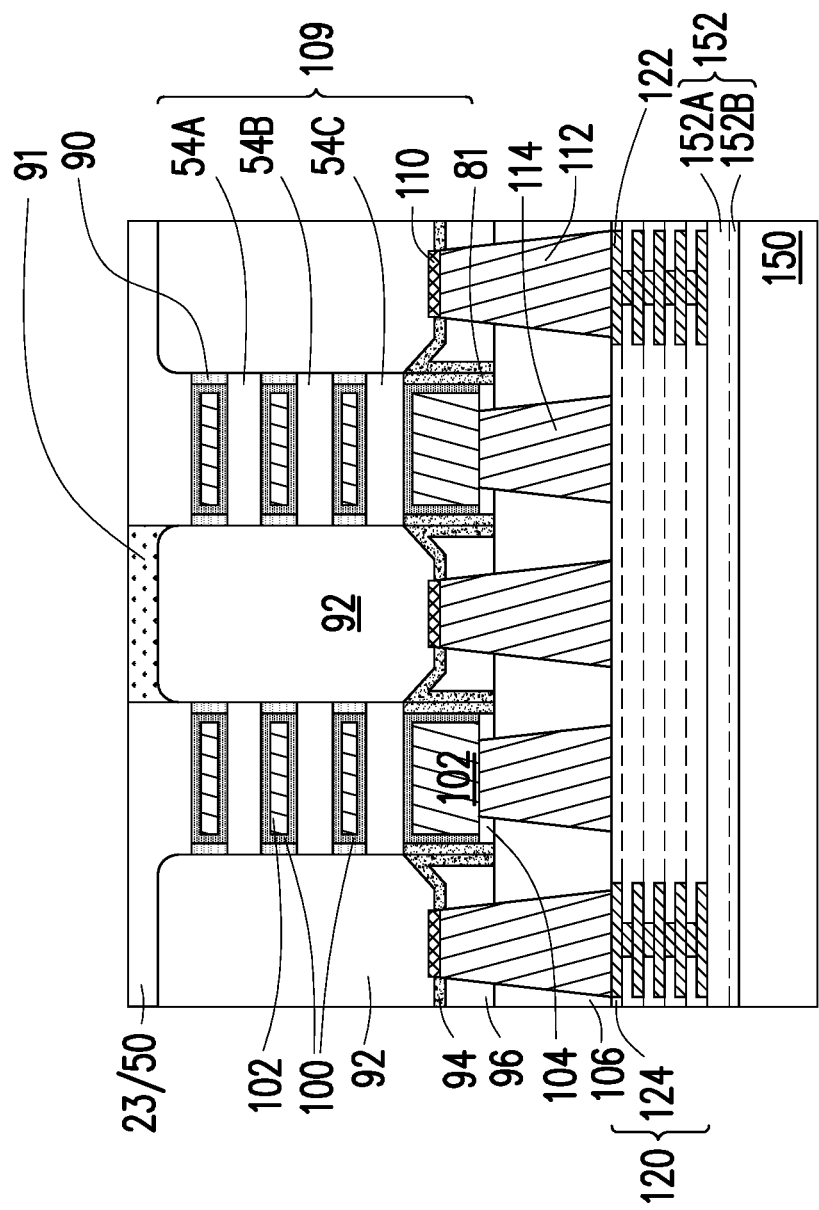

In FIGS. 29A through 29C, a thinning process may be applied to the semiconductor layer 23 of the substrate 50. The thinning process may comprise a planarization process (e.g., a CMP), an etch-back process, a combination thereof, or the like. The thinning process may expose surfaces of the first epitaxial materials 91 opposite the front-side interconnect structure 120. Further, a portion of the semiconductor layer 23 of the substrate 50 may remain over the gate structures (e.g., the gate electrodes 102 and the gate dielectric layers 100) and the nanostructures 55 after the thinning process. As illustrated in FIGS. 29A through 29C, backside surfaces of the substrate 50, the first epitaxial materials 91, the STI regions 68, and the fins 66 may be level with one another following the thinning process.

Figure 30B:
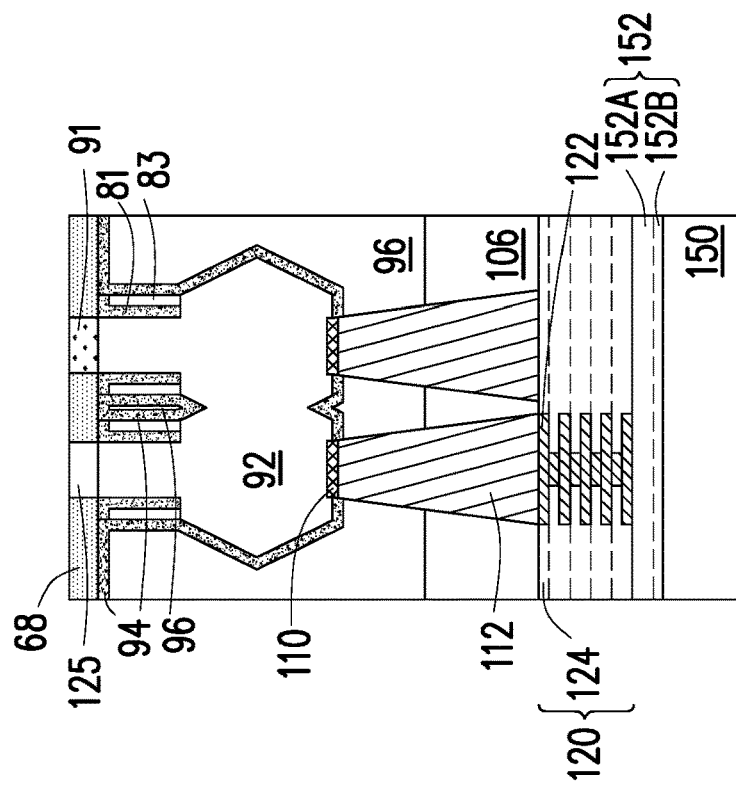
Figure 30A:
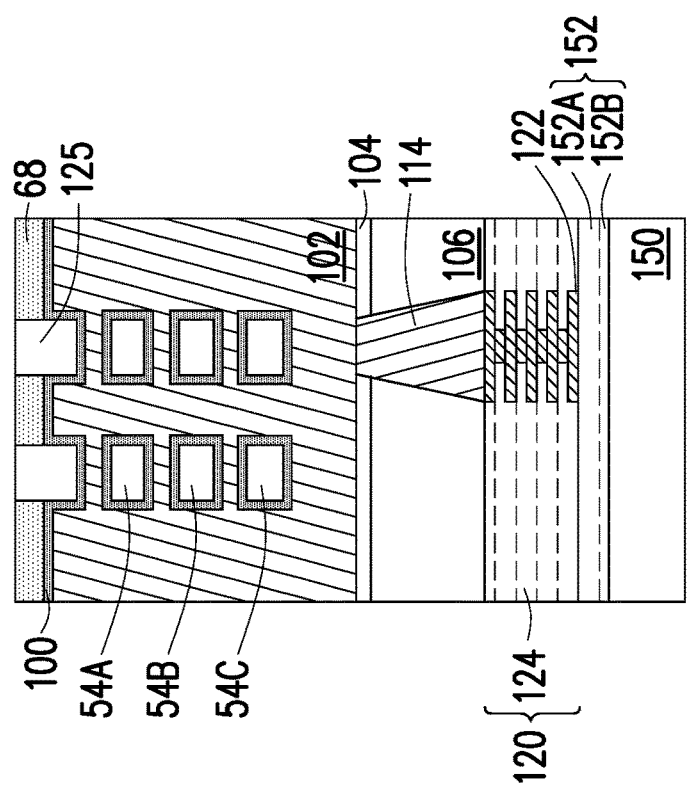
Figure 30C:
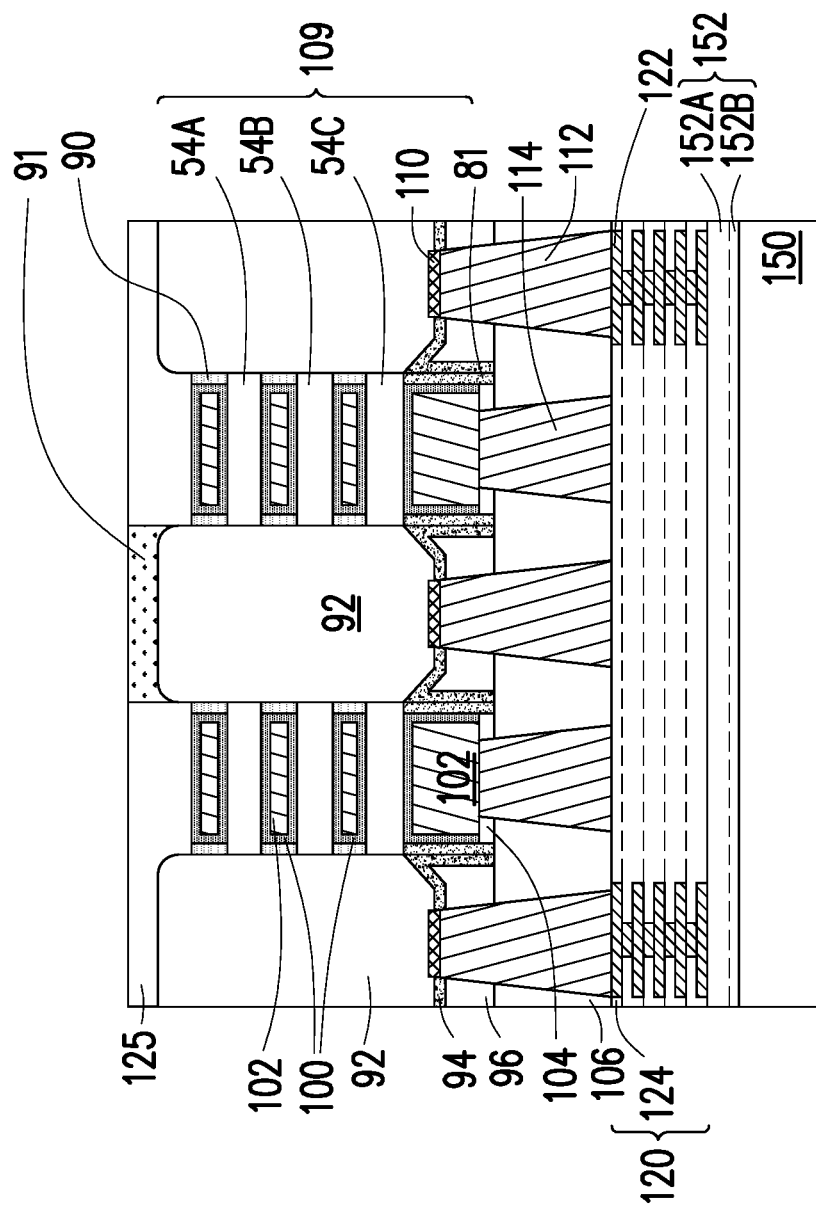

In FIGS. 30A through 30C, remaining portions of the fins 66 and the substrate 50 are removed and replaced with a second dielectric layer 125. The fins 66 and the substrate 50 may be etched using a suitable etching process, such as an isotropic etching process (e.g., a wet etching process), an anisotropic etching process (e.g., a dry etching process), or the like. The etching process may be one that is selective to the material of the fins 66 and the substrate 50 (e.g., etches the material of the fins 66 and the substrate 50 at a faster rate than the material of the STI regions 68, the gate dielectric layers 100, the epitaxial source/drain regions 92, and the first epitaxial materials 91). After etching the fins 66 and the substrate 50, surfaces of the STI regions 68, the gate dielectric layers 100, the epitaxial source/drain regions 92, and the first epitaxial materials 91 may be exposed.

The second dielectric layer 125 is then deposited on the backside of the transistor structures 109 in recesses formed by removing the fins 66 and the substrate 50. The second dielectric layer 125 may be deposited over the STI regions 68, the gate dielectric layers 100, and the epitaxial source/drain regions 92. The second dielectric layer 125 may physically contact surfaces of the STI regions 68, the gate dielectric layers 100, the epitaxial source/drain regions 92, and the first epitaxial materials 91. The second dielectric layer 125 may be substantially similar to the second ILD 106, described above with respect to FIGS. 21A through 21C. For example, the second dielectric layer 125 may be formed of a like material and using a like process as the second ILD 106. As illustrated in FIGS. 30A through 30C, a CMP process or the like may be used to remove material of the second dielectric layer 125 such that top surfaces of the second dielectric layer 125 are level with top surfaces of the STI regions 68 and the first epitaxial materials 91.

Figure 31C:
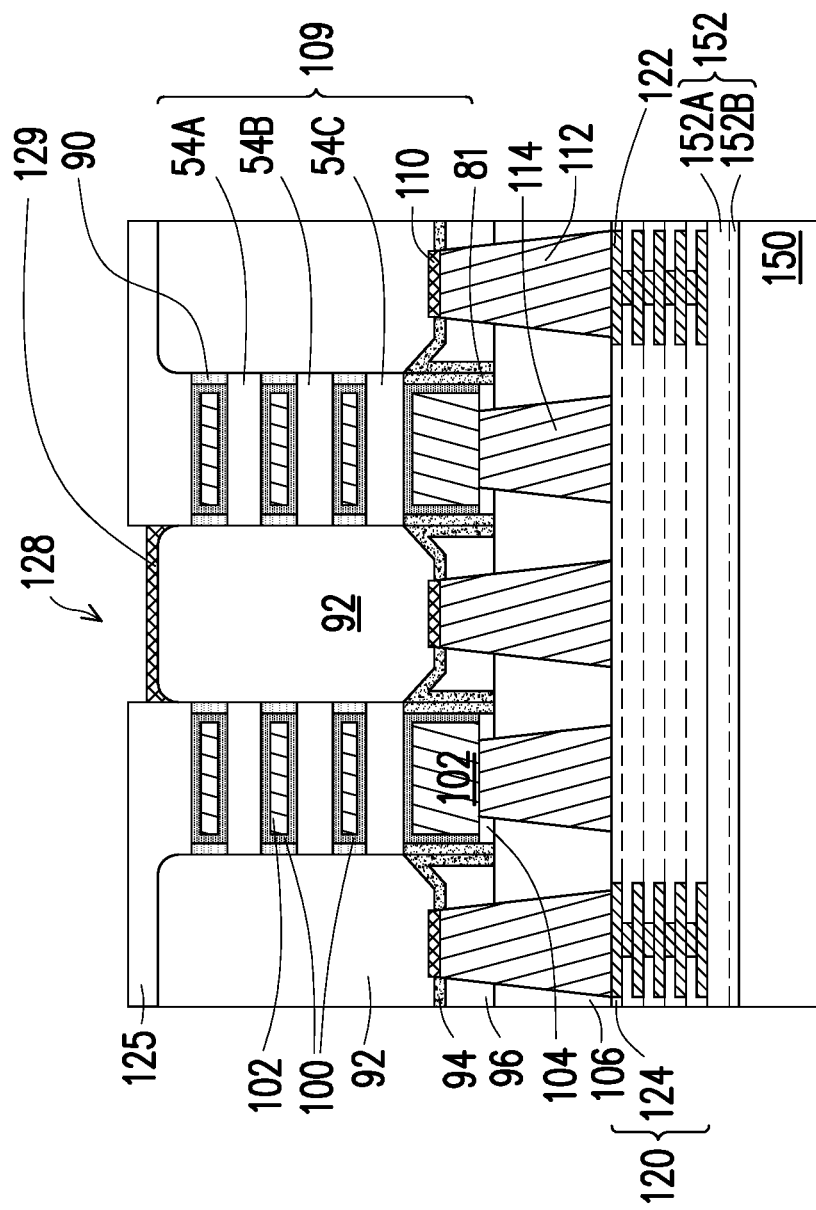

In FIGS. 31A through 31C, the first epitaxial materials 91 are removed to form fifth recesses 128 and second silicide regions 129 are formed in the fifth recesses 128. The first epitaxial materials 91 may be removed by a suitable etching process, which may be an isotropic etching process, such as a wet etching process. The etching process may have a high etch selectivity to materials of the first epitaxial materials 91. As such, the first epitaxial materials 91 may be removed without significantly removing materials of the second dielectric layer 125, the STI regions 68, or the epitaxial source/drain regions 92. The fifth recesses 128 may expose sidewalls of the STI regions 68, backside surfaces of the epitaxial source/drain regions 92, and sidewalls of the second dielectric layer 125.

Second silicide regions 129 may then be formed in the fifth recesses 128 on backsides of the epitaxial source/drain regions 92. The second silicide regions 129 may be similar to the first silicide regions 110, described above with respect to FIGS. 22A through 22C. For example, the second silicide regions 129 may be formed of a like material and using a like process as the first silicide regions 110.

Figure 32B:
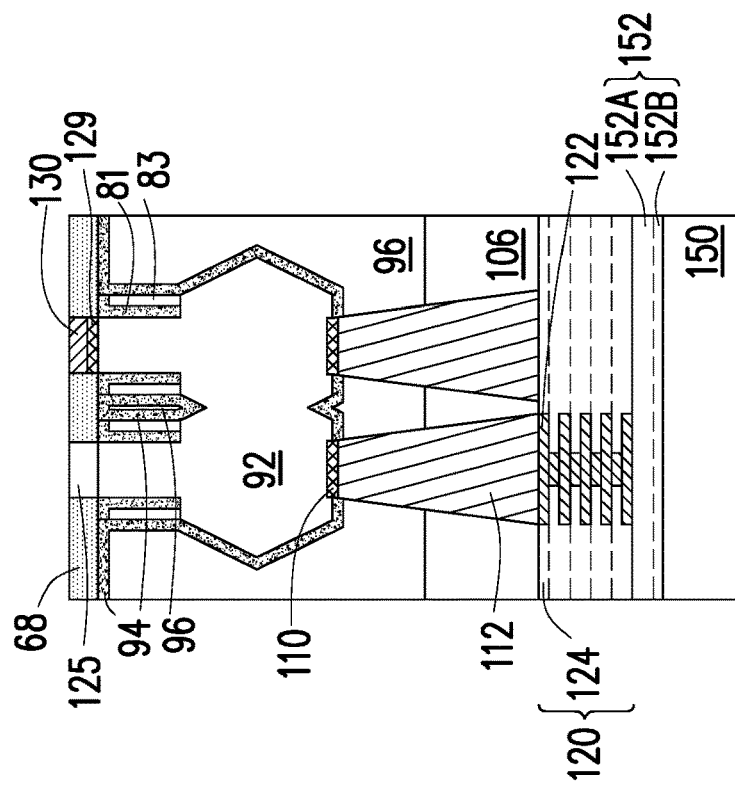
Figure 32A:
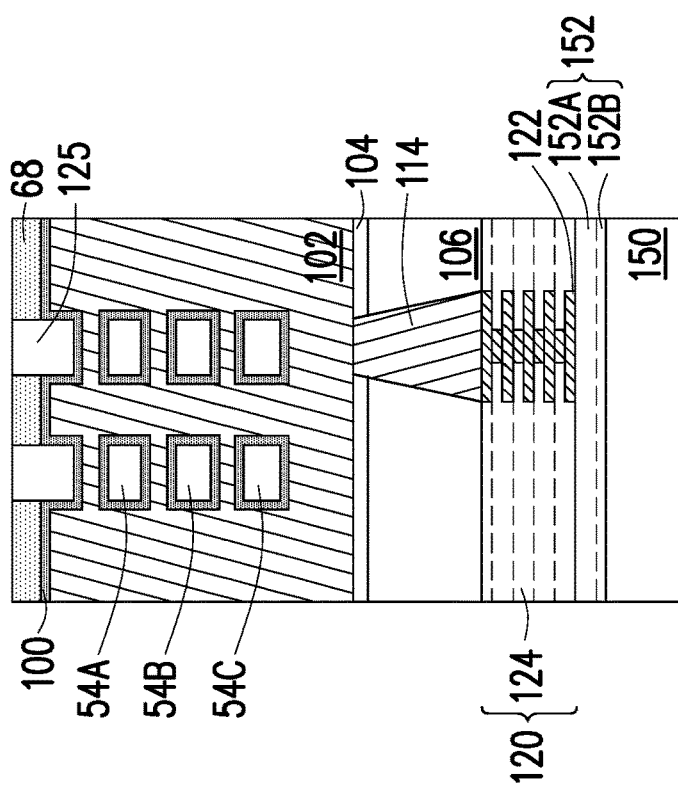
Figure 32C:
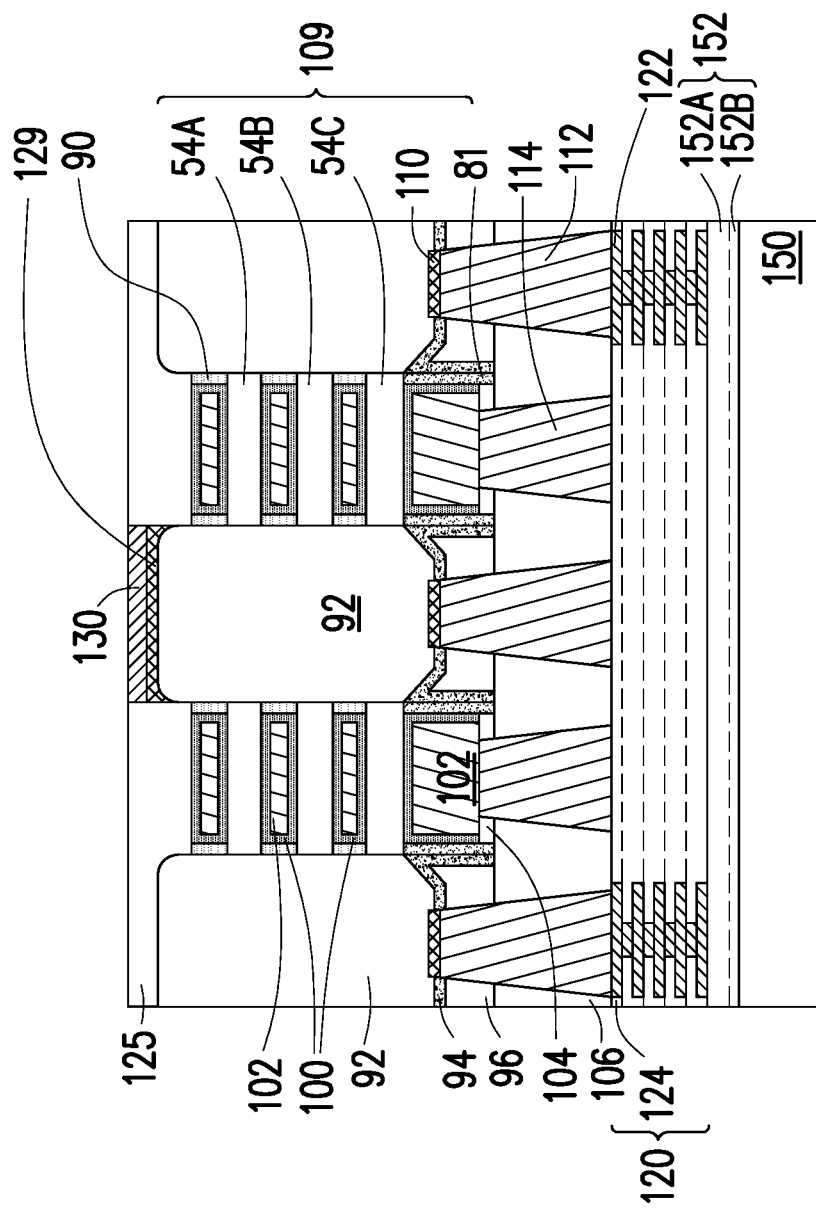

In FIGS. 32A through 32C, backside vias 130 are formed in the fifth recesses 128. The backside vias 130 may extend through the second dielectric layer 125 and the STI regions 68 and may be electrically coupled to the epitaxial source/drain regions 92 through the second silicide regions 129. The backside vias 130 may be similar to the source/drain contacts 112, described above with respect to FIGS. 23A through 23C. For example, the backside vias 130 may be formed of a like material and using a like process as the source/drain contacts 112.

In FIGS. 33A through 33D, conductive lines 134 and a third dielectric layer 132 are formed over the second dielectric layer 125, the STI regions 68, and the backside vias 130. The third dielectric layer 132 may be similar to the second dielectric layer 125. For example, third dielectric layer 132 may be formed of a like material and using a like process as the second dielectric layer 125.

The conductive lines 134 are formed in the third dielectric layer 132. Forming the conductive lines 134 may include patterning recesses in the third dielectric layer 132 using a combination of photolithography and etching processes, for example. A pattern of the recesses in the third dielectric layer 132 may correspond to a pattern of the conductive lines 134. The conductive lines 134 are then formed by depositing a conductive material in the recesses. In some embodiments, the conductive lines 134 comprise a metal layer, which may be a single layer or a composite layer comprising a plurality of sub-layers formed of different materials. In some embodiments, the conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, tantalum oxide, or the like. The conductive lines 134 may be formed using, for example, CVD, ALD, PVD, plating or the like. The conductive lines 134 are physically and electrically coupled to the epitaxial source/drain regions 92 through the backside vias 130 and the second silicide regions 129. A planarization process (e.g., a CMP, a grinding, an etch-back, or the like) may be performed to remove excess portions of the conductive lines 134 formed over the third dielectric layer 132.

In some embodiments, the conductive lines 134 are power rails, which are conductive lines that electrically connect the epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the conductive lines 134 may be at least twice a width of first level conductive lines (e.g., first conductive features 122) of the front-side interconnect structure 120.

Figure 33C:
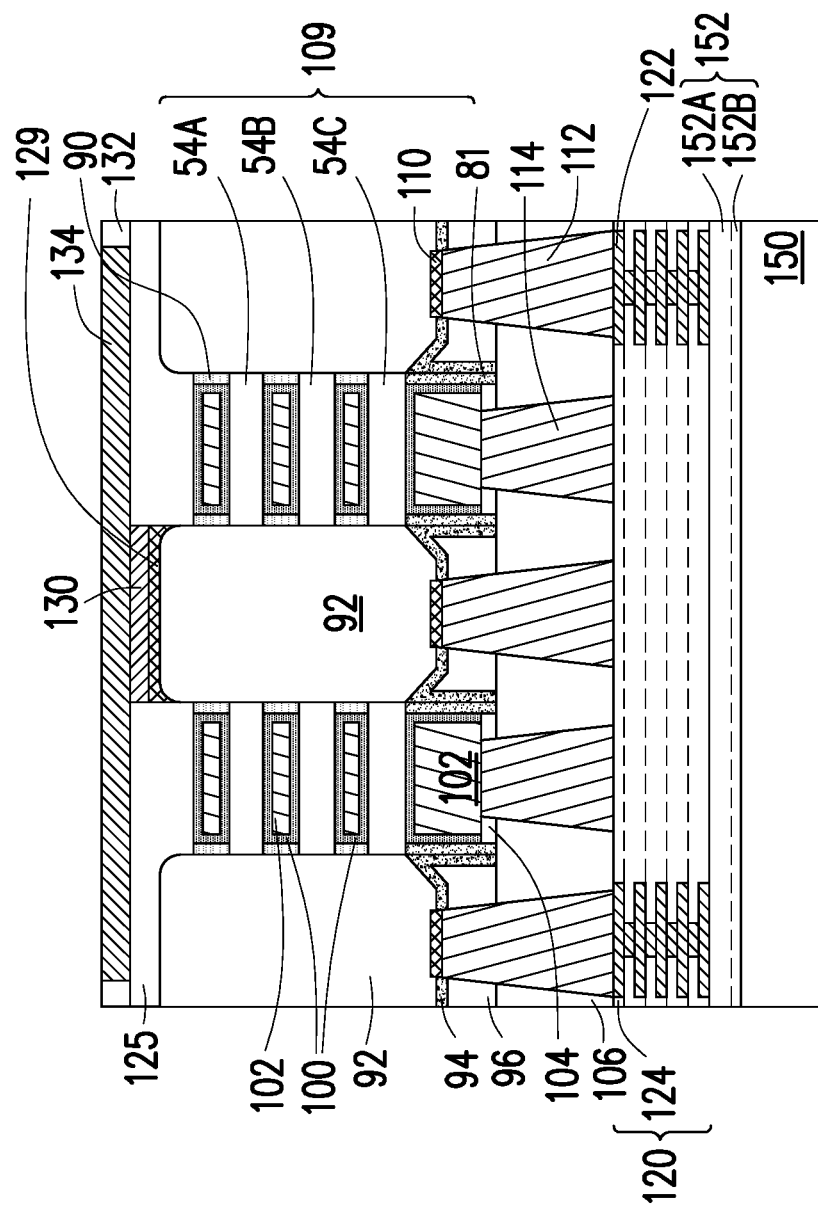
Figure 33D:
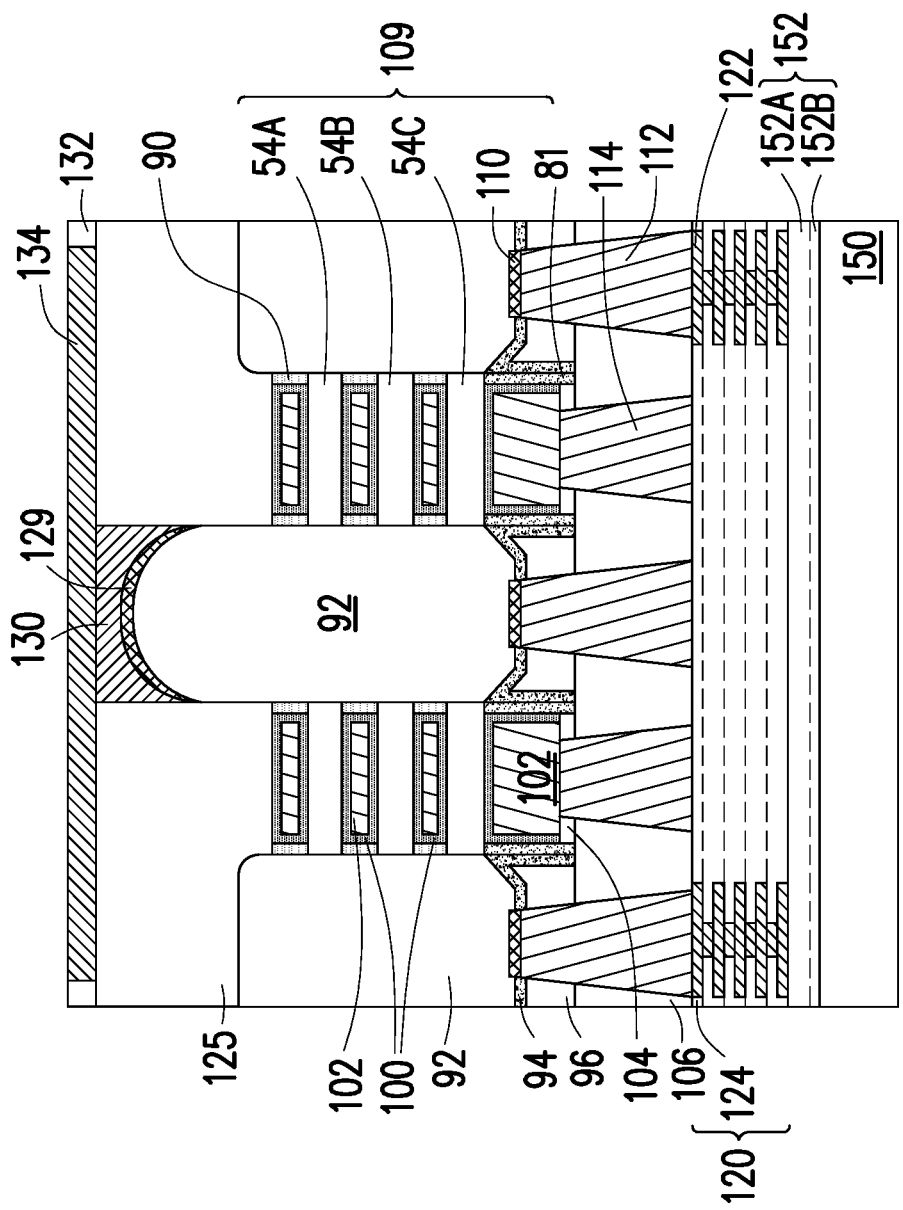

FIG. 33D illustrates an embodiment in which the epitaxial source/drain regions 92 to which the backside vias 130 are electrically coupled have heights greater than the epitaxial source/drain regions 92 which are not electrically coupled to the backside vias 130. The heights of the epitaxial source/drain regions 92 may be selected by controlling depths of the first recesses 86 and the second recesses 87 and/or controlling the thickness of the first epitaxial materials 91. Forming the epitaxial source/drain regions 92 which are not electrically coupled to the backside vias 130 with heights less than the epitaxial source/drain regions 92 which are electrically coupled to the backside vias 130 results in the epitaxial source/drain regions 92 which are not electrically coupled to the backside vias 130 being separated from the conductive lines 134 by a greater thickness of the second dielectric layer 125. This provides better isolation of the epitaxial source/drain regions 92 which are not electrically coupled to the backside vias 130 from the conductive lines 134 and improves device performance.

Figure 34B:
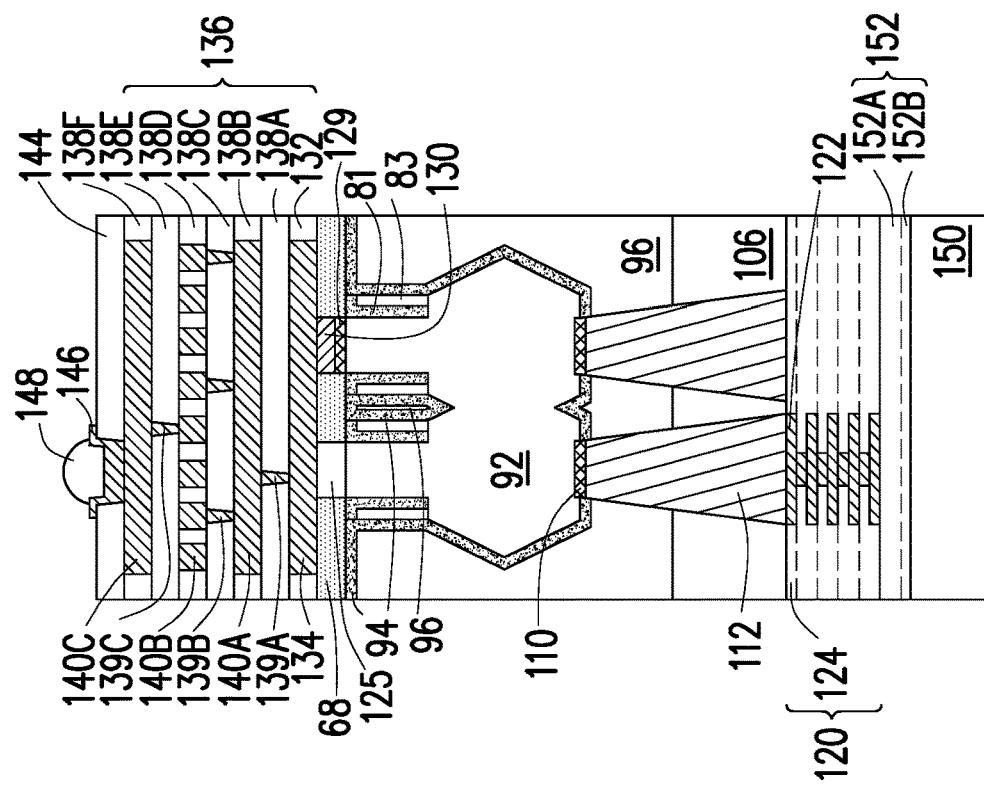
Figure 34A:
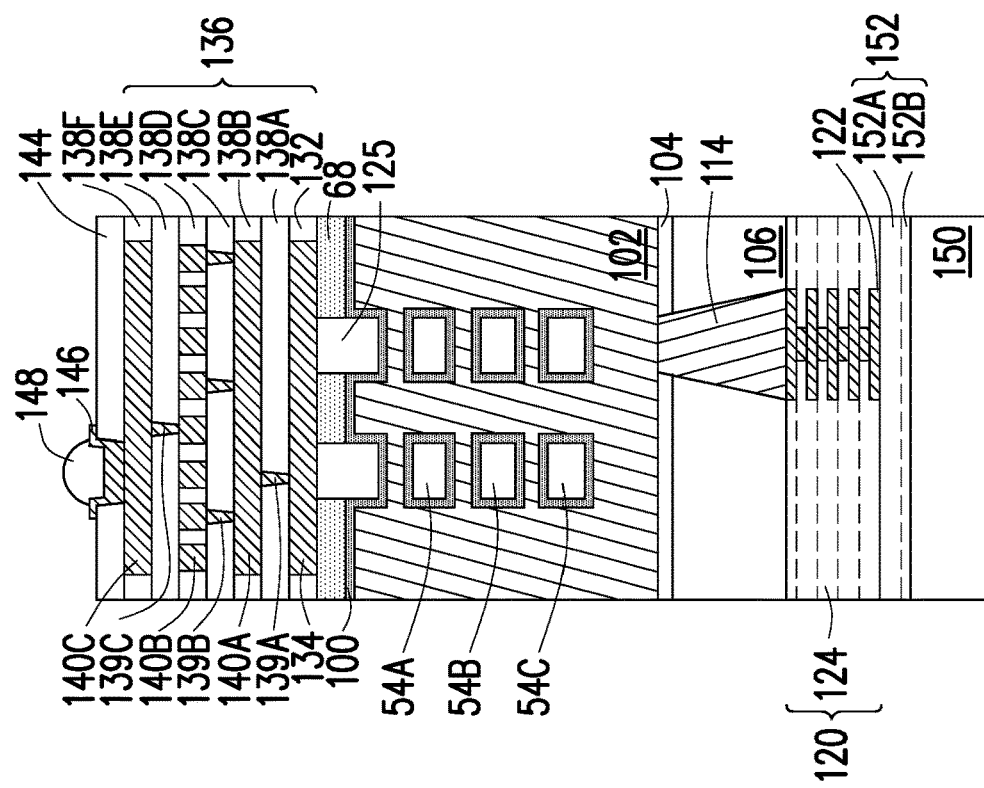
Figure 34C:
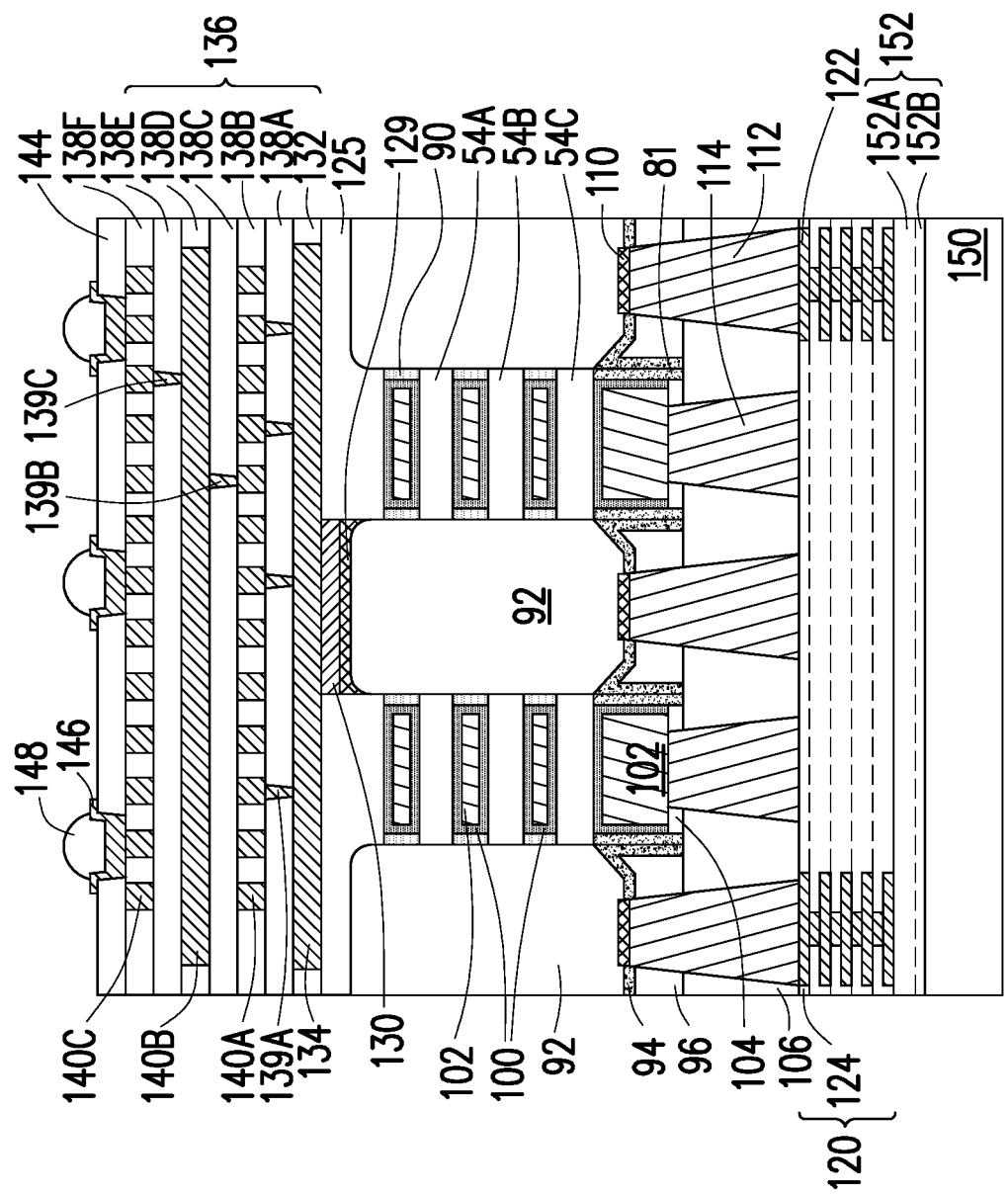

In FIGS. 34A through 34C, remaining portions of a backside interconnect structure 136 are formed over the third dielectric layer 132 and the conductive lines 134. The backside interconnect structure 136 may be referred to as a backside interconnect structure because it is formed on a backside of the transistor structures 109 (e.g., a side of the transistor structures 109 opposite the side of the transistor structure 109 on which active devices are formed). The backside interconnect structure 136 may comprise the second dielectric layer 125, the third dielectric layer 132, the backside vias 130, and the conductive lines 134. The backside interconnect structure 136 may further comprise conductive lines 140A-140C (collectively referred to as conductive lines 140) and conductive vias 139A-139C (collectively referred to as conductive vias 139) formed in fourth dielectric layers 138A-138F (collectively referred to as fourth dielectric layers 138). The conductive vias 139 may extend through respective ones of the fourth dielectric layers 138 to provide vertical connections between layers of the conductive lines 140. The conductive lines 140, the conductive vias 139, and the fourth dielectric layers 138 of the backside interconnect structure 136 may be formed using the same or similar process and material(s) as the corresponding structures in the front-side interconnect structure 120, thus details are not repeated. The number of the fourth dielectric layers 138 illustrated in FIGS. 34A through 34C is a non-limiting example, any suitable number of the fourth dielectric layers 138 may be used in the backside interconnect structure 136.

Still referring to FIGS. 34A through 34C, a passivation layer 144, under-bump metallurgy structures (UBMs) 146, and external connectors 148 are formed over the backside interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the conductive lines 140 in the backside interconnect structure 136 and external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost conductive lines 140C and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or ground connections to the nano-FETs described above.

FIGS. 35, 36A, 36B, and 37 illustrate cross-sectional view of a semiconductor package at various stages of manufacturing, in accordance with an embodiment. FIGS. 35, 36A, 36B, and 37 illustrate transferring of a semiconductor die 216 to a wafer 218 using a substrate having etching stop layer and diffusion barrier layer. The wafer 218 may also be referred to as a workpiece. The term workpiece may be used as a generic term herein to refer to, e.g., a wafer, a carrier substrate, or the like.

Figure 35:
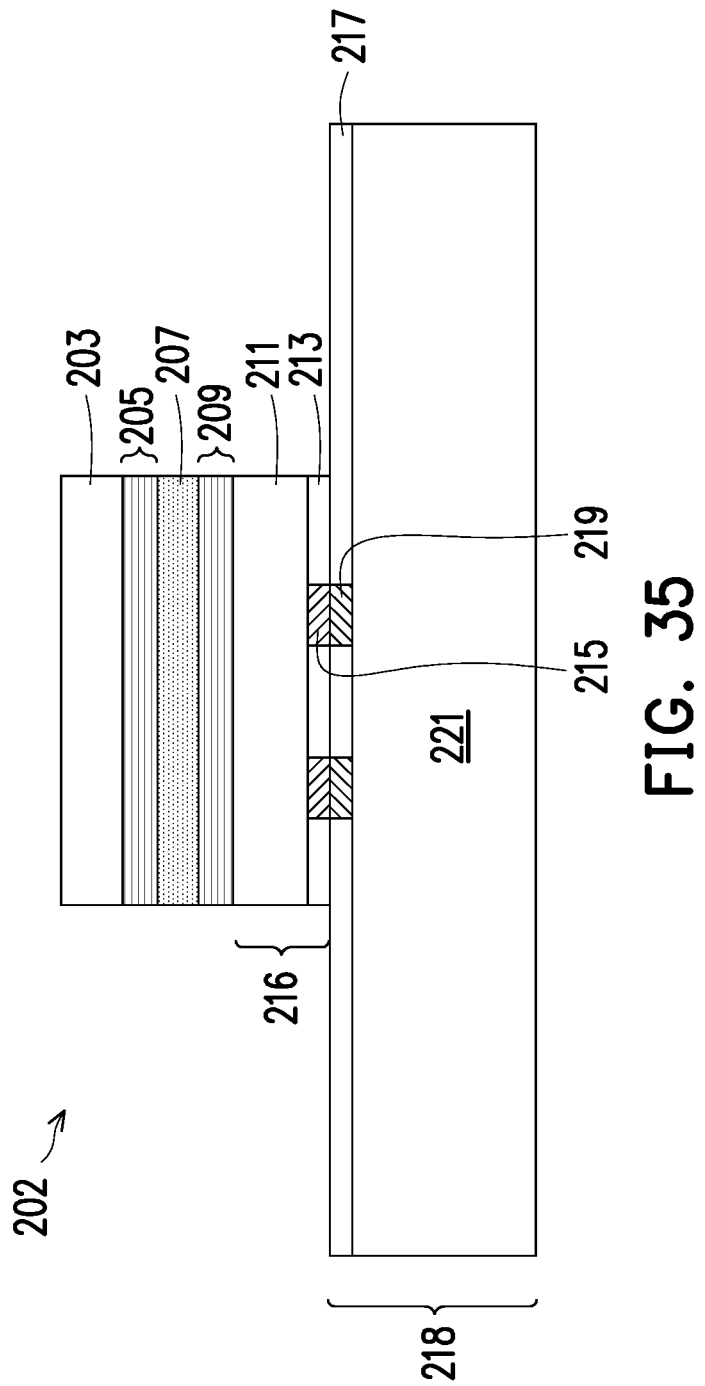
FIGS. 35, 36A, 36B, and 37 illustrate cross-sectional view of a semiconductor package at various stages of manufacturing, in accordance with an embodiment.

Referring to FIG. 35, a substrate 202 is bonded to the wafer 218. The substrate 202 is similar to the substrate 50B of FIG. 3. The substrate 202 includes a sacrificial substrate 203, an etch stop layer 207, diffusion barrier layers 205 and 209 at an upper surface and a lower surface of the etch stop layer 207, and a semiconductor layer 211. The sacrificial substrate 203, the etch stop layers 207, the diffusion barrier layers 205 and 209, and the semiconductor layer 211 correspond to the sacrificial substrate 11, the etch stop layers 17, the diffusion barrier layers 13 and 21, and the semiconductor layer 23 of FIG. 3, respectively. In an example embodiment, the sacrificial substrate 203 is a silicon substrate, the etch stop layers 207 is a silicon layer doped by boron (e.g., Si:B) or a silicon germanium layer doped by boron (e.g., SiGe:B), the diffusion barrier layers 205 and 209 are layer stacks comprising alternating layers of silicon and oxygen-inserted partial monolayers, and the semiconductor layer 211 is a silicon layer.

As illustrated in FIG. 35, a semiconductor die 216 is formed in/on the semiconductor layer 211. The semiconductor die 216 has die connectors 215 formed at its front side, and has a passivation layer 213 around the die connectors 215. The wafer 218 includes a substrate 221, conductive pads 219, and a passivation layer 217 over the upper surface of the substrate 221 around the conductive pads 219. The wafer 218 may have conductive lines and vias that are electrically coupled to the conductive pads 219. In the example of FIG. 35, the substrate 202 is bonded to the wafer 218 through hybrid bonding, although any other suitable bonding technique, such as bonding using micro-bumps, may also be used.

Figure 36A:
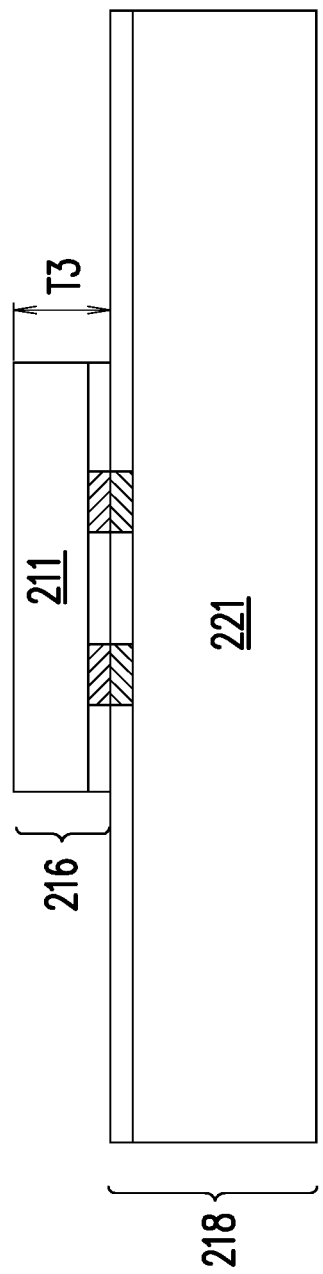

In FIG. 36A, the substrate 202 is thinned from the backside using, e.g., etching, grinding, combinations thereof, or the like. The backside thinning process may include processing steps same as or similar to those discussed above with reference to FIGS. 25A through 28C, thus details are not repeated. After the backside thinning process, the sacrificial substrate 203, the etch stop layers 207, and the diffusion barrier layers 205 and 209 are removed, and the semiconductor die 216 remains bonded to the wafer 218. A thickness T3 of the semiconductor die 216 is less than about 100 nm, in some embodiments. Such a small thickness (e.g., <100 nm) of the semiconductor die 216 is achieved by using substrate 202 having the etching stop layer 207 and the diffusion barrier layers 205/209. As discussed above, an advantage of the small thickness is reduced total thickness variation (TTV) (e.g., a flatter upper surface) for the semiconductor die 216, which facilitates die stacking when additional layers of semiconductor dies are stacked over the semiconductor die 216, as discussed below with reference to FIG. 37.

Figure 36B:
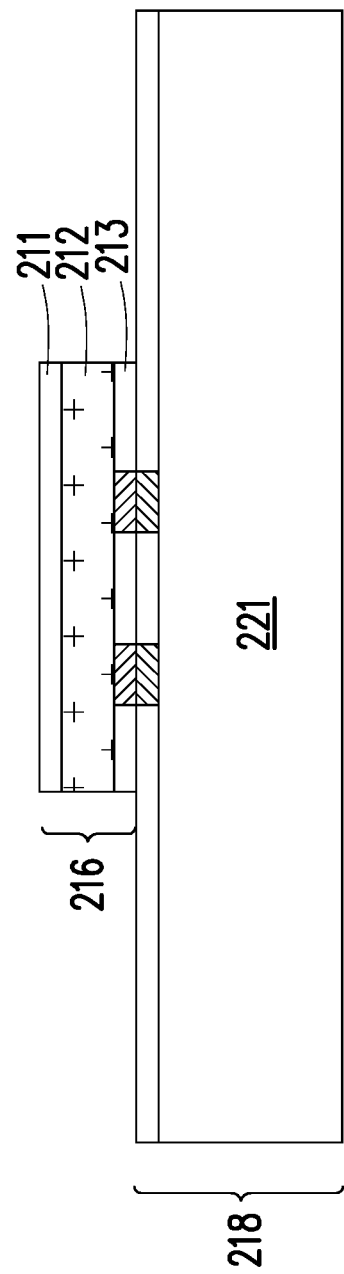

In the example of FIG. 36A, the semiconductor die 216 transferred to the wafer 218 has a single-layer substrate, such as the semiconductor layer 211, which is a thin layer (e.g., <100 nm) with reduced TTV. In some embodiments, such as illustrated in FIG. 36B, the substrate 202 may be used to transfer a semiconductor die 216 having a stacked, or multi-layer substrate structure, such as a substrate structure comprising the semiconductor layer 211 (e.g., a thin layer with reduced TTV and a thickness less than 100 nm) formed on a substrate 212, which substrate 212 may be thicker than the semiconductor layer 211. One skilled in the art will readily appreciate that advantages associated with transferring a die having the thin semiconductor layer 211 with reduced TTV to the wafer 218, such as advantages for forming 3DIC packages, apply for both die structures illustrated in FIGS. 36A and 36B.

Figure 37:
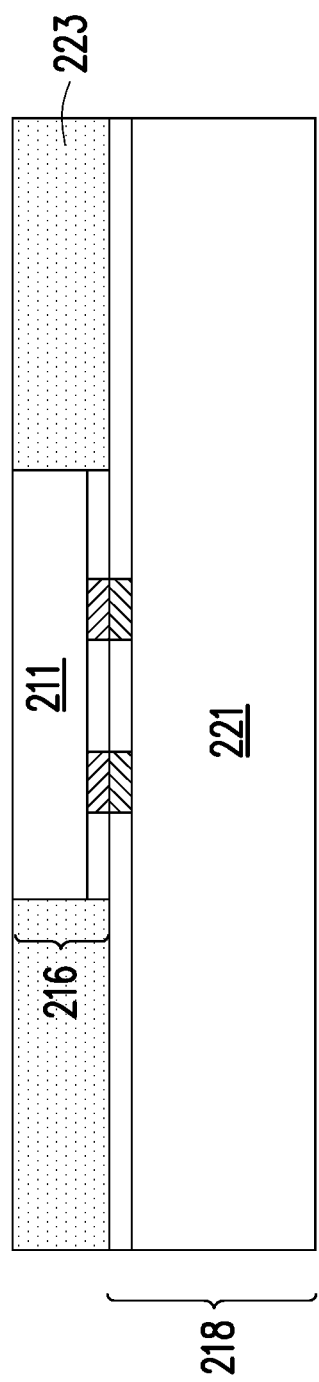

In FIG. 37, a dielectric material 223 (e.g., a molding material or a gap fill oxide) is formed over the upper surface of the wafer 218 around the semiconductor die 216. A planarization process, such as CMP, may be performed to remove excess portions of the dielectric material 223 from the upper surface of the semiconductor die 216 and to achieve a coplanar upper surface between the semiconductor die 216 and the dielectric material 223. FIGS. 35, 36A, 36B, and 37 therefore illustrate processing steps to form a 3DIC package by bonding a semiconductor die to a wafer and performing a backside thinning process, where the back thinning process is facilitated by the embodiment substrate having etching stop layer and diffusion barrier layer. The processing steps of FIGS. 35 through 37 may be repeated to attach additional layers of semiconductor dies to the structure of FIG. 37, as one skilled in the art readily appreciates.

FIGS. 38, 39A, 39B, 40, and 41 illustrate cross-sectional view of a semiconductor package at various stages of manufacturing, in accordance with an embodiment. FIGS. 38, 39A, 39B, 40, and 41 illustrate processing steps to form a 3DIC package by wafer-to-wafer bonding and backside thinning, where the backside thinning process is facilitated by the various embodiment substrates having etching stop layer and diffusion barrier layer.

Figure 38:
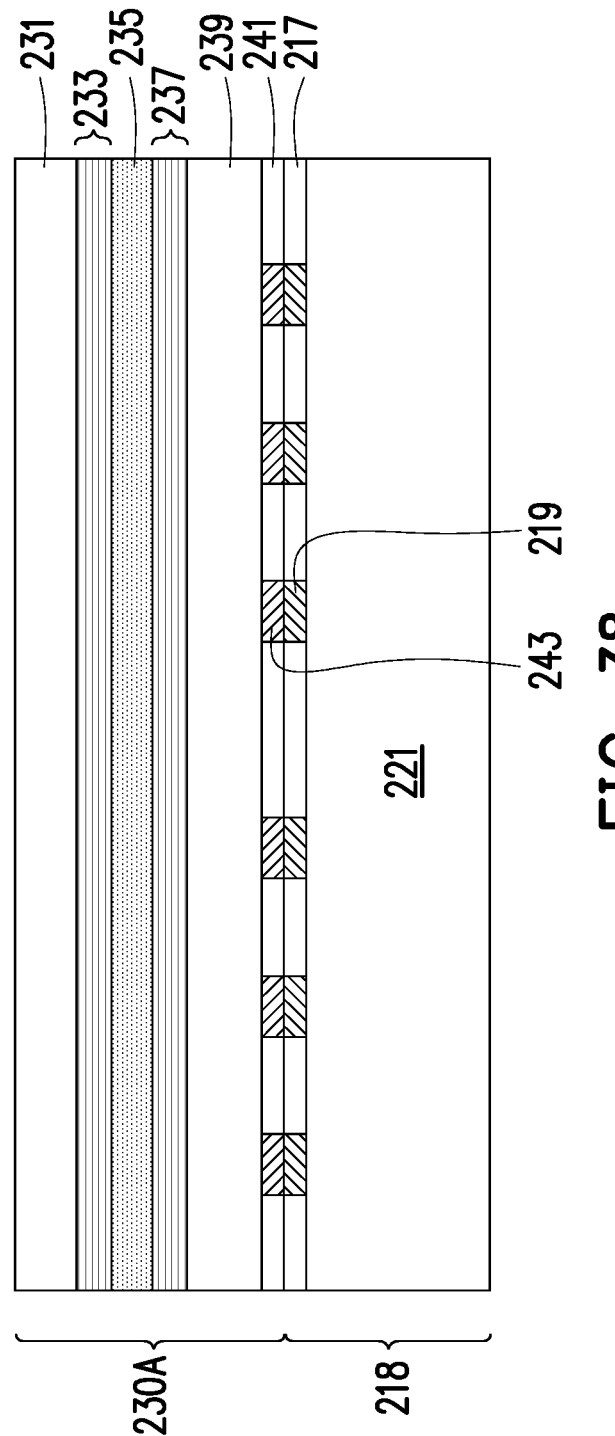
FIGS. 38, 39A, 39B, 40, and 41 illustrate cross-sectional view of a semiconductor package at various stages of manufacturing, in accordance with an embodiment.

In FIG. 38, a wafer 230A is bonded to the wafer 218. The wafer 218 is the same as or similar to the wafer 218 of FIG. 35. The wafer 230A includes a sacrificial substrate 231, an etch stop layer 235, diffusion barrier layers 233/237, and a semiconductor layer 239. The sacrificial substrate 231, the etch stop layer 235, the diffusion barrier layers 233/237, and the semiconductor layer 239 correspond to the sacrificial substrate 11, the etch stop layers 17, the diffusion barrier layers 13 and 21, and the semiconductor layer 23 of FIG. 3, respectively. A plurality of semiconductor dies are formed in/on the semiconductor layer 239, with die connectors 243 and a passivation layer 241 formed on a front side of the wafer 230A. In some embodiments, the wafer 230A is bonded to the wafer 218 through a hybrid-bonding process. Other suitable bonding method, such as bonding through micro-bumps, may also be used for bonding the wafer 230A to the wafer 218.

Figure 39A:
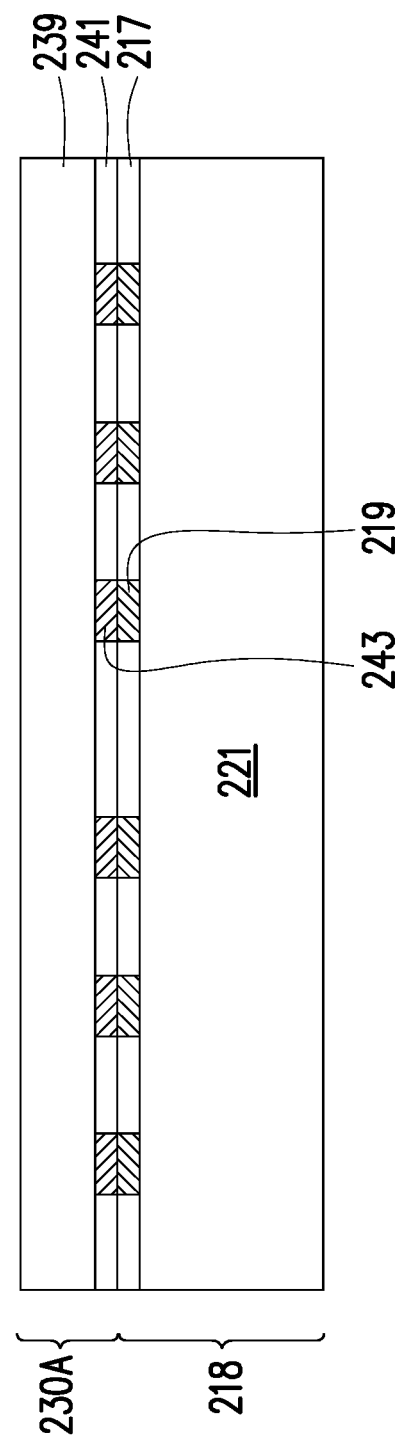

In FIG. 39A, a backside thinning process is performed to remove the sacrificial substrate 231, the etch stop layer 235, and the diffusion barrier layers 233/237. The semiconductor layer 239 of the wafer 230A comprising the plurality of semiconductor dies remain bonded to the wafer 218. The backside thinning process may include process steps same as or similar to those discussed above with reference to FIGS. 25A through 28C, thus details are not repeated. After the backside thinning process, a thickness of the semiconductor layer 239 is smaller than about 100 nm, in some embodiments.

Figure 39B:
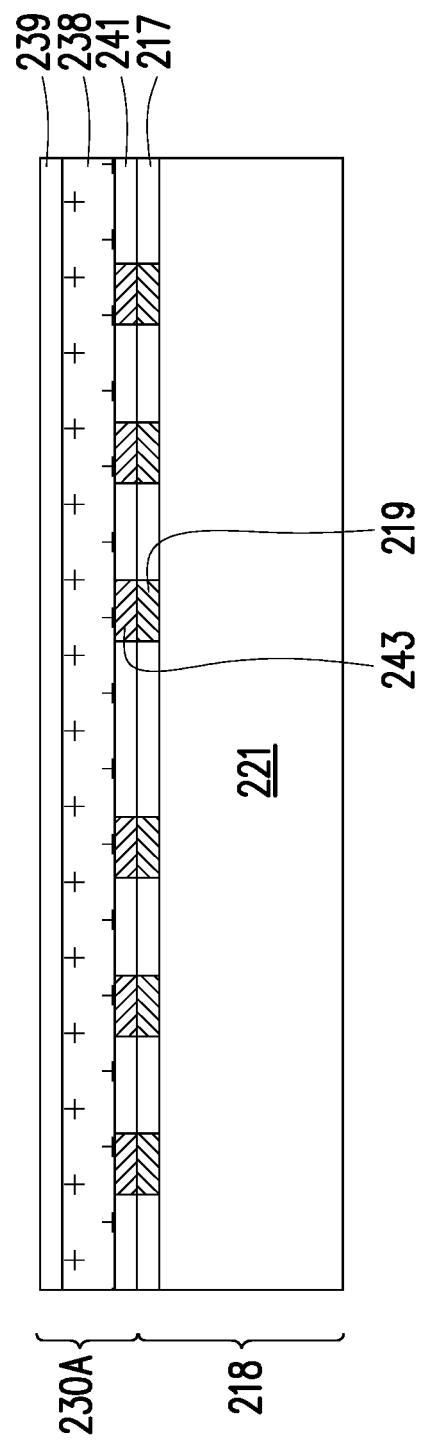

In the example of FIG. 39A, portions of the wafer 230A (e.g., the semiconductor layer 239) transferred to the wafer 218 has a single-layer structure. In other embodiments, such as illustrated in FIG. 39B, the transferred wafer 230A has a stacked, or multi-layer, structure, such as a structure comprising a thin semiconductor layer 239 (e.g., with a thickness less than 100 nm) with reduced TTV formed on another semiconductor layer 238, which semiconductor layer 238 may be thicker than the semiconductor layer 239. One skilled in the art will readily appreciate that advantages associated with transferring the wafer 230A with the thin semiconductor layer 239 having reduced TTV, such as advantages for forming 3DIC packages, apply for both transferred wafer structures illustrated in FIGS. 39A and 39B.

Figure 40:
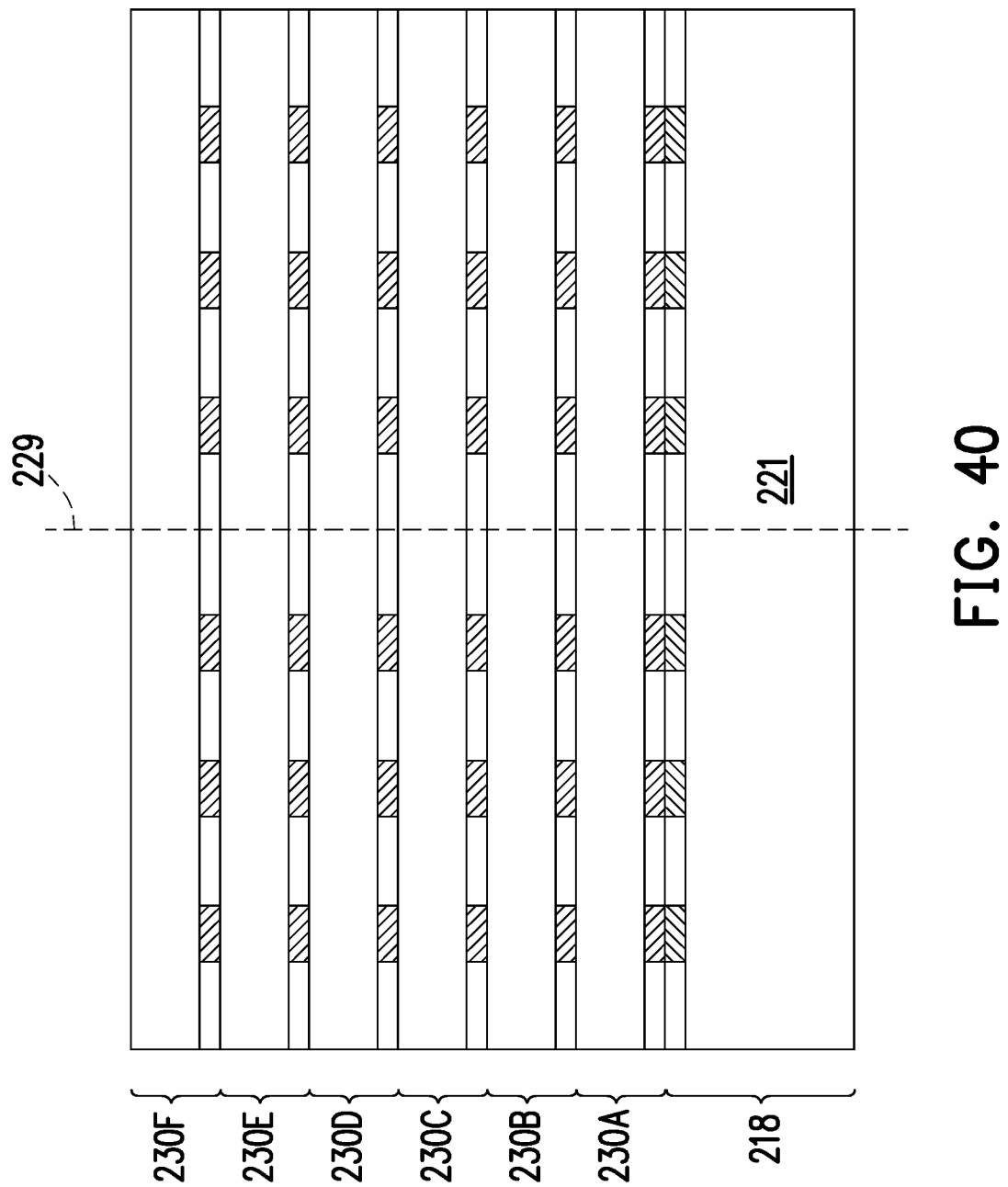

In FIG. 40, the processing steps of FIGS. 38 and 39A are repeated to attach additional wafers (e.g., 230B, 230C, 230D, 230E, and 230F) to the structure of FIG. 39A. Note that each of the additional wafers may have a structure same as or similar to the wafer 230A in FIG. 38, and after being attached (e.g., bonded) to an underlying wafer, each of the additional wafers undergoes a backside thinning process, such that only the semiconductor layer comprising the semiconductor dies remain attached to the underlying wafer. Although not shown, each of the wafers (e.g., 230A through 230F) may have through-substrate vias (TSVs) for electrical connection to an overlying and/or underlying wafer. The transferred wafers (e.g., 230A-230F) in FIG. 40 are illustrated to have the same structure as the wafer 230A in FIG. 39A as a non-limiting example. One skilled in the art will readily appreciate that the transferred wafers in FIG. 40 may have the same structure as the wafer 230A in FIG. 39B.

Figure 41:
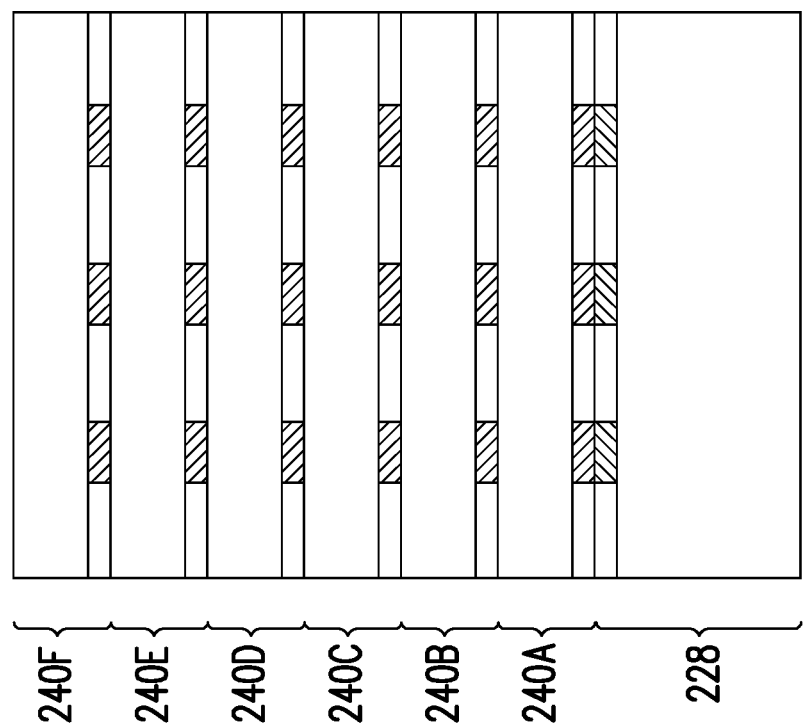

After the desired number of wafers are attached, a singulation process is performed, e.g., along dicing regions 229 to separate the structure of FIG. 40 into a plurality of individual 3DIC packages. FIG. 41 illustrates an individual 3DIC package after the singulation process. The 3DIC package of FIG. 41 includes a semiconductor die 228, which corresponds to a portion of the wafer 218, and includes a plurality of semiconductor dies 240A, 240B, 240C, 240D, 240E, and 240F, wherein each of the plurality of semiconductor dies 240A, 240B, 240C, 240D, 240E, and 240F corresponds to a portion of a respective wafer (e.g., 230A, 230B, 230C, 230D, 230E, or 230F). The disclosed embodiment substrates having etch stop layer and diffusion barrier layer facilitate stacking of the multiple wafers by allowing transferring of a thin semiconductor layer through a backside thinning process.

Embodiments may achieve advantages. For example, by having both the etch stop layer and the diffusion barrier layer, the disclosed embodiment substrates achieve excellent etching selectivity while reducing out-diffusion of the dopant in the etch stop layer. As a result, a thin (e.g., <100 nm), high-quality semiconductor layer (e.g., an epitaxial semiconductor material) suitable for forming high performance device can be formed in the disclosed substrates. After electrical devices (e.g., transistors) are formed in the semiconductor layer, the semiconductor layer can be easily transferred to a workpiece (e.g., a carrier, a wafer, a substrate) through a backside thinning process. The disclosed structures and methods are well suited for applications that require transfer of a semiconductor device layer, such as super power rail (SPR) applications. In SPR applications, silicon-on-insulator (SOI) substrates may be used for transferring of device layers. However, SOI substrates are expensive. The current disclosure provides low-cost alternatives to expensive SOI substrates. Additional advantages include reduced TTV of the transferred thin layer, which facilitates stacking of multiple device layers to form 3DIC devices or packages for improved integration density.

Figure 42:
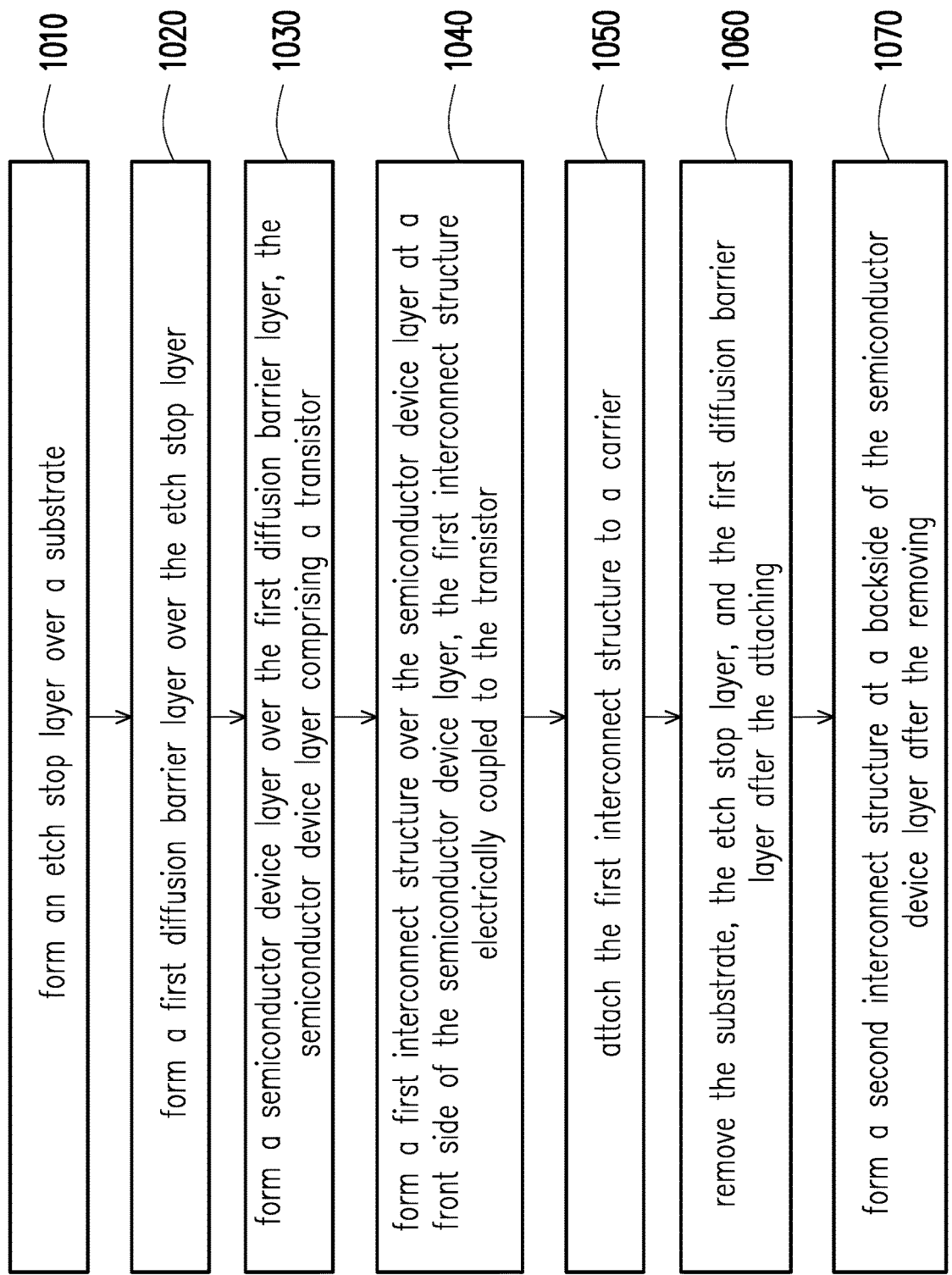
FIG. 42 illustrates a flow chart of a method of forming a semiconductor device, in accordance with some embodiments.

FIG. 42 illustrates a flow chart of a method 1000 of fabricating a semiconductor structure, in accordance with some embodiments. It should be understood that the embodiment method shown in FIG. 42 is merely an example of many possible embodiment methods. One of ordinary skill in the art would recognize many variations, alternatives, and modifications. For example, various steps as illustrated in FIG. 42 may be added, removed, replaced, rearranged, or repeated.

Referring to FIG. 42, at block 1010, an etch stop layer is formed over a substrate. At block 1020, a first diffusion barrier layer is formed over the etch stop layer. At block 1030, a semiconductor device layer is formed over the first diffusion barrier layer, the semiconductor device layer comprising a transistor. At block 1040, a first interconnect structure is formed over the semiconductor device layer at a front side of the semiconductor device layer, the first interconnect structure electrically coupled to the transistor. At block 1050, the first interconnect structure is attached to a carrier. At block 1060, the substrate, the etch stop layer, and the first diffusion barrier layer are removed after the attaching. At block 1070, a second interconnect structure is formed at a backside of the semiconductor device layer after the removing.

In accordance with an embodiment, a method of forming a semiconductor device includes: forming an etch stop layer over a substrate; forming a first diffusion barrier layer over the etch stop layer; forming a semiconductor device layer over the first diffusion barrier layer, the semiconductor device layer comprising a transistor; forming a first interconnect structure over the semiconductor device layer at a front side of the semiconductor device layer, the first interconnect structure electrically coupled to the transistor; attaching the first interconnect structure to a carrier; removing the substrate, the etch stop layer, and the first diffusion barrier layer after the attaching; and forming a second interconnect structure at a backside of the semiconductor device layer after the removing. In an embodiment, forming the etch stop layer comprises forming a first semiconductor material doped by a first dopant. In an embodiment, the first semiconductor material is silicon or silicon germanium, and the first dopant is boron, phosphorus, arsenic, indium, or antimony. In an embodiment, a concentration of the first dopant in the first semiconductor material is between about 2E19 atoms/cm3 and about 5E21 atoms/cm3. In an embodiment, forming the first diffusion barrier layer comprises: forming a first number of epitaxial silicon layers over the etch stop layer; and forming a second number of oxygen-inserted partial monolayers, wherein the second number of oxygen-inserted partial monolayers are interleaved with the first number of epitaxial silicon layers. In an embodiment, the second number is one less than the first number. In an embodiment, each of the second number of oxygen-inserted partial monolayers is a silicon layer with oxygen incorporated into the silicon layer. In an embodiment, a concentration of oxygen in each of the second number of oxygen-inserted partial monolayers is several orders of magnitude higher than a background oxygen concentration level. In an embodiment, forming the semiconductor device layer comprises: forming an epitaxial semiconductor material over the first diffusion barrier layer; and forming the transistor in the epitaxial semiconductor material. In an embodiment, forming the second interconnect structure comprises: forming a dielectric layer at the backside of the semiconductor device layer; and forming a power supply line in the dielectric layer. In an embodiment, the method further includes forming a second diffusion barrier layer over the substrate before forming the etch stop layer, wherein the second diffusion barrier layer is formed between the substrate and the etch stop layer. In an embodiment, the method further includes: forming a first silicon capping layer between the second diffusion barrier layer and the etch stop layer; and forming a second silicon capping layer between the etch stop layer and the first diffusion barrier layer.

In accordance with an embodiment, a method of forming a semiconductor device includes: forming an etch stop layer over a substrate, the etch stop layer comprising a first semiconductor material doped by a first dopant; forming a first diffusion barrier layer over the etch stop layer, the first diffusion barrier layer comprising silicon layers interleaved with discontinuous oxygen layers; epitaxially forming a second semiconductor material over the first diffusion barrier layer; forming a transistor in the second semiconductor material; forming a first interconnect structure over the second semiconductor material; attaching the first interconnect structure to a carrier; and after the attaching, removing the substrate, the etch stop layer, and the first diffusion barrier layer. In an embodiment, the method further includes, before forming the etch stop layer, forming a second diffusion barrier layer over the substrate such that the second diffusion barrier layer is between the substrate and the etch stop layer, wherein the second diffusion barrier layer comprises silicon layers interleaved with discontinuous oxygen layers. In an embodiment, the method further includes forming a silicon capping layer between the etch stop layer and the first diffusion barrier layer. In an embodiment, the first interconnect structure is electrically coupled to a first surface of a source/drain region of the transistor, wherein the method further comprises: after the removing, forming a second interconnect structure at a backside of the transistor, wherein the second interconnect structure is electrically coupled to a second surface of the source/drain region opposing the first surface. In an embodiment, the method further includes forming a silicon capping layer between the etch stop layer and the first diffusion barrier layer.

In accordance with an embodiment, a method of forming a semiconductor device includes: forming a doped semiconductor layer over a substrate; forming a diffusion barrier layer over the doped semiconductor layer, the diffusion barrier layer comprising alternating epitaxial silicon layers and partial monolayers of oxygen; forming a device layer comprising a transistor over the diffusion barrier layer; and transferring the device layer to a workpiece, wherein the transferring comprises: bonding the device layer to the workpiece; and after the bonding, removing the substrate, the doped semiconductor layer, and the diffusion barrier layer. In an embodiment, the method further includes forming a first interconnect structure over the device layer before the transferring, wherein the device layer is bonded to the workpiece through the first interconnect structure. In an embodiment, removing the substrate, the doped semiconductor layer, and the diffusion barrier layer includes: selective removing the substrate and the doped semiconductor layer using a first etching process; and after the first etching process, selectively removing the diffusion barrier layer using a second etching process different from the first etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming an etch stop layer over a substrate;
    forming a first diffusion barrier layer over the etch stop layer;
    forming a semiconductor device layer over the first diffusion barrier layer, the semiconductor device layer comprising a transistor;
    forming a first interconnect structure over the semiconductor device layer at a front side of the semiconductor device layer, the first interconnect structure electrically coupled to the transistor;
    attaching the first interconnect structure to a carrier;
    removing the substrate, the etch stop layer, and the first diffusion barrier layer after the attaching; and
    forming a second interconnect structure at a backside of the semiconductor device layer after the removing.

2. The method of claim 1, wherein forming the etch stop layer comprises forming a first semiconductor material doped by a first dopant.

3. The method of claim 2, wherein the first semiconductor material is silicon or silicon germanium, and the first dopant is boron, phosphorus, arsenic, indium, or antimony.

4. The method of claim 2, wherein a concentration of the first dopant in the first semiconductor material is between about 2E19 atoms/cm$^3$ and about 5E21 atoms/cm$^3$.

5. The method of claim 2, wherein forming the first diffusion barrier layer comprises:
    forming a first number of epitaxial silicon layers over the etch stop layer; and
    forming a second number of oxygen-inserted partial monolayers, wherein the second number of oxygen-inserted partial monolayers are interleaved with the first number of epitaxial silicon layers.

6. The method of claim 5, wherein the second number is one less than the first number.

7. The method of claim 5, wherein each of the second number of oxygen-inserted partial monolayers is a silicon layer with oxygen incorporated into the silicon layer.

8. The method of claim 7, wherein a concentration of oxygen in each of the second number of oxygen-inserted partial monolayers is several orders of magnitude higher than a background oxygen concentration level.

9. The method of claim 1, wherein forming the semiconductor device layer comprises:
    forming an epitaxial semiconductor material over the first diffusion barrier layer; and
    forming the transistor in the epitaxial semiconductor material.

10. The method of claim 1, wherein forming the second interconnect structure comprises:
    forming a dielectric layer at the backside of the semiconductor device layer; and
    forming a power supply line in the dielectric layer.

11. The method of claim 1, further comprising forming a second diffusion barrier layer over the substrate before forming the etch stop layer, wherein the second diffusion barrier layer is formed between the substrate and the etch stop layer.

12. The method of claim 11, further comprising:
    forming a first silicon capping layer between the second diffusion barrier layer and the etch stop layer; and
    forming a second silicon capping layer between the etch stop layer and the first diffusion barrier layer.

13. A method of forming a semiconductor device, the method comprising:
    forming an etch stop layer over a substrate, the etch stop layer comprising a first semiconductor material doped by a first dopant;
    forming a first diffusion barrier layer over the etch stop layer, the first diffusion barrier layer comprising silicon layers interleaved with discontinuous oxygen layers;
    epitaxially forming a second semiconductor material over the first diffusion barrier layer;
    forming a transistor in the second semiconductor material;
    forming a first interconnect structure over the second semiconductor material;
    attaching the first interconnect structure to a carrier; and
    after the attaching, removing the substrate, the etch stop layer, and the first diffusion barrier layer.

14. The method of claim 13, further comprising, before forming the etch stop layer, forming a second diffusion barrier layer over the substrate such that the second diffusion barrier layer is between the substrate and the etch stop layer, wherein the second diffusion barrier layer comprises silicon layers interleaved with discontinuous oxygen layers.

15. The method of claim 13, further comprising forming a silicon capping layer between the etch stop layer and the first diffusion barrier layer.

16. The method of claim 13, wherein the first interconnect structure is electrically coupled to a first surface of a source/drain region of the transistor, wherein the method further comprises:
    after the removing, forming a second interconnect structure at a backside of the transistor, wherein the second interconnect structure is electrically coupled to a second surface of the source/drain region opposing the first surface.

17. A method of forming a semiconductor device, the method comprising:
- forming a doped semiconductor layer over a substrate;
- forming a diffusion barrier layer over the doped semiconductor layer, the diffusion barrier layer comprising alternating epitaxial silicon layers and partial monolayers of oxygen;
- forming a device layer comprising a transistor over the diffusion barrier layer; and
- transferring the device layer to a workpiece, wherein the transferring comprises:
  - bonding the device layer to the workpiece; and
  - after the bonding, removing the substrate, the doped semiconductor layer, and the diffusion barrier layer.

18. The method of claim 17, further comprising forming a first interconnect structure over the device layer before the transferring, wherein the device layer is bonded to the workpiece through the first interconnect structure.

19. The method of claim 17, wherein removing the substrate, the doped semiconductor layer, and the diffusion barrier layer comprises:
- selective removing the substrate and the doped semiconductor layer using a first etching process; and
- after the first etching process, selectively removing the diffusion barrier layer using a second etching process different from the first etching process.

20. The method of claim 13, wherein the first diffusion barrier layer has a first number of the silicon layers and has a second number of the discontinuous oxygen layers, wherein the first number is one more than the second number.

* * * * *